(12) United States Patent
Nakamura et al.

(10) Patent No.: US 6,498,596 B1
(45) Date of Patent: Dec. 24, 2002

(54) DRIVING CIRCUIT FOR DISPLAY DEVICE AND LIQUID CRYSTAL DISPLAY DEVICE

(75) Inventors: Kazuo Nakamura, Kitamoto (JP); Tomonobu Motai, Yokohama (JP); Takashi Nakamura, Kumagaya (JP); Masao Karube, Fukaya (JP); Hirotaka Hayashi, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/506,686

(22) Filed: Feb. 18, 2000

(30) Foreign Application Priority Data

Feb. 19, 1999 (JP) .............................................. 11-041325
Feb. 9, 2000 (JP) ....................................... 2000-032318

(51) Int. Cl.[7] ................................................ G09G 3/36

(52) U.S. Cl. .......................... 345/98; 341/144; 341/150

(58) Field of Search ...................... 345/94, 87, 98–100, 345/204, 208, 211, 213; 341/126, 144, 150

(56) References Cited

U.S. PATENT DOCUMENTS

| | | | | |
|---|---|---|---|---|
| 4,521,762 A | * | 6/1985 | Kapral | 341/122 |
| 5,170,158 A | * | 12/1992 | Shinya | 345/204 |
| 6,104,364 A | * | 8/2000 | Hayashi | 345/87 |
| 6,281,891 B1 | * | 8/2001 | DaCosta et al. | 345/204 |

FOREIGN PATENT DOCUMENTS

JP  7-72822  3/1995

* cited by examiner

Primary Examiner—Kent Chang
(74) Attorney, Agent, or Firm—Oblon, Spivak, McClelland, Maier & Neustadt, P.C.

(57) ABSTRACT

A driving circuit of a display device like liquid crystal display, which is small in circuit size, ensures good quality images, and can freely change the display gradation, is configured to execute digital-analog conversion by reallocating charges between a primary-side capacitor and a secondary-side capacitor and includes a plurality of such capacitors in the primary side or the secondary side to enable both quick conversion and reliable potential output to signal lines. Also in an output circuit, output of signal potentials not affected by fluctuation of properties of TFT and inverters can be realized.

36 Claims, 51 Drawing Sheets

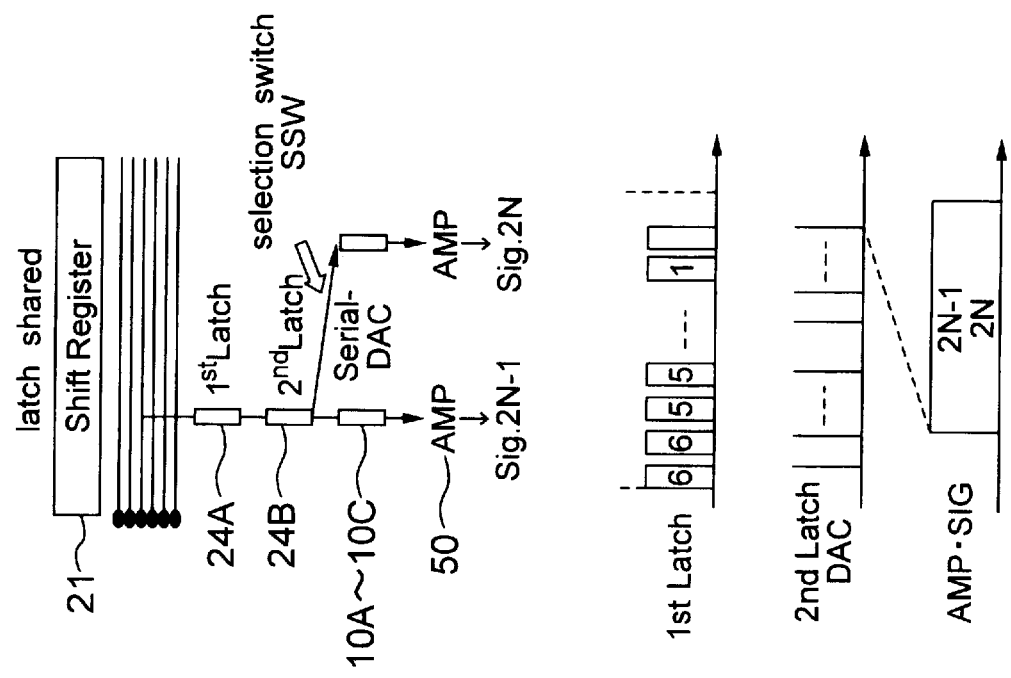
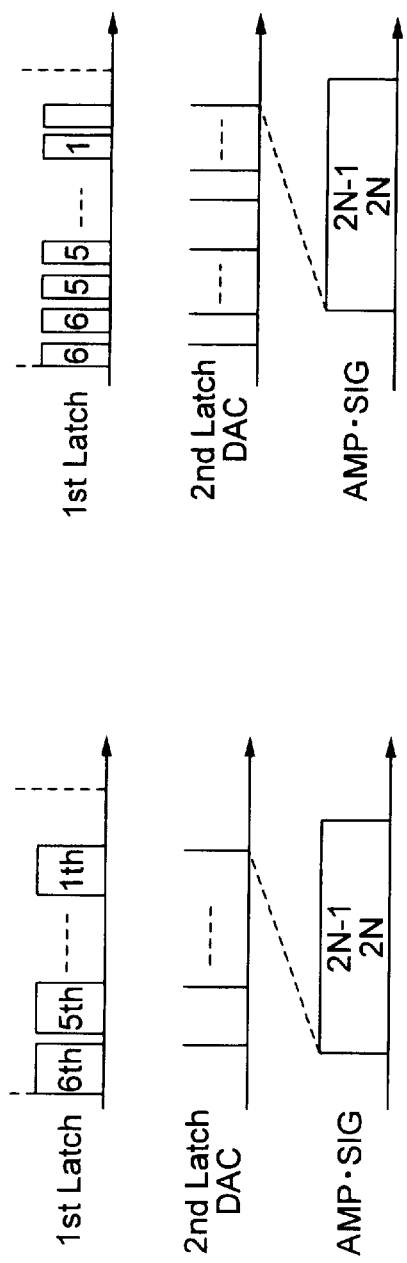
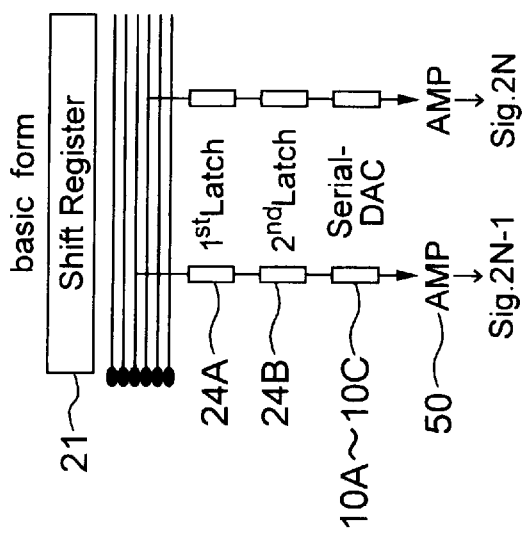

FIG. 42A
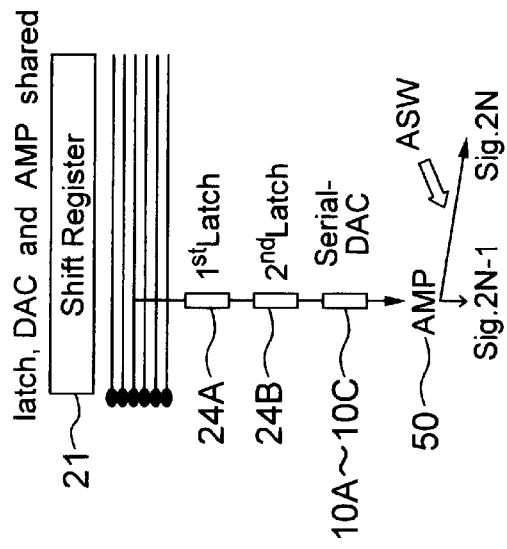
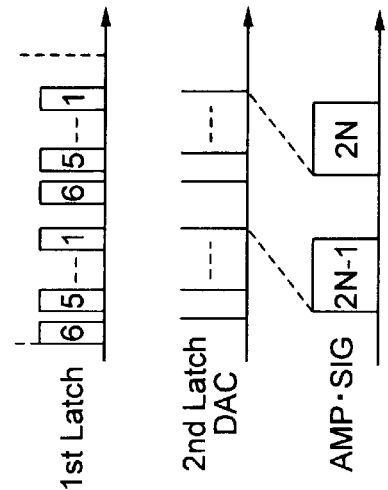
FIG. 42B
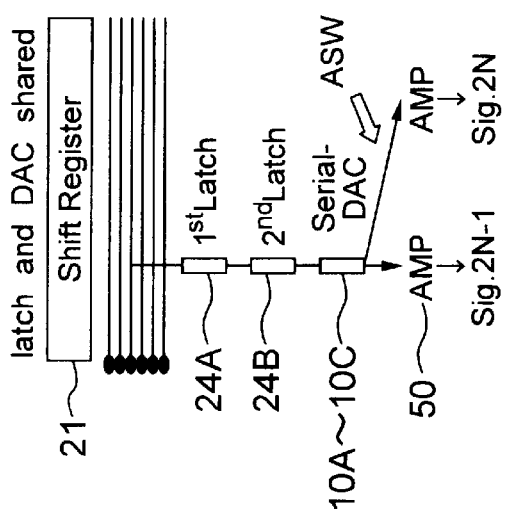
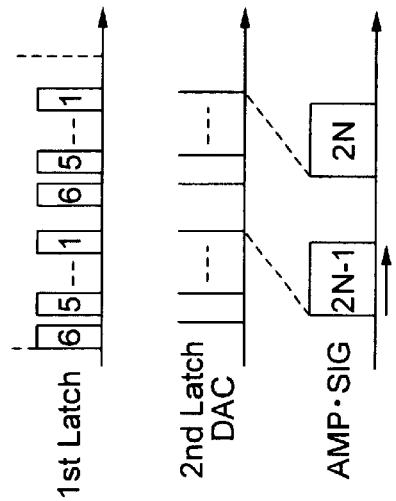

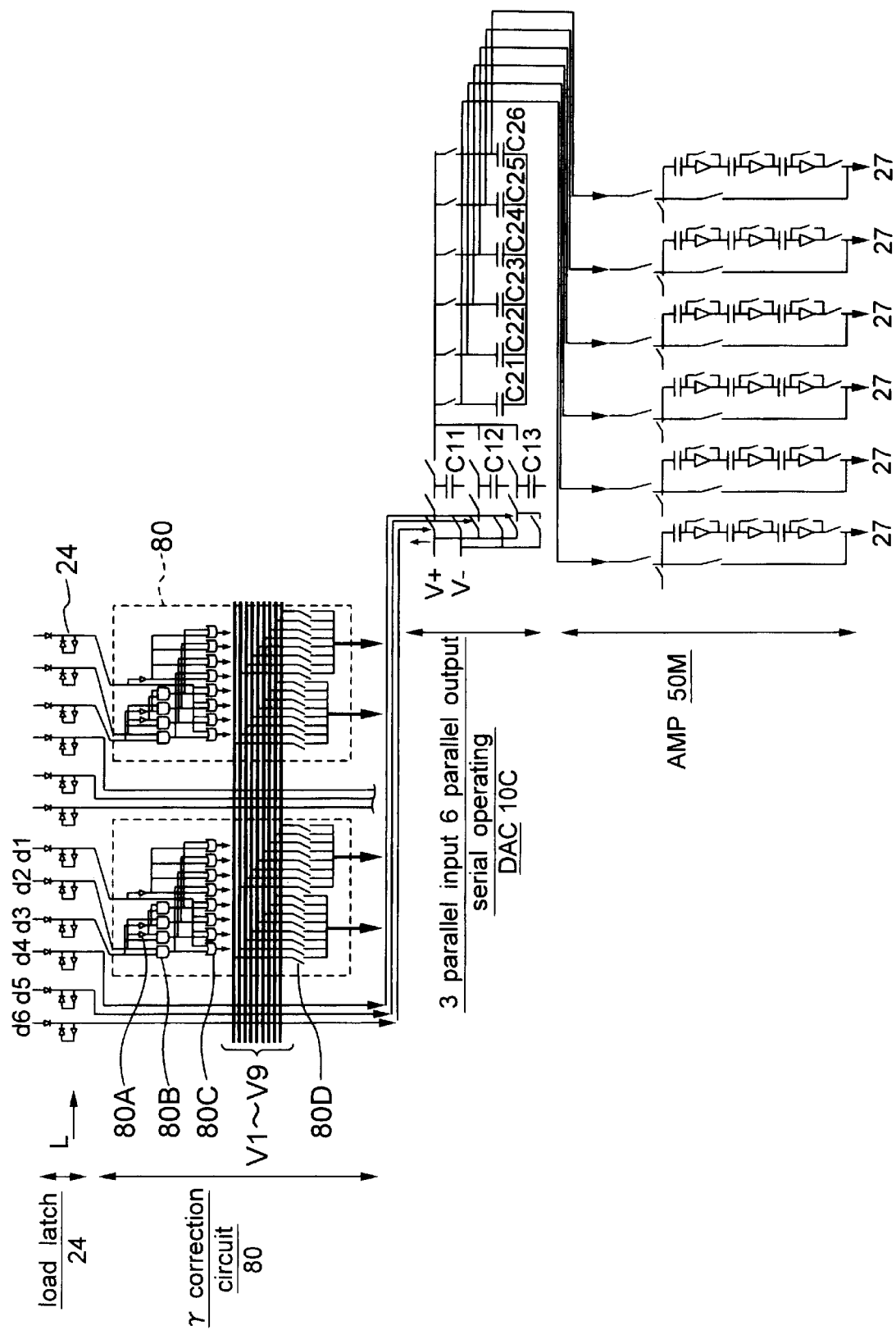

DRIVING CIRCUIT FOR DISPLAY DEVICE AND LIQUID CRYSTAL DISPLAY DEVICE

BACKGROUND OF THE INVENTION

This invention relates to a driving circuit of a display device and a liquid crystal display device. More particularly, the invention relates to those having a simple structure, ensuring representation of good-quality images, and very easy to change the gradation of display.

As one type of flat displays used in personal computers, thin-type television receivers, etc., there is a display using a plurality of pixels having a capacitive load. An example thereof is liquid crystal displays.

So-called "active matrix type liquid crystal displays" using a pixel switching element like thin-film transistor (TFT) or thin film diode (TFD) for each pixel provide clear images, and have a high-density display ability equivalent to or higher than that of CRT. In particular, TFT liquid crystal displays (TFT-LCD) using thin film transistors as pixel switching elements are under active developments toward their practical use.

TFT typically uses amorphous silicon or polycrystalline silicon as its semiconductor active layer (channel, source and drain regions). For years, vigorous energy is being paid toward development of TFT-LCD of a driving circuit built-in type, in which scanning line driving circuits and video signal line driving circuits are formed together with pixel TFT on a transparent insulating substrate. This structure enables extending the effective display area of the transparent insulating substrate of a liquid crystal display and reducing the manufacturing cost.

TFT-LCD of this driving circuit built-in type includes on its pixel substrate a digital-analog converter circuit (hereinafter abbreviated DAC) for converting digital signals input as video signals from outside into analog signals.

However, conventional driving circuit built-in TFT-LCDs involved the problem that when the bit number of digital input signals was increased for the purpose of attaining higher definition of display images, DAC was enlarged in size and hence narrowed the effective display area of the screen. This problem is discussed below with reference to the drawings.

FIG. 56 is a conceptional diagram showing the structure of a capacitor-arrayed DAC used in conventional liquid displays. DAC shown here is of a parallel input type and includes a switch control circuit 41, reference voltage source 42, switch array 43, capacitor array 44, reset switch 45 and buffer amplifier 46.

In the example shown here, digital data of 6 bits such as (B6, B5, ... B1) are input in parallel as video signals.

The capacitor array 44 includes capacitors more by one than the number of bits of the digital data. Capacitance values of these capacitors are weighted in six different values from C through C/32 depending upon the binary coding. These capacitors are commonly connected at one end of each thereof, and connected to a vides signal line via the amplifier 46. The capacitors are connected at the other end of each thereof selectively to a reference voltage Vs or the ground potential by MOS switches of the switch array 43.

Each switch of the switch array 43 is directly controlled by binary data of an input which coincides with the capacitance weighting order of the capacitors.

In the example shown in FIG. 56, 6-bit conversion is possible. That is, when the parallel data (B6, B5, ... B1) are input, the output voltage Vout is expressed by the following equation.

$$V_{out} = \sum_{i=1}^{6} B_i \cdot 2^{(i-7)} \cdot V_S \tag{1}$$

This DAC, however, needs (n+1) capacitors for converting digital data of n bits. Therefore, in order to ensure high definition image display with a high display gradation by increasing the number of bits, the problem of a dimensional increase of the circuit inevitably occurs. In case of liquid crystal displays having a built-in driving circuit, dimensional increase of the DAC circuit makes it difficult to keep a sufficient effective pixel area, and causes the problem that the size of the display need be increased, and the weight becomes heavy.

On the other hand, in DAC of FIG. 56, since the capacitors in the capacitor array 44 must be weighted in capacitance so as to correspond to the binary coding, more and more accurate control of their capacitance values must be guaranteed as the number of bits increases. Therefore, the design and manufacturing margins are strict, and the production yield is liable to decrease.

Another problem with conventional DAC as shown in FIG. 56 lies in that digital data it can convert is fixed in number of bit. That is, the gradation of video signals it can handle is fixed to a predetermined value according to the circuit arrangement of DAC, and it cannot be changed later. This means, in a personal computer, for example, that users cannot readily change the display mode depending on the content to be displayed.

Under the circumstances, Japanese Patent Laid-Open Publication No. H7-72822 includes description about the use of serial DAC made up of two capacitor elements. This structure, however, was limited in increasing the data processing speed because it required different periods for digital-analog conversion and input of analog signals into capacitor elements or output of digital signal from the capacitor elements.

SUMMARY OF THE INVENTION

The invention has been made starting with the recognition of the above-explained problems. It is therefore an object of the invention to provide a display device driving circuit and a liquid crystal display device enabling the use of a small-scaled circuit, ensuring good-quality images and enabling free changes of the display gradations.

To attain the object, the basic structure of the invention is made up of a reference voltage selecting circuit for exclusively selecting and outputting one of a plurality of reference voltages in response to individual bit signals of serial data of a plurality of bits which are time-serially input, a first capacitor element connected to the reference voltage selecting circuit to hold a reference voltage output from the reference voltage selecting circuit, a second capacitor element connected to the first capacitor element through a connection circuit to hold an electric charged distributed from the first capacitor element due to a short-circuit of the connection circuit at a timing prior to the input of individual signals into the reference voltage selecting circuit, and an output line which outputs the voltage held in the second capacitor element as a display signal.

That is, the display device driving circuit according to the invention is one configured to input digital data and output it after convert it into an analog video signal, which comprises a first capacitor, a selecting circuit introducing one of bits of the digital data to determine the charge voltage of the first capacitor as a first voltage when the value of the bit is "1" but determine the charge voltage of the first capacitor as a second voltage different from the first voltage when the value of the bit is "0", a second capacitor, and a connection circuit which connects the first capacitor and the second capacitor to reallocate their charging electric charges so as to equalize their charging voltage, such that the charging voltage of the first capacitor or the second capacitor obtained by activating the selecting circuit and the connection circuit in this sequence for each of the bits of the digital data from its most significant bit to the least significant bit be output as the analog video signal.

Based on the basic structure shown above, the first display device driving circuit according to the invention is a driving circuit of a display device including a digital-analog converter circuit which introduces a digital data and outputs an analog video signal, in which the digital-analog converter circuit has an input capacitor parallel type structure including: a reference voltage selecting circuit which is responsive to each of bit signals of time-serially input data of a plurality of bits to exclusively select and output one of a plurality of reference voltages; a group of input-side capacitor elements connected to the reference voltage selecting circuit and including a plurality of capacitor elements which hold the reference voltage output from the reference voltage selecting circuit; an output-side capacitor element connected to each capacitor element in the group of input-side capacitor elements via a connection circuit to short-circuit the connection circuit at a predetermined timing, thereby selectively connected to individual capacitor elements in the group of input-side capacitors sequentially and holding charges distributed from individual capacitor elements in the group of input-side capacitor elements, thereby outputting the voltage held in the output-side capacitor element as an analog video signal.

The second display device driving circuit according to the invention is a driving circuit of a display device including a digital-analog converter circuit which introduces digital data and outputs an analog video signal, in which the digital-analog converter circuit has an output capacitor parallel type structure including: a reference voltage selecting circuit which is responsive to each of bit signals of time-serially input data of a plurality of bits to exclusively select and output one of a plurality of reference voltages; an input-side capacitor element connected to the reference voltage selecting circuit to hold the reference voltage output from the reference voltage selecting circuit; a group of output-side capacitor elements connected to the input-side capacitor element via a connection circuit to short-circuit the connection circuit at a predetermined timing, thereby connected to the input-side capacitor element and holding charges distributed from the input-side capacitor element, thereby selectively outputting a voltage held in a capacitor element in the group of output-side capacitor elements as an analog video signal.

The third display device driving circuit according to the invention is a driving circuit of a display device including a digital-analog converter circuit which introduces digital data and outputs an analog video signal, in which the digital-analog converter circuit has an input-output capacitor parallel type structure including: a reference voltage selecting circuit which is responsive to each of bit signals of time-serially input data of a plurality of bits to exclusively select and output one of a plurality of reference voltages; a group of input-side capacitor elements connected to the reference voltage selecting circuit and including a plurality of capacitor elements which hold the reference voltage output from the reference voltage selecting circuit; a group of output-side capacitor elements connected to respective capacitor elements in the group of input-side capacitor elements via a connection circuit to short-circuit the connection circuit at a predetermined timing, thereby selectively sequentially connected to individual capacitor elements in the group of input-side capacitor elements and holding charges distributed from individual capacitor elements in the group of input-side capacitor elements, thereby selectively outputting a voltage held in-a capacitor element in the group of output-side capacitor elements as an analog video signal.

The first to third driving circuits may further comprise a shutoff circuit connected between the reference voltage selecting circuit and the input-side capacitor to cut the connection between the reference voltage selecting circuit and the input-side capacitor element before short-circuiting the input-side capacitor element and the output-side capacitor element. Thereby, a back flow of the electric charge from the input-side capacitor element to the reference voltage selecting circuit can be prevented.

The input-side capacitor element and the output-side capacitor element may be substantially same in capacitance value to ensure even reallocation of the electric charge.

On the other hand, the fourth display device driving circuit according to the invention is a display device driving circuit having a plurality of signal lines and scanning lines arranged to intersect at right angles with each other and pixel switching elements provided at crossing points of the signal lines and the scanning lines to display gradient representation of $2^m$ on the basis of data of m bits (m is a plural number), comprising: a data distributing circuit supplied with the data of m bits; a data latch circuit sequentially storing the data of n bits and outputting them at a predetermined timing; a gamma correction circuit which stores the output from the data latch circuit and outputs it at a predetermined timing; one of the digital-analog converter circuits recited in claims 1 through 9 which stores the output from the gamma correction circuit and outputs it at a predetermined timing; and an amplifier circuit for amplifying the output from the digital-analog converter circuit.

On the other hand, a liquid crystal display device according to the invention comprises one of the above-summarized display device driving circuits, and a liquid crystal controlled by the pixel switching elements, and it is characterized in that the threshold value of the liquid crystal is about 2.5 Volts.

Another liquid crystal display device according to the invention comprises one of the above-summarized display device driving circuits, and a liquid crystal controlled by the pixel switching elements, and it is characterized in that the threshold value of the liquid crystal is about 1.5 Volts.

Another liquid crystal display device according to the invention is a transmission type liquid crystal display device comprising one of the above-summarized display device driving circuits, and a light source provided behind when viewed from the direction of the image watching surface.

Another liquid crystal display device according to the invention is a reflection type liquid crystal display device comprising one of the above-summarized display device driving circuits, and a reflector provided behind when viewed from the direction of the image watching surface to display images by reflecting external light entering from the direction of the image watching surface with the reflector.

Another liquid crystal display device according to the invention comprises one of the above-summarized display device driving circuits, a light source provided behind when viewed from the direction of the image watching surface and a reflector provided behind when viewed from the direction of the image watching surface, and it is characterized in representing images by letting light released from the light source to pass through or by reflecting external light entering from the direction of the image watching surface with the reflector.

Another liquid crystal display device according to the invention comprises one of the above-summarized display device driving circuits, and a pixel switching element provided for each display pixel, and it is characterized in that the driving circuit and the pixel switching elements are provided on a common substrate and share a common semiconductor layer stacked on the substrate.

The invention is used in the above-summarized modes, and gives the effects explained below.

First of all, according to the invention, serially input digital video signals are reliably and easily converted into analog signals. Additionally, according to the invention, the circuit arrangement of DAC is very simple, and the circuit area can be reduced more largely than conventional ones. The dimensional reduction of the circuit becomes more effective with the number of bits of digital data. Namely, as the quality of the displayed images becomes higher, this effect becomes larger.

That is, as compared with typical n-bit parallel input type DAC, the circuit scale of DAC in the present invention is about 1/n, and as the number of bits increases, the effect of dimensional reduction of the circuit becomes larger. This is especially advantageous in polysilicon TFT liquid crystal display devicees integrating the driving circuit into the panel. Although an increase in display gradation, i.e. number of bits of video signals, is necessary for higher quality of displayed images, the invention need not increase the circuit scale, and simultaneously reconciles miniaturization of the panel and improvement of the image quality.

Further, the invention also enables conversion of digital data different in number of bits into analog video signals without changing the circuit. That is, according to the invention, by repeating the above-explained operations for individual bits of serially input digital data, it is possible to convert the digital data into an analog form without relying on the number of bits.

This effect of the invention is especially advantageous when it is applied to display devicees of computers. That is, in computers, it is often required to switch the image display mode depending upon its use or software. In that case, it is desirable to change the display gradation, i.e. number of gradation bits, together with its display resolution. According to the invention, even in that case, analog conversion is possible by using the same DAC.

Furthermore, according to the invention, digital data can be input in parallel at a high speed by providing a plurality of primary-side capacitors of DAC. In addition, by providing a plurality of secondary-side capacitors of DAC, it is possible to execute the DA conversion for the next signal line and writing of the analog potential to the preceding signal line. This results in increasing the operation speed and enabling reliable writing of a predetermined analog potential even when the parasitic capacitance of the signal line is large in a high-definition display device.

Moreover, according to the invention, as the output circuit controls to increase the voltage of a signal line when the voltage of the signal line is lower than the voltage of the input signal and decrease the voltage of the signal line when the voltage of the signal line is higher than the voltage of the input signal, the voltage of the signal line can be equalized to the voltage of the input signal.

Furthermore, by setting the voltage of the input terminal of each inverter forming the output circuit at the threshold voltage of its own before the output circuit controls the voltage of the signal line, adverse affection to the voltage of the signal line can be prevented even when the inverters fluctuate in threshold voltage.

As explained above, according to the invention, it is possible to reliably write digital data different in number of bits onto signal lines after converting them into analog video signals by using a much simpler circuit arrangement than conventional ones, and its industrial advantages are great.

BRIEF DESCRIPTION OF THE DRAWINGS

The present invention will be understood more fully from the detailed description given hereinbelow and :from the accompanying drawings of the preferred embodiments of the invention. However, the drawings are not intended to imply limitation of the invention to a specific embodiment, but are for explanation and understanding only.

In the drawings:

FIG. 41 is conceptional diagrams for explaining modified examples of the video signal line driving circuit according to the invention, in which FIG. 41(a) corresponds to the basic form shown in FIG. 38 and FIG. 41(b) corresponds to a modified example;

FIG. 42 is conceptional diagrams corresponding to a modified example of the video signal line driving circuit according to the invention;

FIG. 49 is rough diagrams for explaining a driving circuit of a liquid display device to which a gamma correction circuit is added, in which

FIG. 50 is a diagram showing a detailed example of the structure of the driving circuit having the six signal line selective structure;

DETAILED DESCRIPTION OF THE PREFERRED EMBODIMENTS

According to the invention, by repeating the operation of first charging a part of three or more capacitors to a potential corresponding to the value of the bits of digital data and thereafter reallocating the charging electric charge with the remainder capacitors an-analog voltage corresponding-to the digital data can be created.

Explained below are embodiments of the invention with reference to the drawings.

Figure 1:
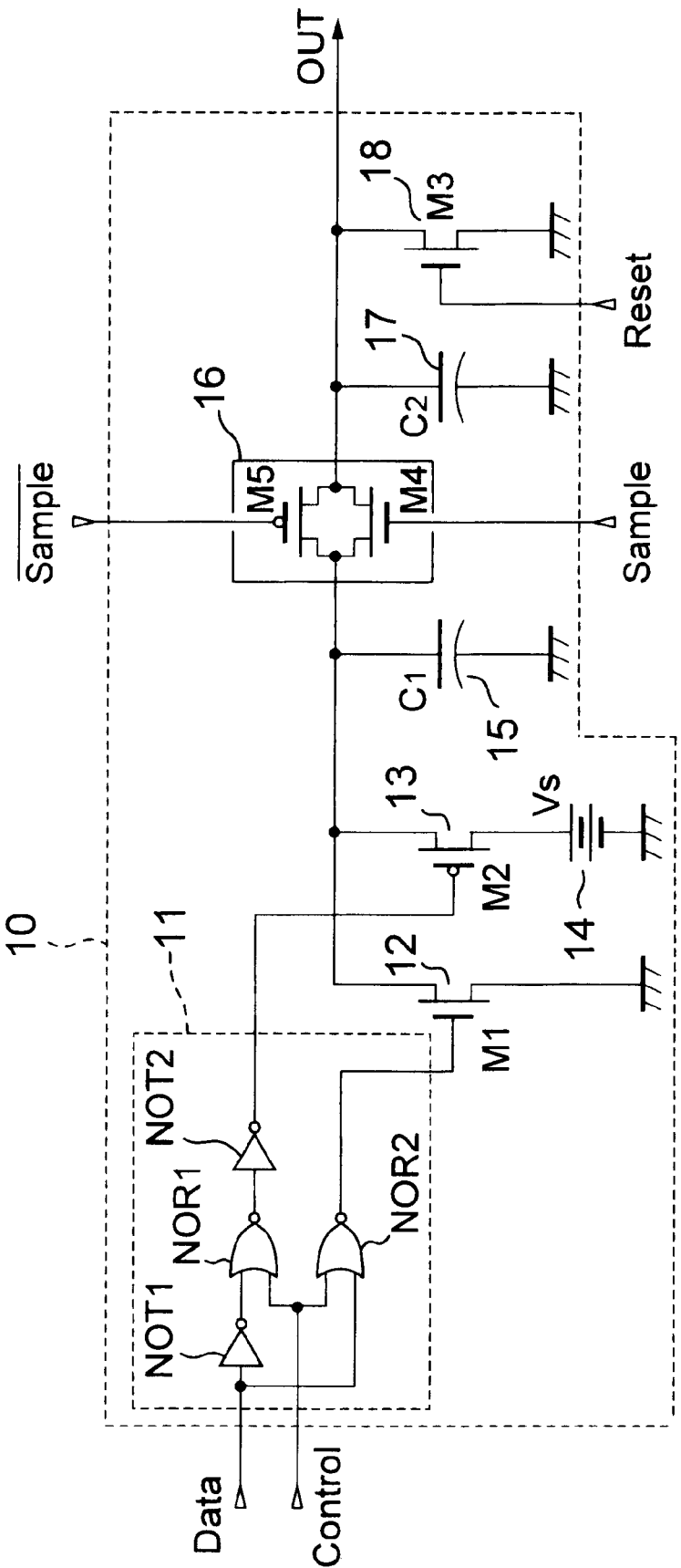
FIG. 1 is a conceptional diagram showing a digital-analog converter circuit (DAC) used in a video signal driving circuit prepared as a trial in the course toward the present invention.

FIG. 1 is a conceptional diagram showing a digital-analog converter circuit (DAC) used in a video signal driving circuit prepared as a trial in the course toward the present invention.

Figure 2:
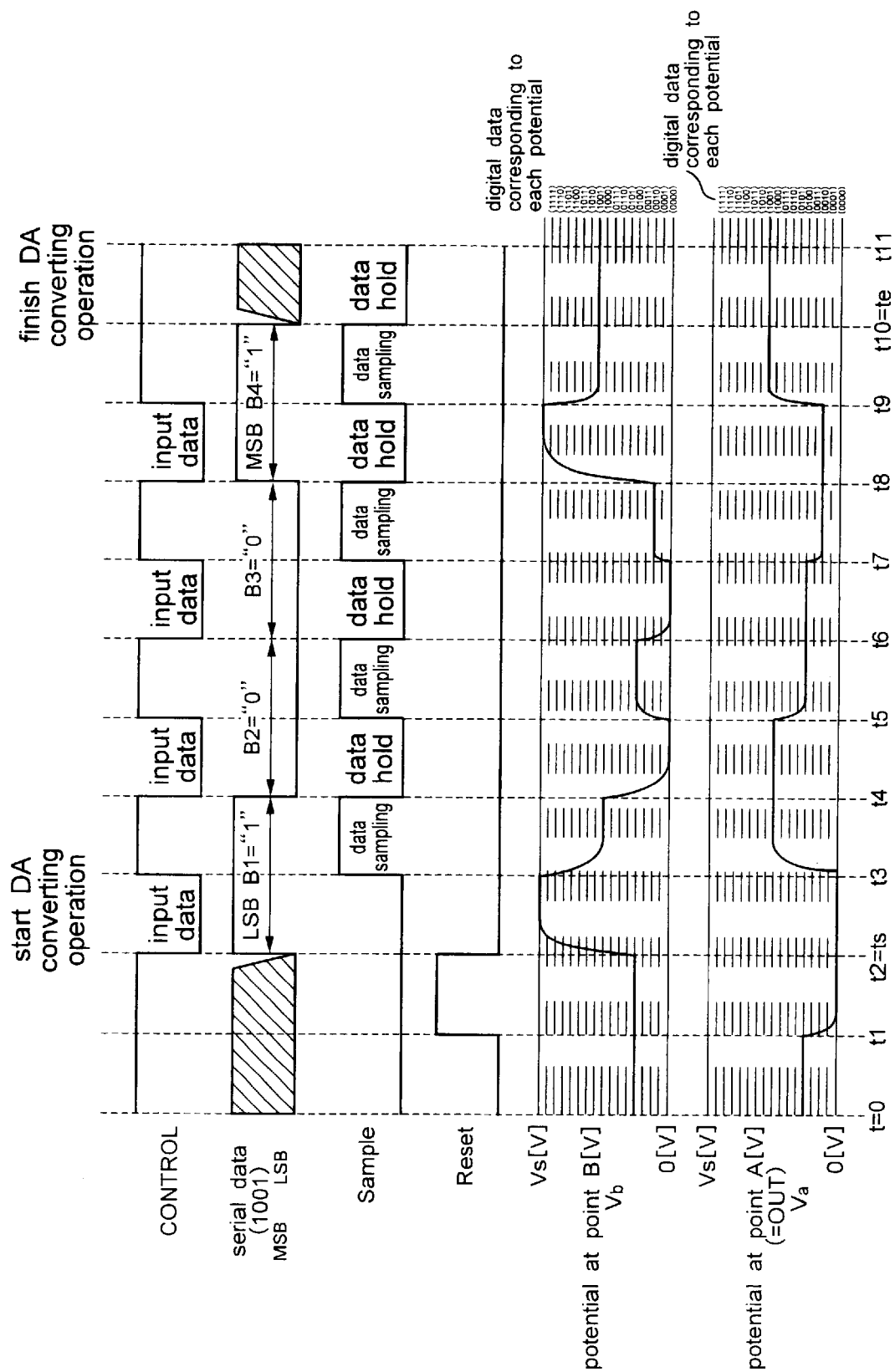
FIG. 2 is a timing chart showing operational waveforms of DAC shown in FIG. 1.

FIG. 2 is a timing chart showing its operational waveforms.

Figure 3:
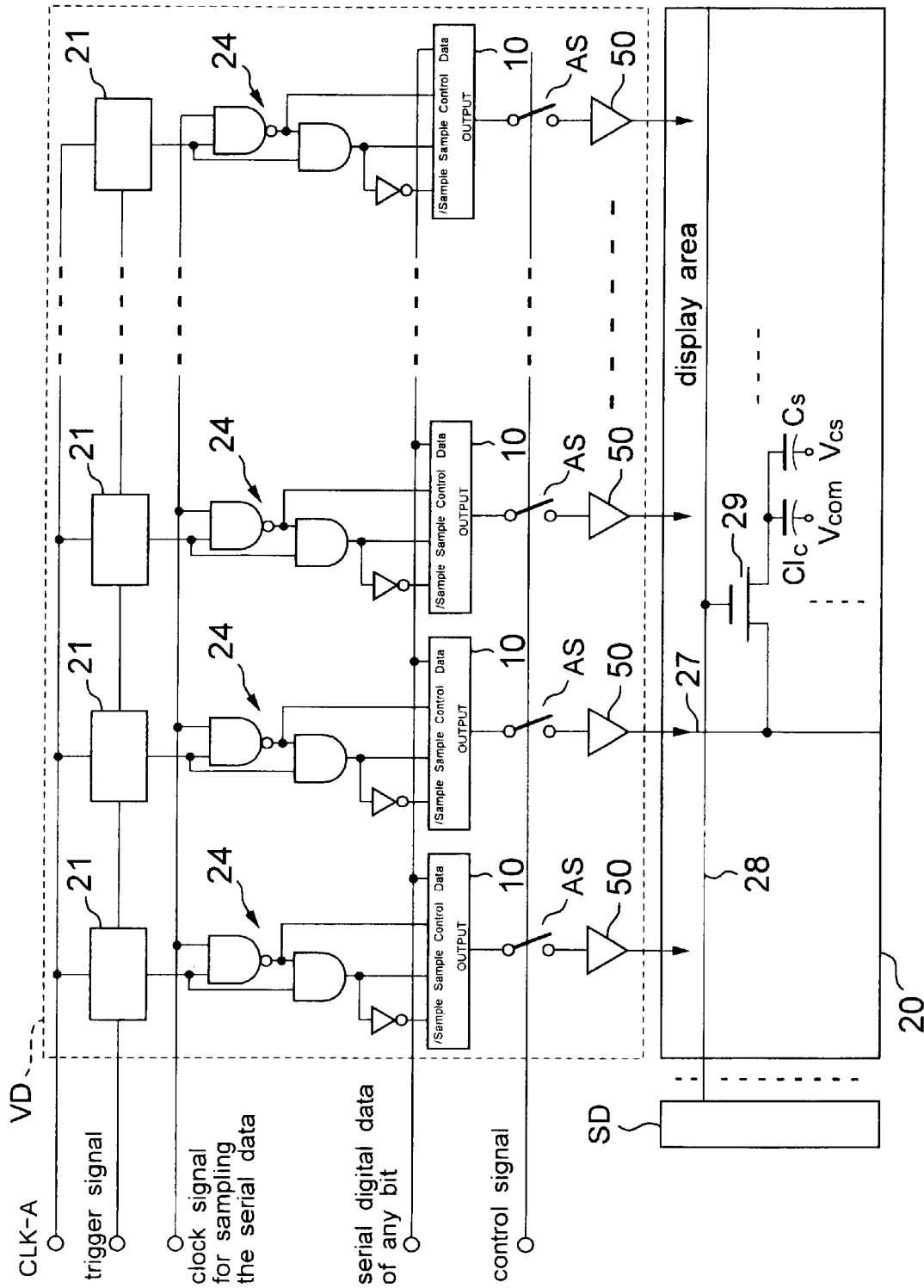
FIG. 3 is a conceptional diagram showing a rough arrangement of the major part of a liquid crystal display device including DAC.

FIG. 3 is a conceptional diagram showing a rough arrangement of the major part of a liquid crystal display device including such a DAC.

First referring to FIG. 3, the structure of the liquid crystal display device according to the invention is explained. The liquid crystal display device shown here is of the type called "line sequential system", and operates to simultaneously write video signals onto all video signal lines. That is, adjacent to an image display portion 20, a video signal driving circuit VD and a scanning line driving circuit SD are provided on a common substrate. Switching elements forming them are made of a common semiconductor layer of polysilicon, for example, formed in a common stacking step.

In the image display portion 20, a plurality of video signal line 27 and a plurality of scanning lines 28 are provided to intersect at right angles, and pixels TFT 29 are provided at their crossing points. Connected to the drain electrode of each TFT 29 are a liquid crystal capacitor C1c and a supplemental capacitor Cs to form a display pixel.

The scanning line driving circuit SD is made up of a shift register, not shown, and a scanning line driving buffer, for example, and each buffer output is supplied to each scanning line 28. Based on a scanning ling signal supplied to each scanning line 28 in this manner, TFT 29 of the corresponding pixel is ON/OFF-controlled.

The video signal driving circuit VD is made up of a shift register 21, sampling switch 24, DAC 10 and buffer amplifier (amplifier circuit) 50. The shift register 21 is supplied with a clock signal (CLK-A) and a trigger signal. Then, the sampling switch 24 is controlled by an output from the shift register 21 and a sampling clock of serial data. The sampling switch 24 outputs a sample signal (Sample), its inverted signal (/Sample) and a control signal (Control).

DAC 10 is responsive to these signals to convert serially input digital video signals into analog signals and output them. The output analog video signals are supplied to a write control switch AS, and to each video signal line 27 through the buffer amplifier 50, then stored in the liquid crystal capacitor C1c and the supplemental capacitor Cs via the corresponding pixel TFT 29, and displayed as a predetermined image.

Next referring to FIG. 1, explanation is made about a structure of serial DAC experimentally prepared in the course toward the invention.

At is input state, a switch selecting circuit 11 is provided. The switch selecting circuit 11 is made up of NOR1, NOR2, NOT1 and NOT2.

In the next stage of the switch selecting circuit 11, there are provided an N-channel transistor M1, P-channel transistor M2, capacitor C1, N-channel transistor M4, P-channel transistor M5, capacitor C2 and N-channel transistor M3.

The switch selecting circuit 11 selects one of transistor M1 and transistor M2 in response to a data signal (Data) and a control signal (Control) input thereto. In greater detail, when the control signal is "L" (low), transistors M1 and M2 are exclusively selectable by the data signal, and transistor M1 is selected when the data signal is "0" whereas transistor M2 is selected when the data signal is "1".

On the other hand, when the control signal is "H" (high), neither of the transistors M1 and M2 is selected.

Transistor M1 is connected to the ground potential, and discharges electric charge of the capacitor C1 in response to a signal from the selecting circuit 11. Transistor M2 is connected to the reference voltage Vs and charges the capacitor C1 in response to the signal from the selecting circuit 11.

Transistors M4 and M5 form a transfer gate for introducing sample signals (Sample, /Sample) and controlling the electrical connection between the capacitors C1 and C2. That is, when the sample signal (Sample) is "L", the transfer gate is not conductive, and when it is "H", the transfer gate is conductive.

On the other hand, transistor M3 is controlled by a reset signal (Reset), and discharges the electric charge of the capacitor C2.

Next explained are operations of DAC of FIG. 1 with reference to FIG. 2.

Here is shown the example in which 4-bit digital data (1001) are input as the serially input digital video signals. That is, here is explained the example in which digital signals corresponding to "1", "0", "0" and "1" are sequentially input as data signals (Data). Also assume here that the capacitors C1 and C2 in FIG. 1 are equal in capacitance value.

In the period from t0 to t2 prior to introduction of the data signals, the control signal (Control) is set in "H", and both transistors M1 and M2 are non-conductive. Simultaneously, the sample signal (Sample) is set in "L", and the transistors M4 and M5 forming the transfer gate are non-conductive. As a result, point B which is one end of the capacitor C1 is opened.

Further, in the period from t1 to t2, the reset signal (Reset) is set in "H", and the transistor M3 is changed conductive. Then, one end of the capacitor C2, point A, is grounded, and the potential Va at point A is 0 (Volt).

These operations correspond to the reset operation prior to introduction of the serial video signals.

After that, from the time t2, the serial video signals are sequentially input to start DA converting operation.

First in the period from t2 to t4, the least significant bit (LSB) "1" is input. Responsively, in the period from t2 to 53, the control signal is set in "L" to enable selection of the transistors M1 and M2, and the sample signal is set at "L" to make the transfer gate M4 and M5 non-conductive and electrically disconnect point A and point B. In this status, since the input data signal is "1", transistor M4 is non-conductive, transistor M2 is conductive, and potential Vb at point B is set at Vs (Volt). That is, capacitor C1 is charged to the voltage of Vs (Volt). In this case, potential Va at point A is maintained in 0 (Volt).

Next in the period from t3 to t4, the control signal is set in "H" to make both transistors M1 and M2 non-conductive, and the sample signal is set "H" to make the transfer gate M4 and M5 conductive. Thus, point A and point B are electrically connected, and the potential at point B is kept off fluctuation by input data. As a result, reallocation of accumulated charges occurs between the capacitors C1 and C2.

More specifically, at time t3, since the potential Vb at point B is set in Vs (Volt) and the potential Va at point A in 0 (Volt), if the capacitors C1 and C2 are equal in capacitance value, at time t4, $$Va = Vb = \tfrac{1}{2} \times \text{``1''} \times Vs = Vs/2 \qquad (2)$$

That is, the charged voltage is Vs/" (Volt) in the capacitors C1 and C2.

Next in the period from t4 to t6, the next "0" of the video signals is input. Responsively, in the period from t4 to t5, the control signal (control signal, sampling signal and reset signal) of the same state as that of the period from t2 to 53. That is, it makes the transistors M1 and M2 selectable and electrically cuts the capacitors C1 and C2. Since the second bit "0" is input as a data signal, the transistor M1 is made conductive and the transistor M2 is made non-conductive. Therefore, potential Vb at point B is maintained in Vb=0 (Volt), and potential Va at point is maintained in Vs/2 (Volt). That is, the charged voltage of he capacitor C1 becomes 0 (Volt), and the charged voltage of he capacitor C2 is maintained in Vs/2 (Volt).

In the period from t5 to t6, since the control signal in he same state as that of the period from t3 to t4 is input, reallocation of accumulated charges occurs between the capacitors C1 and C2. As a result, at time t6, $$Va=Vb=\tfrac{1}{2}\times(\text{``0''}\times Vs+\tfrac{1}{2}\times\text{``1''}\times Vs)=Vs/4 \qquad (3)$$

Thereafter, the third bit "0" of the video signal is input in the period from t6 to t8, and-the most significant bit (MSB) "1" is input in the period from t8 to t10. This series of these operations are repeated in response to entry of these bit data. As a result, at time t10, potential Va at point A and potential Vb at point B become $$Va = Vb = \{1/2\times''1'' + (1/2)^2\times''0'' + (1/2)^3\times''0'' + (1/2)^4\times''1''\}\times Vs \qquad (4)$$
$$= (9/16)\,Vs$$

and an analog potential corresponding to the input digital data (1001) is obtained.

On and after time t10, the control signal (Control) is set in "H", and the sample signal (Sample) and the reset signal (Reset) are set in "L". As a result, by electrical disconnection of capacitors C1 and C2 and preventing the transistors M1 and M2 from being selected by the input digital data, Va can be maintained. In this manner, analog potential Va corresponding to the input digital data is obtained and applied to a corresponding video signal line 27.

As explained above, according to the serial DAC shown in FIG. 1, serially input digital video signals can be converted into analog signals reliably and easily. Moreover, circuit arrangement of DAC is very simple, and the circuit area can be reduced much more than conventional ones. That is, when making pixel TFT and switching elements the driving circuit by using a common semiconductor layer of polysilicon, for example, stacked on a common substrate, the area of the driving circuit can be reduced.

This effect of reducing the circuit scale becomes greater with the number of bits of digital data. That is, a greater effect can be obtained as the displayed images are high-qualified. For example, as compared with the conventional 6-bit parallel input DAC shown in FIG. 56, the circuit scale of the serial DAC of FIG. 1 can be reduced to approximately ⅙. That is, the area occupied by the circuit can be reduced about ⅙ of conventional ones.

As compared with a typical n-bit parallel input DAC, the circuit scale of the serial DAC of FIG. 1 is approximately 1/n, and as the number of bits increases, -a larger effect of dimensional reduction of the circuit can be obtained. This is especially advantageous in a polysilicon TFT liquid crystal display device integrating the driving circuit into the panel. For the purpose of attaining higher image quality of displayed images, it is necessary to increase the display gradation, i.e. the number of bits of video signals. However, according to the serial DAC of FIG. 1, both the miniaturization of the panel and a higher image quality can be attained simultaneously without increasing the circuit scale.

Additionally, the serial DAC of FIG. 1 also brings about the effect that digital data different in number of bits can be converted into analog video signals without changing the circuit. That is, by repeating the above-explained operations for each bit of the serially input digital data, the digital data can be converted into an analog form independently of the number of bits.

These effects brought about by the serial DAC of FIG. 1 are particularly advantageous when the invention is applied to display devices of computers. More specifically, in computers, it is often required to switch the image display mode depending upon its use or software. In that case, it is desirable to change the display gradation, i.e. number of gradation bits, together with its display resolution. According to the serial DAC of FIG. 1, even in that case, analog conversion is possible by using the same DAC.

For example, by dividing the period from ts to te for DA conversion as shown in FIG. 2 into more short periods of time depending upon the number of bits of input digital data, digital data with a larger number of bits can be converted into an analog potential (voltage). Analog potential Va obtained by converting digital data (Bn, Bn–1, . . . B1) of n-bits (each bit herein is 0 or 1) with DAC of FIG. 1 is expressed by the following equation.

$$V_a = \sum_{k=1}^{n} \left(\frac{1}{2}\right)^k \cdot B_{n-k+1}\cdot V_s \qquad (5)$$

In this manner, according to the serial DAC of FIG. 1, DA conversion is possible with a less number of elements than those of conventional DACS. In addition, by merely changing the frequency of the control signal during the period of conversion without changing the circuit, digital data of any arbitrary length can be converted into an analog potential. As a result, a video signal driving circuit capable of high definition display and using less elements can be realized.

The serial DAC explained above is more conceptually explained below.

Figure 4:
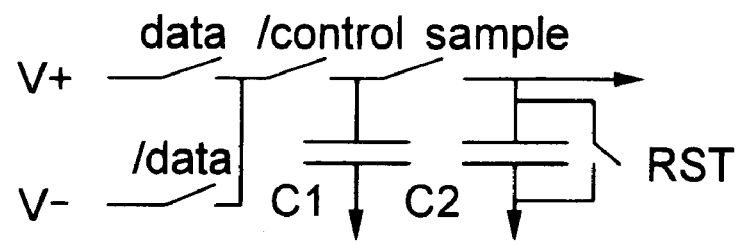
FIG. 4 is a diagram schematically showing the structure of serial DAC shown in FIG. 1.

FIG. 4 is a diagram conceptually representing the structure of serial DAC shown in FIG. 1. That is, the serial DAC shown in FIG. 1 basically comprises two capacitors C1 and C2. Then, based on data signals (data, /data) and control signal (/control), voltages corresponding to digital signals are serially input to the capacitor C1. On the other hand, in parallel therewith, by executing reallocation of charges between the capacitors C1 and C2 on the basis of the sample signal (sample), digital signals are converted into analog voltages. Input voltages V+ and V– shown in FIG. 4 correspond to Vs and ground potential shown in FIG. 1, respectively.

The Inventor made further improvements on the serial DAC, and invented a serial DAC more suitable for use in a driving circuit of a display device.

Figure 5:
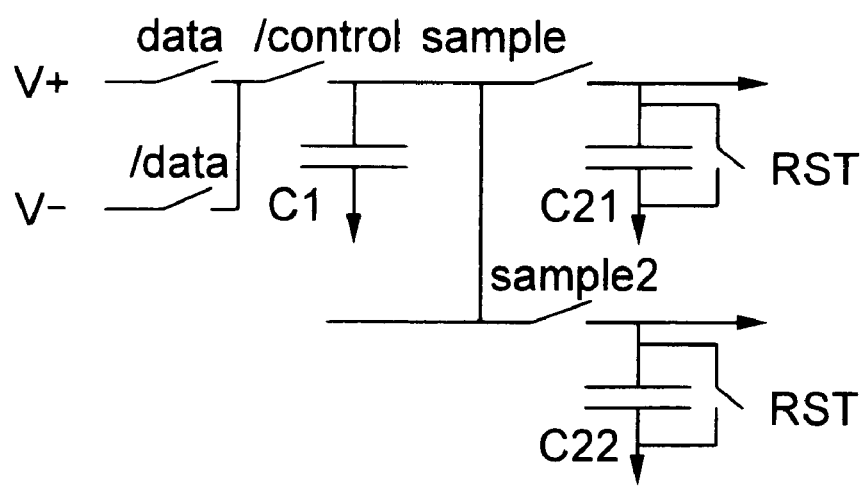
FIG. 5 is a conceptional diagram showing the basic structure of the first serial DAC according to the invention.

FIG. 5 is a conceptional diagram showing the basic structure of the first serial DAC according to the invention.

Figure 6:
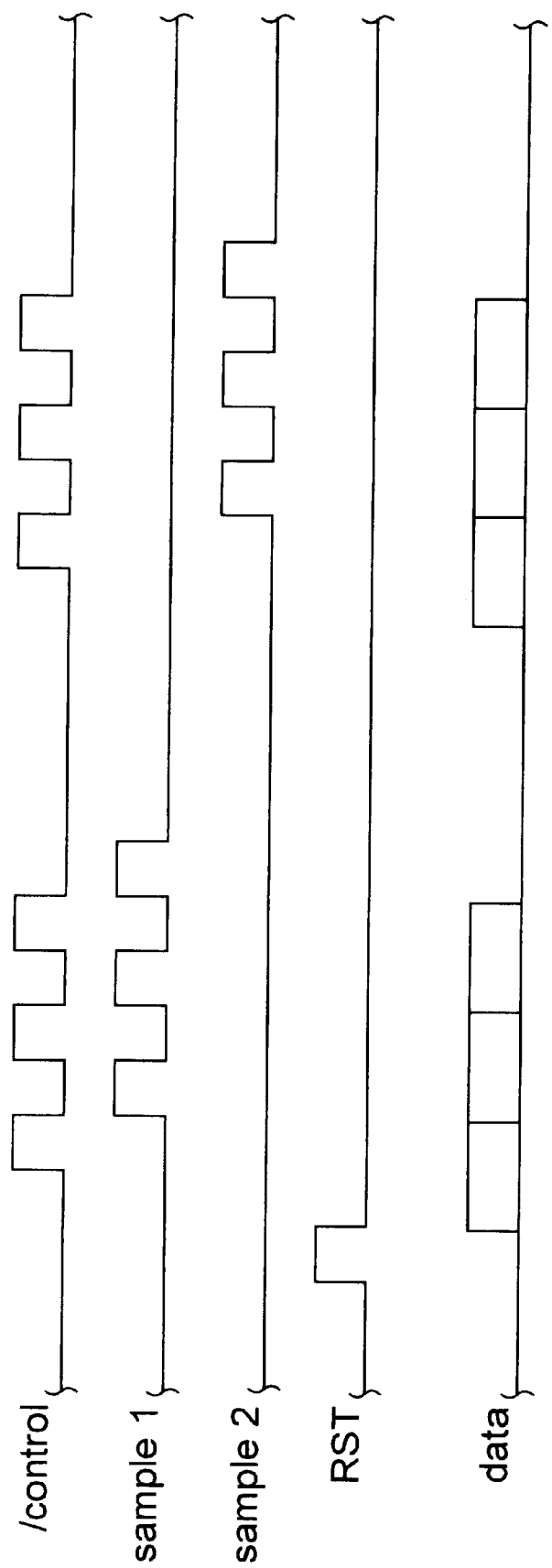
FIG. 6 is a timing chart explaining operations of serial DAC of FIG. 5.

FIG. 6 is a timing chart explaining operations of serial DAC of FIG. 5.

The serial DAC 10A shown in FIG. 5 is a "output capacitor parallel type" DAC having one capacitor C1 on the primary side and two capacitors C21 and C22 on the secondary side. By alternately using these two capacitors C21 and C22, the serial DAC 10A can consecutively execute DA (digital-analog) conversion and writing onto a signal line.

With reference to the timing chart of FIG. 6, its operations are explained below.

First of all, the reset signal (RST) is turned ON to initialize the capacitors C21 and C22.

Subsequently, the control signal (/control) and sample signal (sample 1) are alternately turned ON to serially apply voltages corresponding to individual bits of the digital signal to the capacitor C1 and simultaneously executes reallocation of charges between it and the capacitor C21. As a result of these operations, an analog potential corresponding to the digital data is charged in the capacitor C21.

After that, the control signal (/control) and sample signal (sample 2) are alternately turned ON to serially apply voltages corresponding to individual bits of the digital signal to the capacitor C1 and simultaneously execute reallocation of charges between it and the capacitor C22. As a result of these operations, an analog potential corresponding to the digital data is charged in the capacitor C22.

In this case, in parallel with the DA conversion using the capacitor C22, it is possible to execute writing of the analog potential from the capacitor C21 to a signal line, not shown. That is, according to the serial DAC shown in FIG. 5 which can executes writing of the potential to one of the capacitors C21 and C22 to the signal line in parallel with the DA conversion using the other capacitor, the time required for signal processing by the driving circuit can be reduced significantly.

Many kinds of display devices including liquid crystal display devices, in general, are moving toward larger capacities and higher definition, and parasitic capacitance of signal lines themselves tends to increase. This means that a longer time must be allowed for precisely writing analog potentials onto the signal lines.

Under these requirements, the structure of FIG. 5, which can execute DA conversion in parallel with writing onto signal lines, can precisely write analog potentials onto signal lines while reducing the signal processing time, and can quickly, precisely represent high-quality images of high definition and high gradation.

The timing chart of FIG. 6 has been made for the case in which 3-bit digital data are DA-converted. The invention, however, is not restricted to it, but ensures the same processing can be made to digital data of any number of bits.

Additionally, as described later, any of the secondary-side capacitors C21 and C22 of the serial DAC need not be fixed to a specific signal line, and rather may be designed to change its connection to selective one of a plurality of signal lines through a changeover switch from time to time. As a result of trials and researches by the Inventor, it has been confirmed that 6 to 30 signal lines can be selectively connected to, for example, capacitors C21 and C22, respectively, via changeover switches. In this manner, the structure of the driving circuit can be miniaturized and simplified by largely reducing the number of DAC mounted therein.

Next explained is the second DAC according to the invention.

Figure 7:
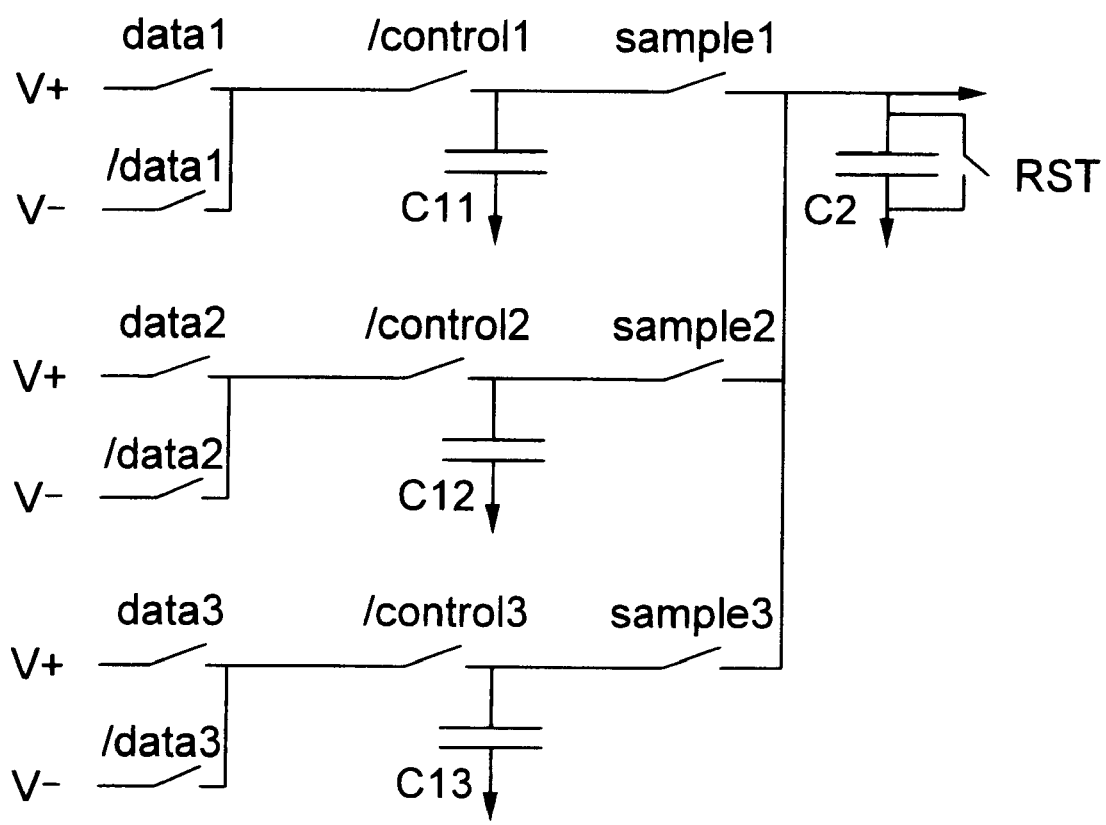
FIG. 7 is a conceptional diagram showing the basic structure of the second DAC according to the invention.

FIG. 7 is a conceptional diagram showing the basic structure of the second DAC according to the invention.

Figure 8:
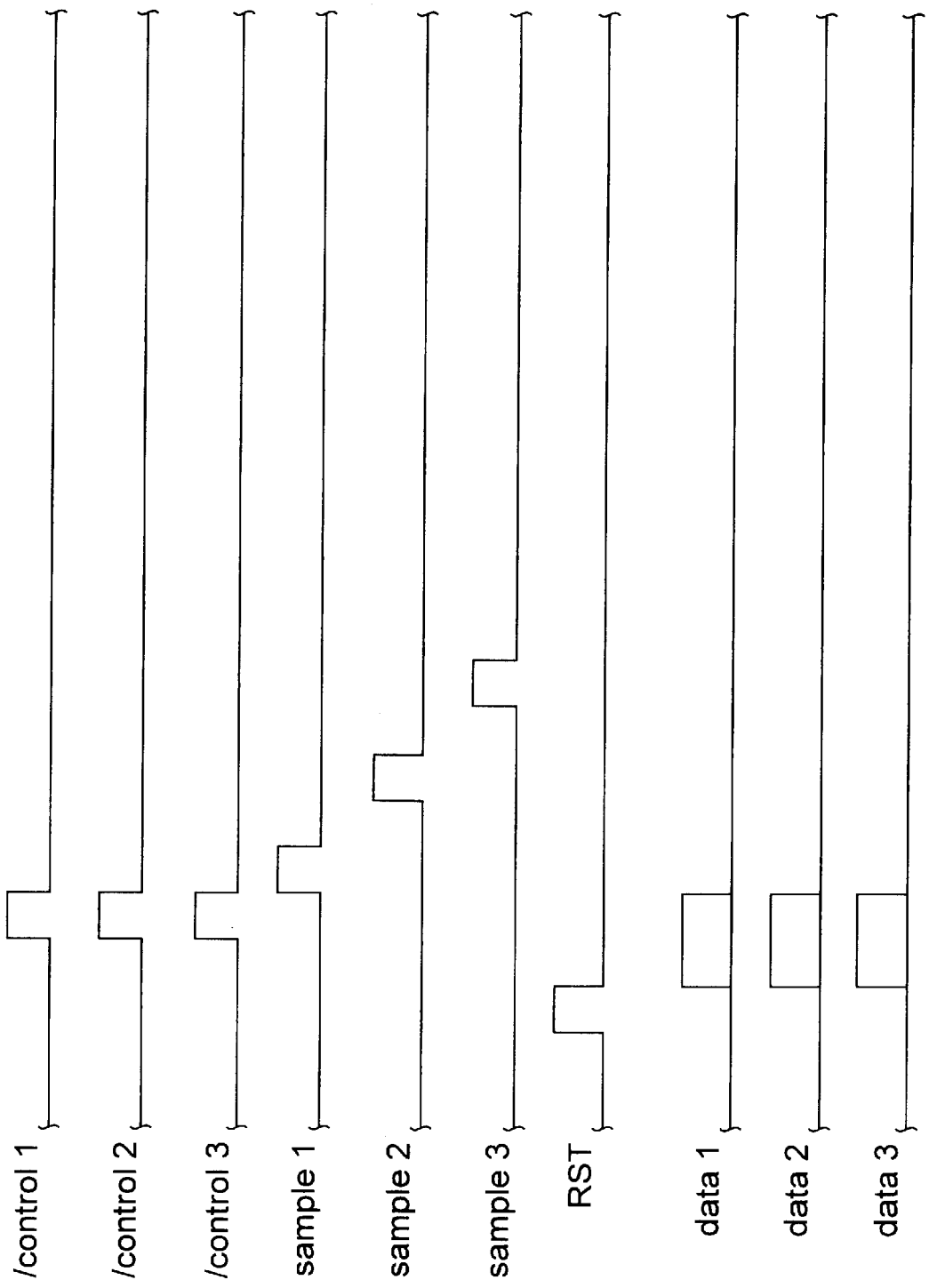
FIG. 8 is a timing chart explaining operations of DAC of FIG. 7.

FIG. 8 is a timing chart explaining operations of DAC of FIG. 7.

The DAC 10B shown in FIG. 7 is an "input capacitor parallel type" DAC having three capacitors C11 through C13 on the primary side and one capacitor C2 on the secondary side. By providing a plurality of capacitors on the primary side in this manner, it is possible to introduce digital signals in a parallel mode and serially convert them into analog forms in the DAC.

Referring to the timing chart of FIG. 8, its operations are explained below.

The capacitor C2 is first initialized by turning ON the reset signal (RST).

After that, by simultaneously activating three control signals (/control 1 through /control 3), voltages corresponding to individual bits of the digital signal are applied to the capacitors C11 through C13. If the input digital data is a 3-bit data, a voltage corresponding to the data of the third bit (least significant bit) (data 1) is applied to the capacitor C11, a voltage corresponding to the data of the second bit (data 2) is applied to the capacitor C12, and a voltage corresponding to the data of the first bit (most significant bit) (data 3) is applied to the capacitor C13, for example.

After that, by sequentially activating the sample signals (sample 1 through sample 3), charges accumulated in the capacitors C11 and C13 are reallocated between them and the capacitor C2. That is, serial analog conversion is executed. As a result, an analog potential corresponding to the digital data input to the capacitors C11 through C13 is charged in the capacitor C2.

Thereafter, the analog potential charged in the capacitor C2 is written on a specific signal line via an analog switch or output circuit, not shown.

As explained above, according to the DAC shown in FIG. 7, which uses a plurality of capacitors C11 through C13 on the primary side and can input digital data into them in a parallel mode, ensures the effect that digital data can be input at a high speed.

In the structure shown in FIG. 7, the number of capacitors on the primary side need not be the same as the input digital data. For example, by using DAC having three capacitors C11 through C13 as shown in FIG. 7, for example, it is also possible to execute DA conversion of 6-bit digital data. More specifically, first as the first cycle, data from the:sixth bit (least significant bit) to the fourth bit are input to the capacitors C11 through C13, and serial analog conversion is executed. Subsequently, as the second cycle, data of the third bit to the first bit (most significant bit) are input to the capacitors C11 through C13, and serial analog conversion may be conducted.

It wall apparent from this example, although the number of capacitor on the primary side need not coincide with the number of bits of input digital data, it is advantageous for efficiency that the number of capacitors on the primary side is one of integer subdivisions of the number of input bits.

On the other hand, digital data of a less number of bits than the number of capacitors on the primary side can also be handled similarly. That is, in such cases, a number of capacitors corresponding to the number of bits may be used selectively.

On the other hand, also in the DACE shown in FIG. 7, the capacitor C2 on the secondary side need not be fixed to a specific signal line, but may be selectively connectable to any appropriate one of a plurality of signal lines from time to time. This is as already explained with reference to FIG. 5.

Next explained is the third DAC according to the invention.

Figure 9:
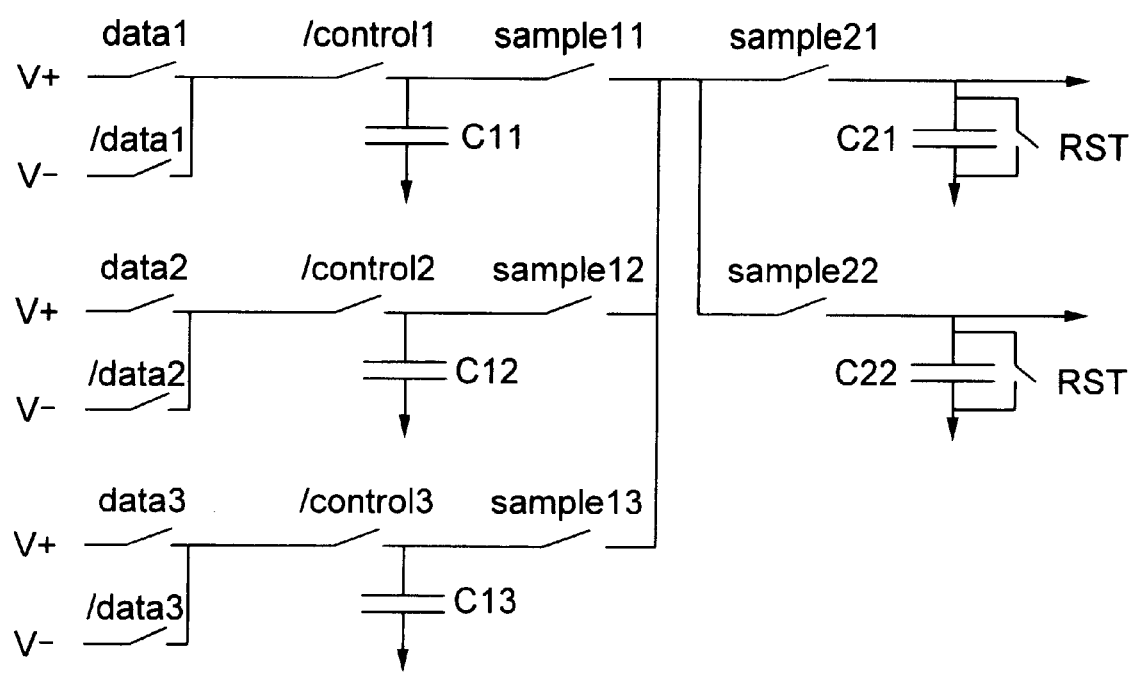
FIG. 9 is a conceptional diagram showing the basic structure of the third DAC according to the invention.

FIG. 9 is a conceptional diagram showing the basic structure of the third DAC according to the invention.

Figure 10:
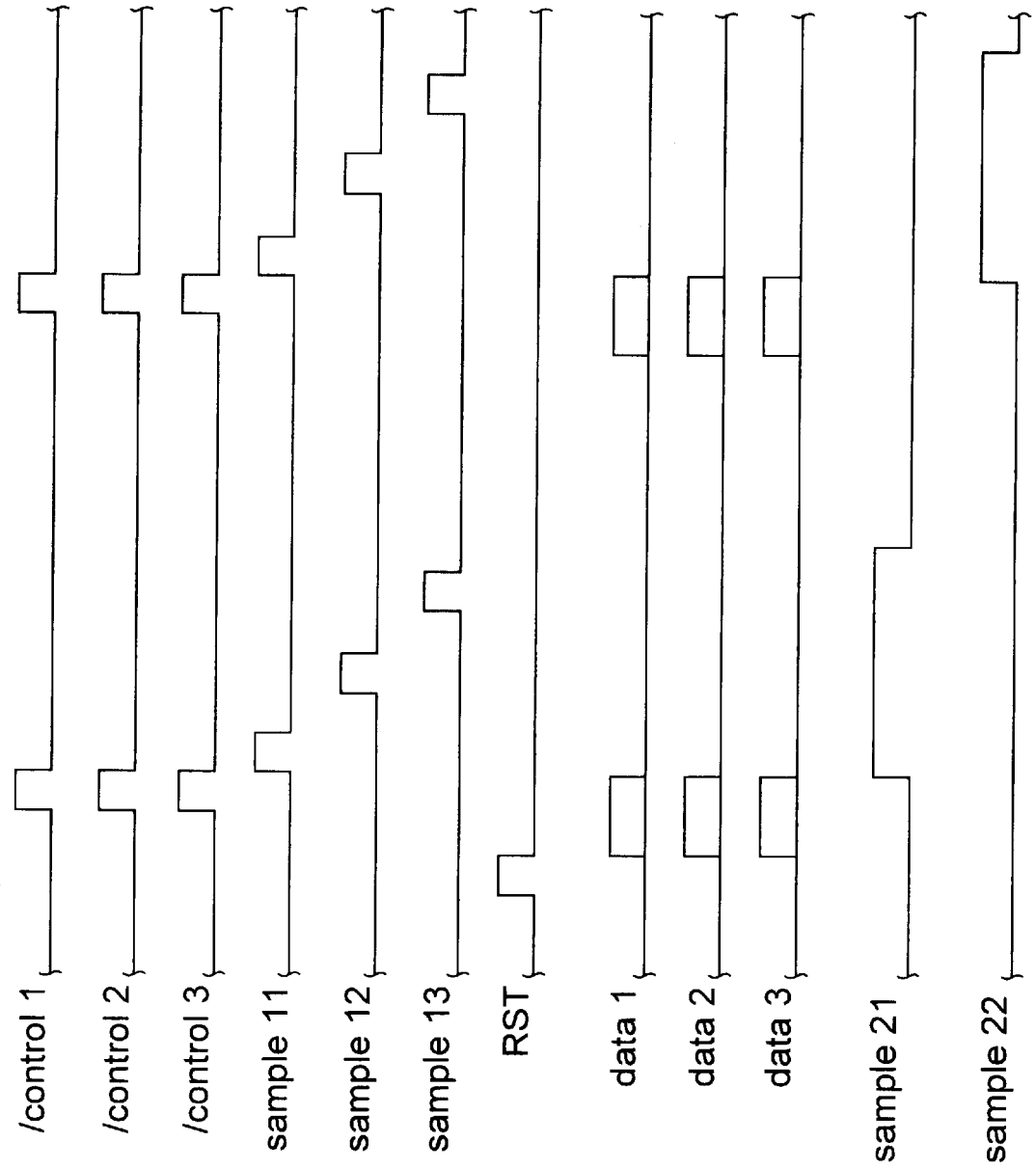
FIG. 10 is a timing chart explaining operations of DAC of FIG. 9.

FIG. 10 is a timing chart explaining operations of DAC of FIG. 9.

DAC 10C shown in FIG. 9 has three capacitors C11 through C13 on the primary side and two capacitors C21 and C22 on the secondary side. That is, this is an "input/output capacitor parallel type" DAC having a plurality of capacitors on the primary side and the secondary side, respectively.

By providing a plurality of capacitors C11 through C13 on the primary side, digital signals can be input in parallel at a high speed as already explained with reference to FIG. 7. On the other hand, by providing a plurality of capacitors C21 and C22 on the secondary side, DA conversion and writing onto a signal line can be executed in parallel as already explained with reference to FIG. 5.

With reference to the timing chart of FIG. 10, its operations are explained below.

The reset signal (RST) is first turned ON to initialize the capacitors C21 and X22.

After that, three control signals (/control 11 through /control 13) are simultaneously activated to introduce voltages corresponding to individual bits of the digital signal to the capacitors C11 through C13 in parallel. If the input digital data is a 3-bit data, a voltage corresponding to the data of the third bit (least significant bit) (data 1) is applied to the capacitor C11, a voltage corresponding to the data of the second bit (data 2) is applied to the capacitor C12, and a voltage corresponding to the data of the first bit (most significant bit) (data 3) is applied to the capacitor C13, for example.

Subsequently, by activating the sample signal (sample 11), the capacitor C21 is selected on the secondary side. Then, by sequentially activating the sample signals (sample 11 through sample 13), charges accumulated in the capacitors C11 through C13 are reallocated between them and the capacitor C21. That is, serial analog conversion is executed. As a result, an analog potential corresponding to the digital data input to the capacitors C11 through C13 is charged in the capacitor C21.

After that, the capacitor C22 is selected on the secondary side, and the next DA conversion is conducted.

That is, by simultaneously activating three control signals (/control 11 through /control 13), voltages corresponding to individual bit data (data 1 to data 3) of the digital signal are applied in parallel to the capacitors C11 through C13.

Thereafter, by turning ON the sample signal (sample 12), the capacitor C22 is selected on the secondary side. Thus by sequentially activating the sample signals (sample 11 through sample 13), charged accumulated in the capacitors C11 through C13 are reallocated between them and the capacitor C22. As a result, an analog potential corresponding to the digital data input to the capacitors C11 through C13 is charged in the capacitor C22.

During this DA conversion, the analog potential charged in the capacitor C21 can be written onto a specific signal line through an analog switch or output circuit, not shown.

As explained above, the DAC shown in FIG. 9, which has a plurality of capacitors C11 through C13 on the primary side and can input digital data thereto in parallel, is effective for inputting digital data at a high speed.

Additionally, having a plurality of capacitors C21 and C22 on the secondary side, it can conduct DA conversion and writing on a signal line simultaneously.

Therefore, according to DAC shown in FIG. 9, those effects already explained with reference to FIGS. 5 through 8 can be obtained simultaneously.

Heretofore, digital-analog converter circuits (DAC) for use in a driving circuit according to the invention have been explained by way of specific examples. The invention, however, is not limited to these specific examples. For example, although the above description with reference to FIGS. 1 through 9 has been directed to examples where the primary-side capacitor C1 (or any other like C11) and the secondary-side capacitor C2 (or any other like C21) are equal in capacitance value, they need not be equal. In the case where the primary-side capacitor value and the secondary-side capacitance value are different a certain "gain" is obtained. More specifically, in an example where the capacitance value of the primary-side capacitor C1 is $C_1$ whereas the capacitance value of the secondary-side capacitor C2 is $C_2$, in Equations (2) to (5), the coefficient "½" in the right sides may be replaced with the coefficient "$C_1/(C_1+C_2)$". For example, if the capacitor C2 has the capacitance value three times the capacitance value of the capacitor C1, this coefficient is "¼". If the capacitor C1 has the capacitance value two thirds that of the capacitor C2, the coefficient is "⅔".

Therefore, by appropriately selecting capacitance values of the capacitor C1 and the capacitor C2 so that a desired gain can be obtained, the voltage range of the video signals can be adjusted within an optimum range for the reference potential Vs.

In the specific example explained with reference to FIG. 1 or FIG. 5, serial data is input to DAC. The invention, however, is not limited to it, but also copes with conversion of digital data input in parallel. This is attained, for example, by separately providing means for accumulating digital data input in parallel and extracting and supplying data of individual bits sequentially from its least significant bit. In this manner, also for digital data input in parallel, analog conversion can be done similarly by repeating operations as explained with reference to FIG. 2. In this case, the circuit is slightly enlarged in scale, but it similarly ensures the effect of the invention that any digital data of any arbitrary length can be dealt with.

Further, instead of the ground potential for discharging the capacitors C1 and C2, a second reference voltage may be provided. In this case, the bottom voltage of the analog video signal obtained becomes the same as the second reference potential.

Moreover, in the specific examples shown in FIGS. 1 through 9, the electric charge charged in the second capacitor C2 is output as the analog video signal. The invention, however, is not limited to it. That is, in the structure shown in FIG. 1 or FIG. 5, at the moment when consecutive operations of electrically charging and reallocating the charges are completed up to the most significant bit involved, the first capacitor C1 and the second capacitor C2 are equal in value of the charged voltage. Therefore, a selecting circuit may be used to externally output the charged voltage of the first capacitor C1 in lieu of the second capacitor C2 as the analog video signal.

Furthermore, under the condition where the first capacitor C1 and the second capacitor C2 are short-circuited, the charged voltage of the capacitors C1+C2 as the output capacitance can be externally output as the analog video signal. This is effective for reducing fluctuation of the DAC output voltage caused by parasitic capacitance of the external circuit to about a half.

Next explained is a modification of serial type DAC suitable for use in the driving circuit according to the invention.

Figure 11:
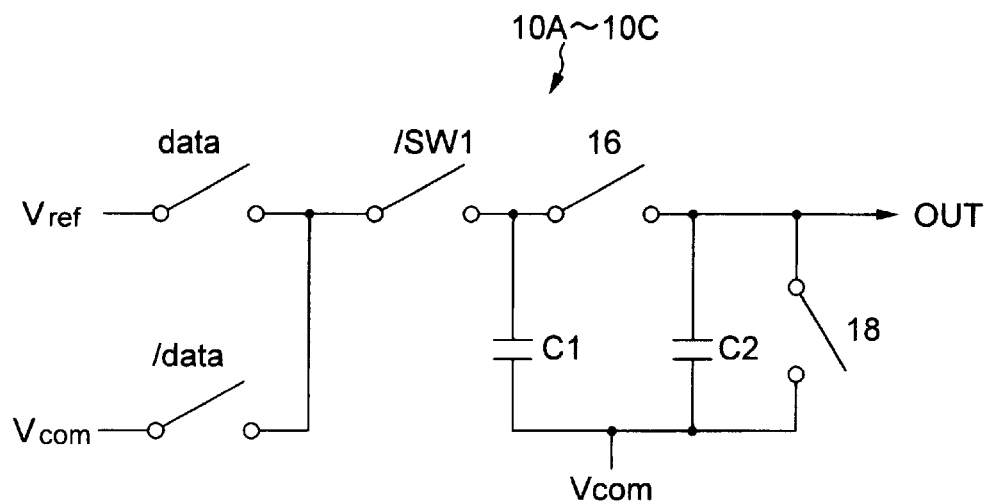
FIG. 11 is a rough circuit diagram modified from the serial DAC shown in FIGS. 1 through 9 by further simplification.

FIG. 11 is a rough circuit diagram modified from the serial DAC shown in FIGS. 1 through 9 by further simplification. That is, the serial type DAC includes switch (data, which corresponds to the transistor M2 of FIG. 1, and /data, which corresponds to the transistor M1 of FIG. 1), cutoff switch /SW1, capacitors C1 and C2, link switch 16 connected between them, and reset switch 18.

In the modified example of FIG. 11, by using the cutoff switch /SW1, opposite flow of accumulated charged from the capacitor C1 can be prevented reliably.

The DAC circuit shown in FIGS. 1 through 11 is preferably designed to reduce the leakage amount during the OFF-state of the reset switch 18 to a smaller value than those of the other switches. This is for the purpose of preventing leakage of the accumulated charged from the capacitor C2. For this purpose, it is advantageous to employ a double-gate structure in which the gate length L of the transistor forming the reset switch 18 is longer and the gate width W is shorter.

Similarly, in order to prevent fluctuation of accumulated charges of the capacitor C1, it is preferable that the amount of leakage during the OFF-state of the cutoff switch /SW1 is small. For this purpose, it is advantageous here again to use a double-gate structure in which the gate length L of the transistor forming the cutoff switch /SW1 is longer and the gate width W is shorter.

In relation to this, the ON period of the cutoff switch /SW1 is preferably set longer than the ON period of the link switch 16. This is because, when the cutoff switch /SW2 is made up of a transistor with a small leakage amount, a longer time is required for writing voltages.

On the other hand, for TFT 29 forming the switching element of a pixel in the display device as shown in FIG. 3, 1–2-Volt or 12-Volt power source is used inmost cases. Therefore, by using a −1-Volt or 12-Volt power source also for each switch of DAC shown in FIGS. 1 through 11 to equalize the OFF condition to the pixel TFT, the power source structure can be simplified.

Figure 12:
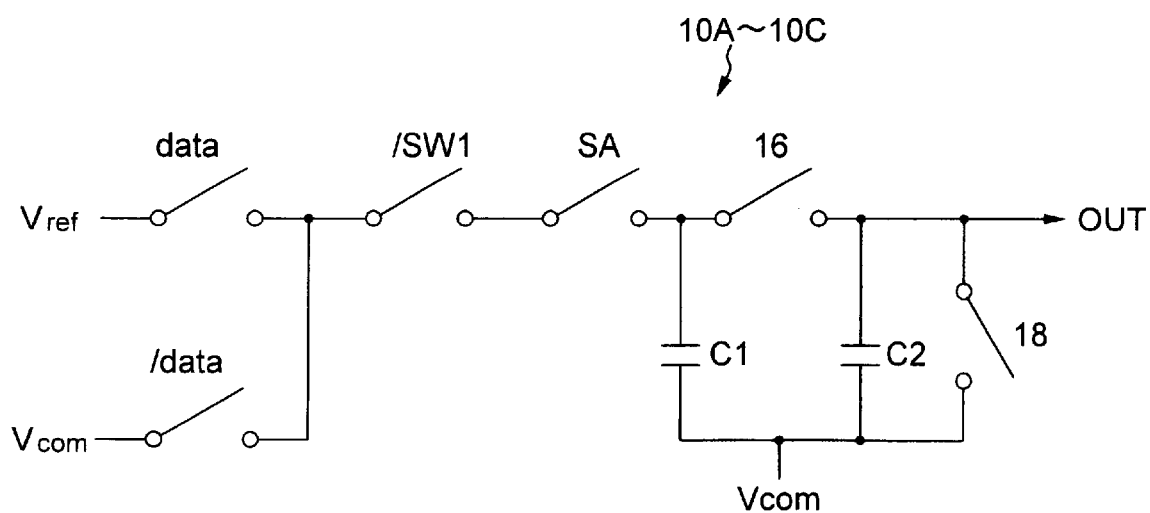
FIG. 12 is a rough circuit diagram showing the second modified example of DAC which is suitable for use in a driving circuit according to the invention.

FIG. 12 is a rough circuit diagram showing the second modified example of DAC which is suitable for use in a driving circuit according to the invention. That is, in the circuit shown here, a switch SA is connected in series to the cutoff switch /SW1. The switch SA is activated in accordance with the NAND logic of the cutoff switch /SW1 and the link switch 16. That is, the switch SA is configured to turn OFF under the condition where both the cutoff switch /SW1 and the link switch 16 are semi-opened. By using this switch SA, it is possible to reliably prevent erroneous voltage writing into the capacitor C1 even upon an "offset" in operation timing between the switches /SW1 and 16, and more accurate converting operation of DAC can be ensured.

Figure 13:
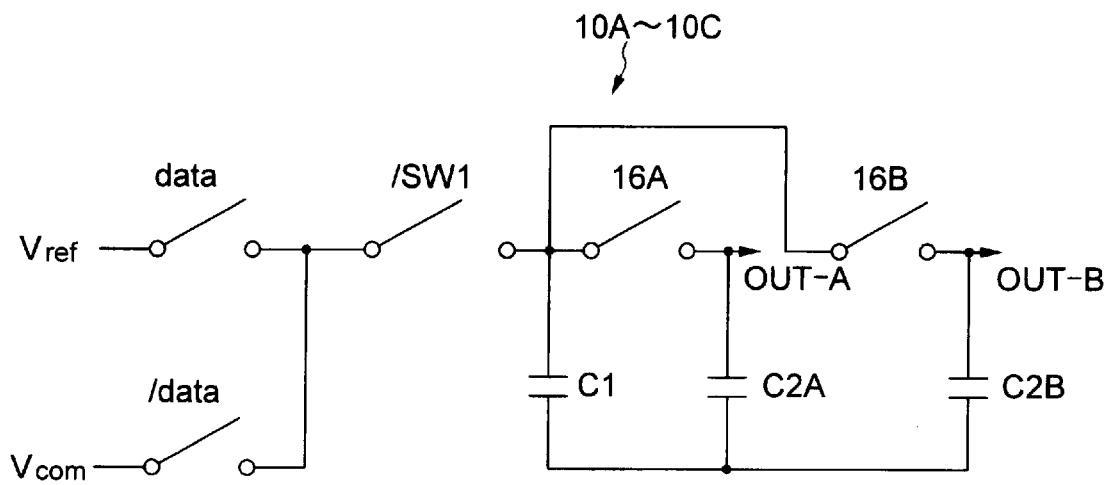
FIG. 13 is a rough circuit diagram showing,the third modified example of DAC which is suitable for use in a driving circuit according to the invention.

FIG. 13 is a rough circuit diagram showing the third modified example of DAC which is suitable for use in a driving circuit according to the invention. In the circuit shown here, two capacitors C2A and C2B are provided in parallel as secondary-side capacitors. These two capacitors are connected to the primary-side capacitor C1 in a complementary mode via link switches 16A, 16B, respectively. That is, a unit of DA conversion is conducted between the capacitors C1 and C2A, and the next DA conversion is conducted between the capacitors C1 and C2B. Although omitted from FIG. 13, reset switches are preferably provided for the secondary-side capacitors C2A and C2B, respectively.

By providing two capacitors C2A and C2B as the secondary-side capacitors and selectively using them for every DA conversion, also while one of the secondary-side capacitors outputs analog data to the signal output circuit 50, the other of the secondary-side capacitors can be used to undertake the next DA conversion. This contributes to speeding up the data processing.

Also obtained as another advantage is the effect of "error diffusion" upon any "fluctuation" in capacitance ratio C2/C1 between the primary-side capacitor and the secondary-side capacitor of adjacent DACs.

Figure 14A:
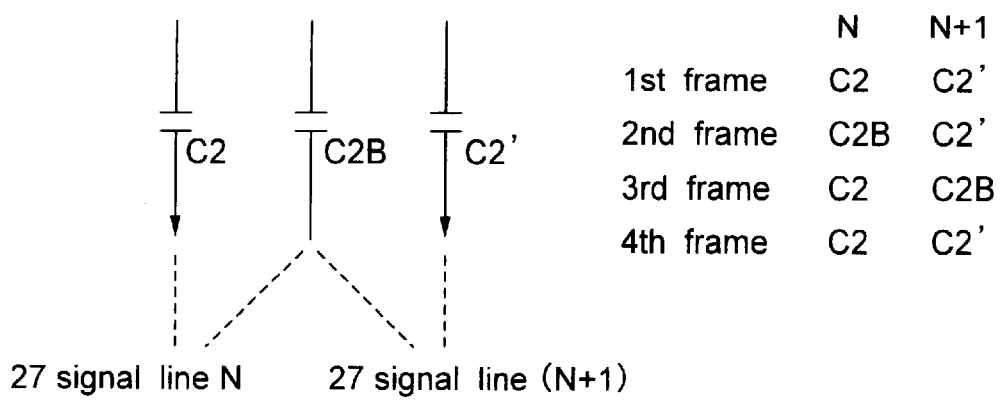
FIG. 14 is conceptional diagrams for explaining effects of "error diffusion"

FIG. 14 is conceptional diagrams for explaining effects of "error diffusion". In the example shown in FIG. 14(a), DAC combined with a signal line N has a primary-side capacitor C2' whereas DAC combined with the adjacent signal line (N+1) has a secondary-side capacitor C2'. These DACs further shares a capacitor C2B as their second secondary-side capacitor. Then, as shown in the right side of the same drawing, DAC for the signal line N uses the capacitor C2 in the first, third and fourth frames, and uses the capacitor C2B in the second frame. On the other hand, DAC for the signal line (N+1) uses the capacitor C2' in the first, second and fourth frames and uses the capacitor C2B in the third frame.

In this manner, even when a "difference" in capacity exists between the capacitors C2 and C2', by commonly using the capacitor C2B, the "difference" can be distributed temporally to make it inconspicuous.

Figure 14B:
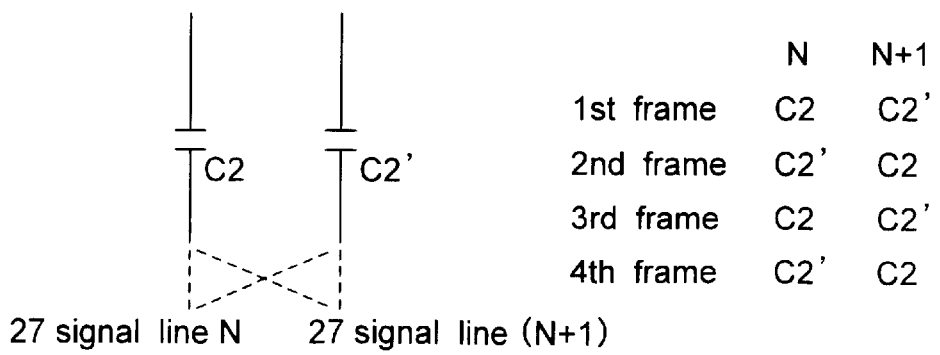

Further, as shown in FIG. 14(b), the invention enables common use of the secondary-side capacitor between adjacent two DACs without using additional one. That is, In the example shown here, DAC for the signal line N has the secondary-side: capacitor C2, and DAC for the adjacent signal line (N+1) has the secondary-side capacitor C2'. Then, these DACs mutually exchange the secondary-side capacitor for every frame to execute DA conversion. Also in this manner, it is possible to distribute the "difference" in capacitance between the capacitors C2 and C2' to make it inconspicuous.

Heretofore, serial-type DACs suitable for use in driving circuits according to the invention have been explained in detail.

Next made is detailed explanation about a signal output circuit (amplifier circuit) for outputting video signals output from DAC to video signal lines in a driving circuit according to the invention.

As already explained with reference to FIG. 3, the video signal line driving circuit according to the invention has the structure in which DAC 10A through 10C, analog switch As and video signal output circuit 50 are connected in series for each video signal line 27.

Figure 15:
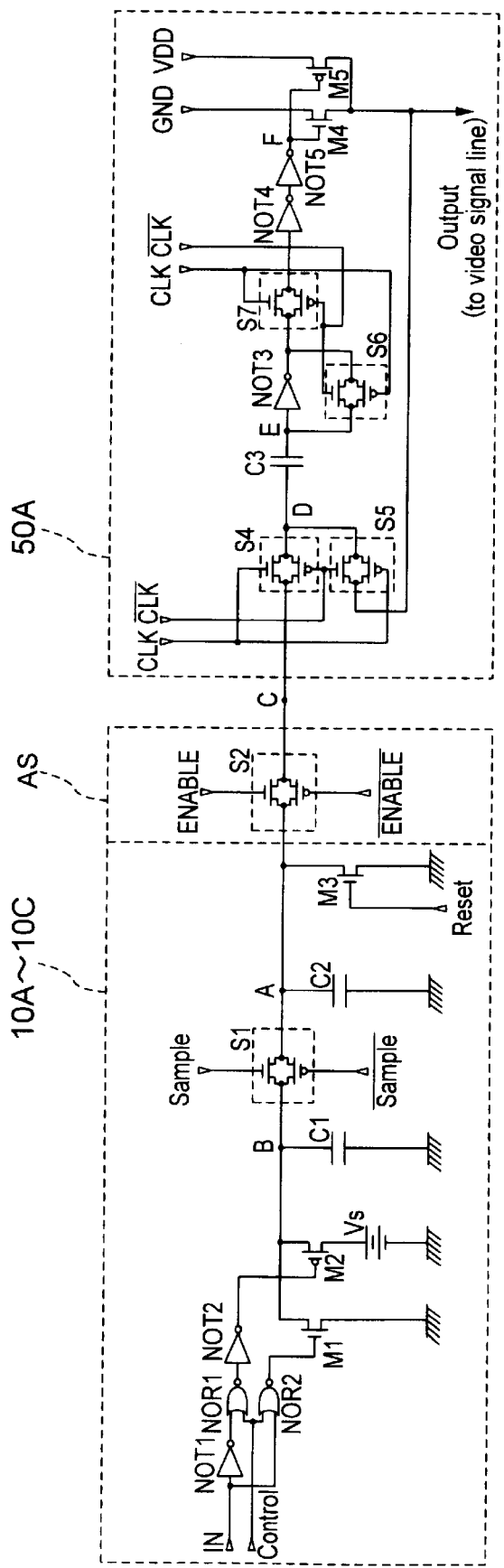
FIG. 15 is a rough diagram showing the major mart of a video signal line driving circuit according to the first embodiment of the invention.

FIG. 15 is a rough diagram showing the major mart of a video signal line driving circuit according to the first embodiment of the invention. This is a circuit diagram showing the configuration in which, for each single video signal line 27, DAC, analog switch AS and video signal output circuit 50A are connected. The same elements as those already explained with reference to FIGS. 1 through 14 are labeled with common reference numerals, and their detailed explanation is omitted.

The signal output circuit 50A includes switches Si through S4, capacitor C3, NOT3, NOT4, NOT5, transistors M4 and M5. Transistors M4 and M5 are selectively activated by NOT3 through NOT5. By using this output circuit 50A, the voltage at the operating point of an inverting amplifier for controlling the switching operation can be detected thereby to alleviate undesirable influences from fluctuation in TFT property and represent good images.

Figure 16:
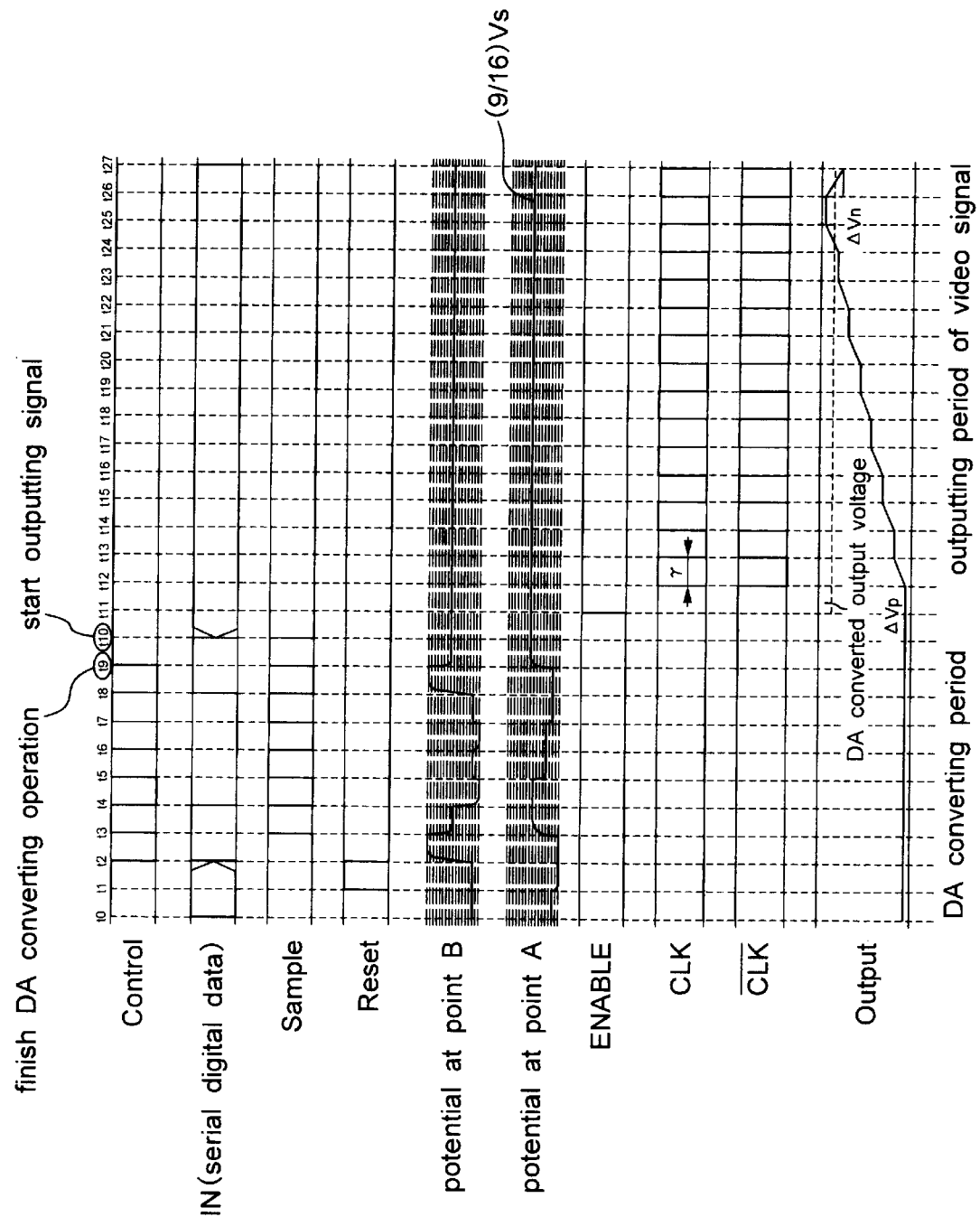
FIG. 16 is a timing chart showing operational waveforms of the circuit of FIG. 15.

FIG. 16 is a timing chart showing operational waveforms of the circuit of FIG. 15. Referring to FIG. 16, operations of the signal output circuit 50A are explained below.

First in the period from t1 to t10, digital-analog (DA) conversion is executed in a serial mode by DAC 10A through 10C. This converting operation is the same as already explained in detail with reference to FIGS. 1 through 10, and its detailed explanation is omitted here. When the DA conversion is completed at time t10, operations of the signal line output circuit begins.

At time t11, the control signal ENABLE becomes "H", and the analog switch AS turns ON responsively. Then, point A and point C are electrically connected. In the period from t11 to t12, since the control signal CLK is "L", switches S2 and S3 become conductive, and switches S1 and S4 become non-conductive. As a result, the potential Vd at point D which is one end of the electrostatic capacitor C3 becomes the video signal line potential Vsig, and the potential Ve at point E which is the other end of C3 becomes the operating point potentialVop of NOT3 because the input and the output of inverter NOT3 are short-circuited by S3. The operating point voltage of NOT3 varies with the property of TFT forming the circuit, and therefore varies depending on video signal line driving circuits.

When CLK becomes "H" in the period from t12 to t13, switches S1 and S4 become conductive, and switches S2 and S3 become non-conductive. Therefore, the potential at point D becomes Vd=Vc=Va, and equal to the output potential of DAC 10A through 10C. On the other hand, the potential Ve at point E becomes Ve=(Va−Vsig)+Vop because C3 maintains the potential putting CLK in the state of "L". Therefore, the voltage Vf at point F is:

$$Vf=0 \text{ when } Va>Vsig, \text{ and} \quad (1)$$

$$Vf=VDD \text{ when } Va<Vsig. \quad (2)$$

In this example, since Va>Vsig at time t11, potential Vf at point F is zero. As a result, P-channel transistor M5 becomes conductive, and current Ip is supplied to the video signal line 27. At that time, the voltage rise $_\sim$Vp in the video signal line 27 in the period T is expressed as $_\sim$Vp=Ip×T/Csig where Csig is the capacitance of the signal line.

When it comes to time t26 after several cycles of those operations, since Va<Vsig, N-channel transistor M4 becomes conductive, and current In flows from the video signal line 27 to GND. At that time, the change in potential $_\sim$Vn in the period T is expressed as $_\sim$Vn=In×T/Csig.

In the period after the time t26, which is the video output period, Vsig continues to change near Va within the width of $_\sim$Vp and $_\sim$Vn. And, the error voltage Verr of the video signal line potential Vsig finally made becomes Verr=*$_\sim$Vp −$_\sim$Vn*/T. $_\sim$Vp depends on the property of the transistor M5, and $_\sim$Vn depends on the property of the transistor Mr. However, by setting the frequency of CLK sufficiently high, Verr can be reduced to a negligible level.

As explained above, the signal output portion of the video signal line driving circuit according to the invention can cancel fluctuations in operating point voltage of the inverter used for comparison between the output voltage of DAC 10A through 10C and the voltage of the video signal line 27 by using the electrostatic capacitor C3. Additionally, by setting the frequency of the control signal CLK sufficiently high, fluctuations in property of TFT for direct supply of a current to the video signal line 27 can be reduced as well. As a result, uniform and excellent images with less unevenness can be presented.

Although FIG. 16 shows the example in which the time step t1 to t10 during DA conversion and the time step t11 to t27 during signal output operation are approximately equal, the invention is not limited to it. The time step during DA conversion and the time step during signal output operation may be different from each other.

Next explained is a video signal output circuit 50 more suitable for use in the video signal driving circuit according to the invention.

Figure 17:
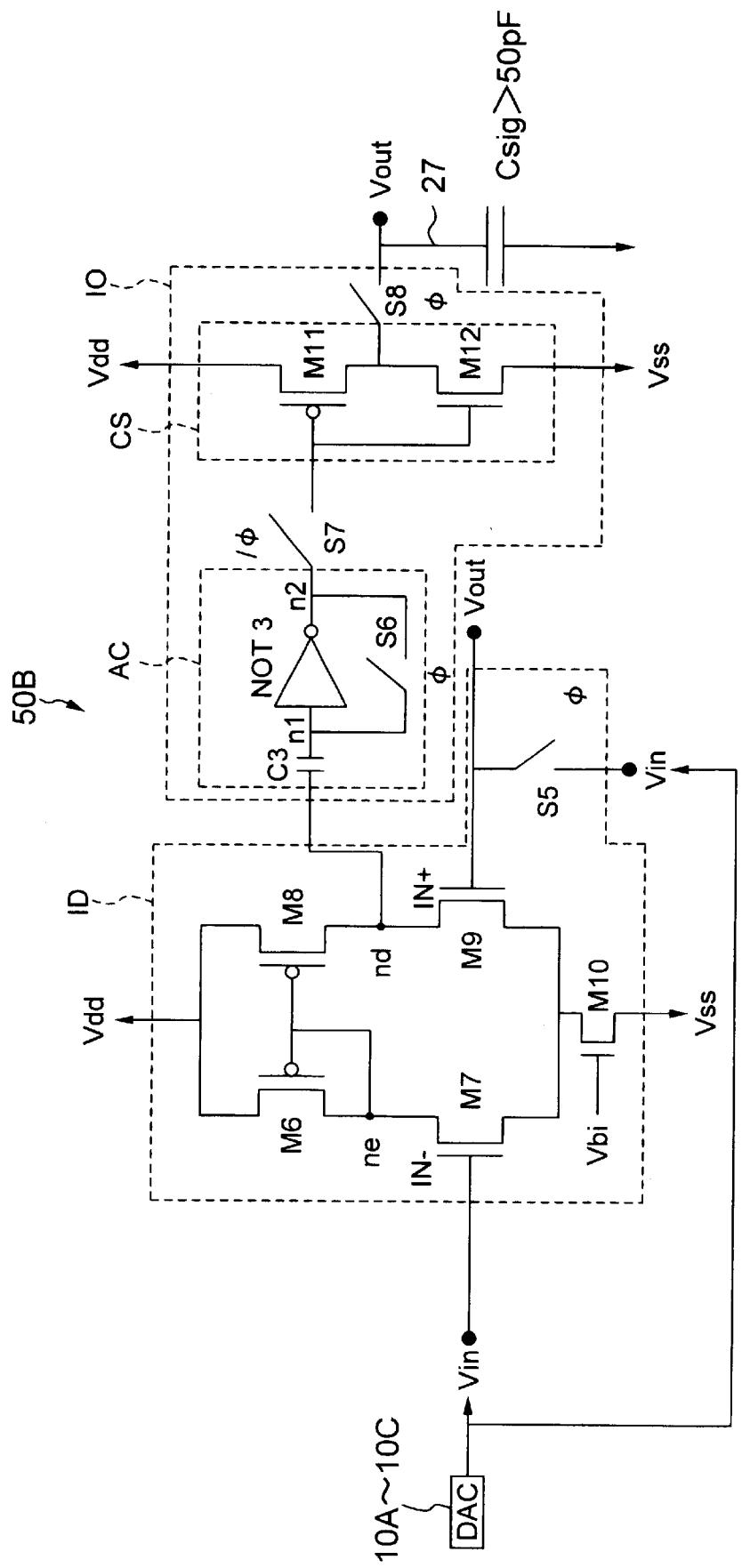
FIG. 17 is a circuit diagram showing a rough structure of a video signal output circuit 50B suitable for use in the present invention.

FIG. 17 is a circuit diagram showing a rough structure of a video signal output circuit 50B suitable for use in the present invention.

The output circuit (amplifier circuit) 50B according to the present modification also enables realization of a small-scaled output amplifier with high accuracy, freer from fluctuations in property of TFT.

More specifically, the output circuit 50B includes an input comparing circuit ID made up of transistors M6 through M10, and an inverting amplifying output circuit IO made up of capacitor C3, NOT3, switches S6 through S8 and transistors M11 and M12. Output from DAC 10a through 10C is input into Vin through an analog switch. Output from the output circuit 50B is output from the output end Vout to the signal line 27.

In the output circuit 50B, DAC 10A through 10C are connected to the signal line 27 via the switch S5, potential of the signal line 27 and analog video potential sampled from DAC are compared by the input comparing circuit ID, and when both potentials coincide, the switch S6 is turned OFF.

Figure 18:
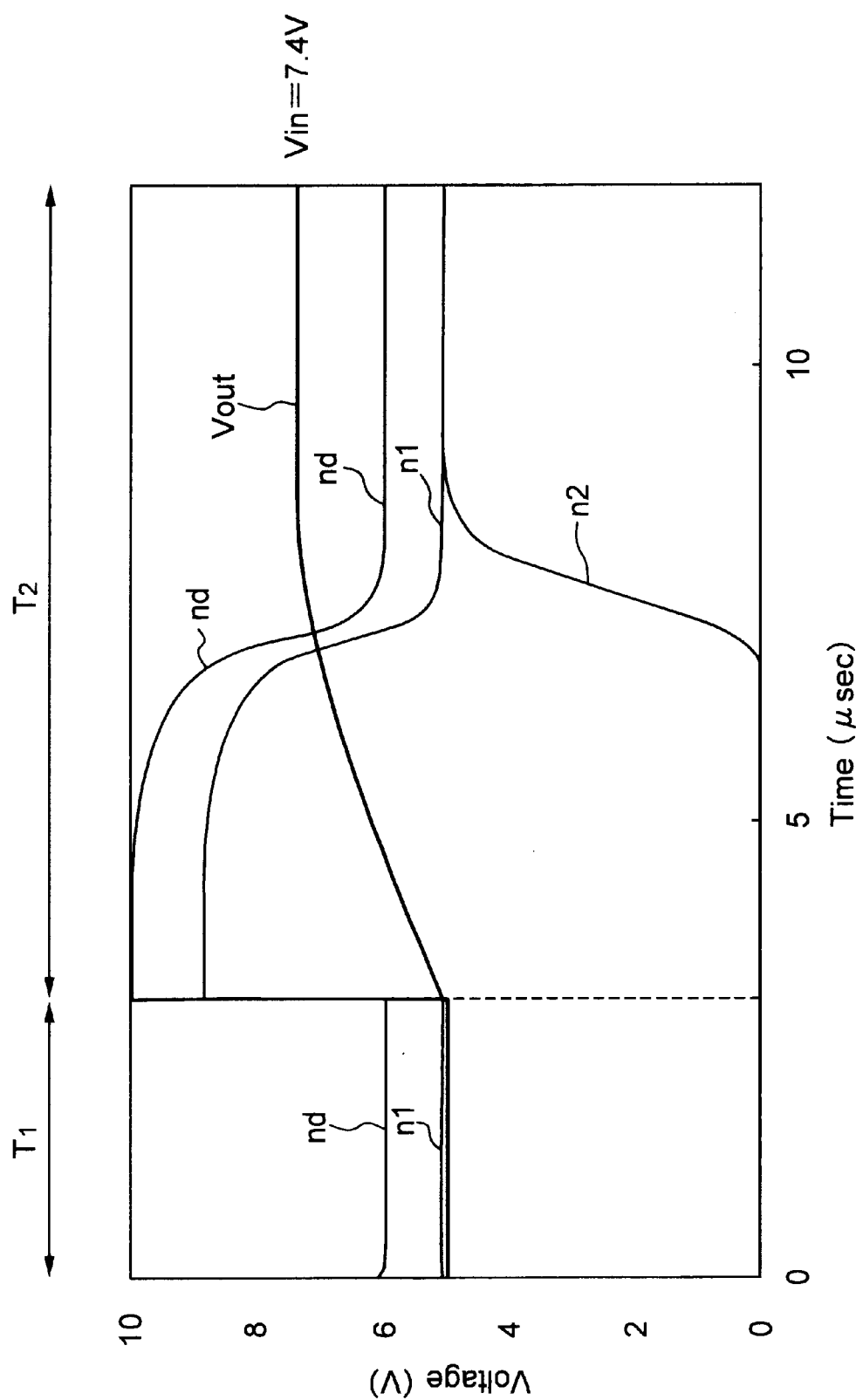
FIG. 18 is a timing chart for explaining operations of the output circuit 50B.

FIG. 18 is a timing chart for explaining operations of the output circuit 50B.

The period T1 in the timing chart, switches S5, S6 and S8 are ON and the switch S7 is OFF. In this status, held at point nd is the potential Veven at which two inputs to the input comparing circuit ID, namely, IN− and IN+, are equal.

On the other hand, in the period T2, the switch S7 is ON and switches S5, S6 and S8 are OFF. In this status, there is a potential difference between two inputs, namely, IN− and IN+. As a result, potential at point nd rises to (Veven+$_\sim$V).

Responsively, IN+ rises, and when it reaches to IN+=IN− (=Vin), potential at point nd returns to Veven. Simultaneously, potential at point n1 returns to Vinv, point n2 rises to the H level, and charging of the video signal line 27 is completed.

As apparent from the above explanation, regarding the consecutive operations, there is almost no limitation caused by fluctuations in threshold value of TFT forming the circuit. For example, when two inputs (IN− and IN+) to the input comparing circuit are equal in the period T1, potential at point nd may include an error almost equal to the magnitude of the fluctuation of the threshold value of the TFT's, but it is immaterial for the circuit operations.

Further, in this modified example, the input IN− from DAC 10A through 10C is introduced into the gate of TFT in the input comparing circuit ID. Capacitance of the TFT gate is usually in the order of femtofarad (fF) whereas the accumulated capacitance C2 of DAC 10A through 10C is usually in the order of picofarad (pF).

In general, as long as the input capacitance of the output circuit is around 10% or less of the output capacitance, even if the input capacitance of the output circuit varies by about 10%, for example, due to fluctuations of the manufacturing process, the variance is limited to about 10%×0.1=1% relative to the output capacitance of DAC. This is a practically acceptable level.

In contrast, in this modified example, since the input gate capacitance of the output circuit 50 is smaller by almost 3 digits than the output capacitance of DAC 10A through 10C, reallocation of the accumulated capacitance of DAC caused by connection of the output circuit 50 can be prevented, and the "offset" of the analog output can be removed.

Additionally, capacitance of the capacitor C3 in this modified example is about 0.2 pF, and the entire area of the output circuit 50B can be reduced sufficiently to about 70×300 Φm² even when the design rule is 5 Φm.

Furthermore, depending on the operative range of the amplifier, the current source of the output may be only Vdd or Vss to simplify the structure.

When a fixed current source is used as the current source, variance of the output relative to the input voltage can be limited within a substantially constant small level (=delay time×constant current/Csig).

In the circuit shown in FIG. 17, by generating an inverted signal of the output n2 of NOT3 as n3, and inserting a resistor and a capacitor in series between n3 and Vout, oscillation can be prevented.

Furthermore, if the circuit is so designed that the input of the capacitor C3 (nd in FIG. 17) largely changes with a slight difference between two inputs (IN− and IN+) to the input comparing circuit, the output circuit 50B can be further improved in accuracy and output power. For this purpose, an amplifier circuit, not shown, may be additionally provided between nd and C3.

Still in FIG. 17, by exchanging IN− and IN+, capacitor C3 may be connected to ne.

One of features of the output circuit 50B shown in FIG. 17 lies in:
(1) input signals (IN− and IN+) are input to the gate of TFT in the input comparing circuit ID; and
(2) the output signal from the input comparing circuit ID is definitely related to the input signal, or in other words, a single output signal exists in response to a certain input signal.

The input comparing circuit ID having these features is not limited to the example shown in FIG. 17.

Figure 19:
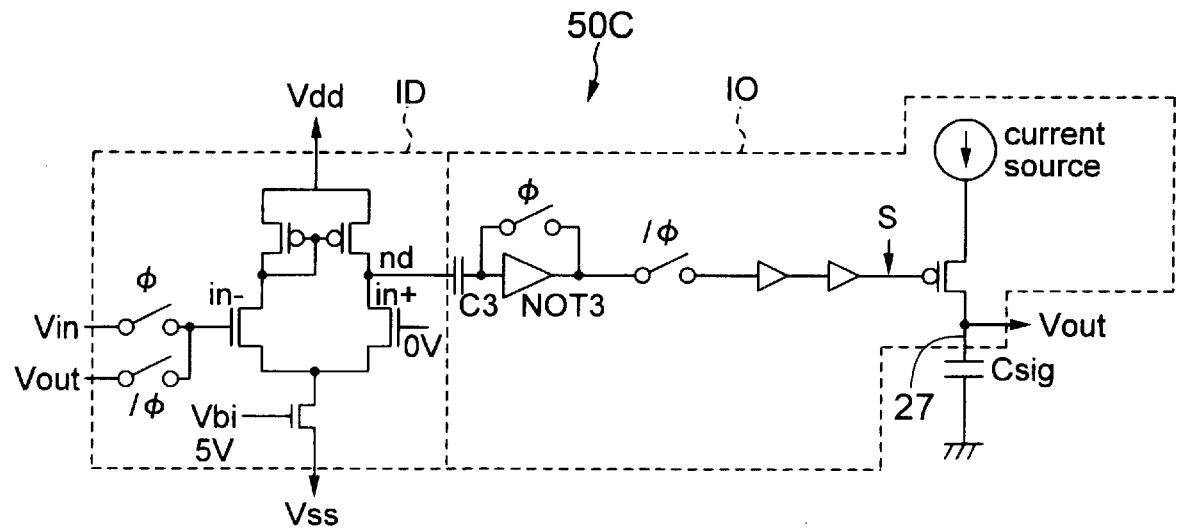
FIG. 19 is a rough circuit diagram showing a modified example of the output circuit 50B.

FIG. 19 is a rough circuit diagram showing a modified example of the output circuit 50B. Here again, the same elements as those already explained with reference to FIGS. 1 through 18 are labeled with common reference numerals, and their detailed explanation is omitted.

In the output circuit (amplifier circuit) 50C of FIG. 19, the input comparing circuit ID is the same as that shown in FIG. 17, and has the structure of a so-called "emitter (source) coupled" amplifier. However, it is different in mode of inputting signals. Regarding its operations, the group of switches generically labeled with the reference ∴ and the group of switches generically labeled with the reference ∴ are alternately turned ON and OFF.

Under the condition where the switches generically labeled with ∴ are ON, signal Vin from DAC, not shown, is input to IN−. At the same time, potential of the operating threshold value of the inverter forming NOT3 is held at opposite ends of the capacitor C3.

After that, the switches generically labeled with ∴ are turned ON. At that time, if Vout<Vin, nd comes down. Then, the node S becomes the L level, and writing of a current into the signal line 27, i.e. equivalent capacitor Csig, is executed. When the potential of the signal line capacitor Csig reaches Vout=Vin or higher, the node S becomes the H level, and rising of the potential of Csig stops.

Also in the output circuit 50C shown in FIG. 19, since the input signal is introduced into the gate of TFT of the input comparing circuit ID, reallocation of the secondary-side capacitance of DAC can be prevented as already explained with reference to FIG. 17.

Additionally, in the input comparing circuit ID of the output circuit 50C, output nd is definitely related to the input potential IN−.

Figure 20:
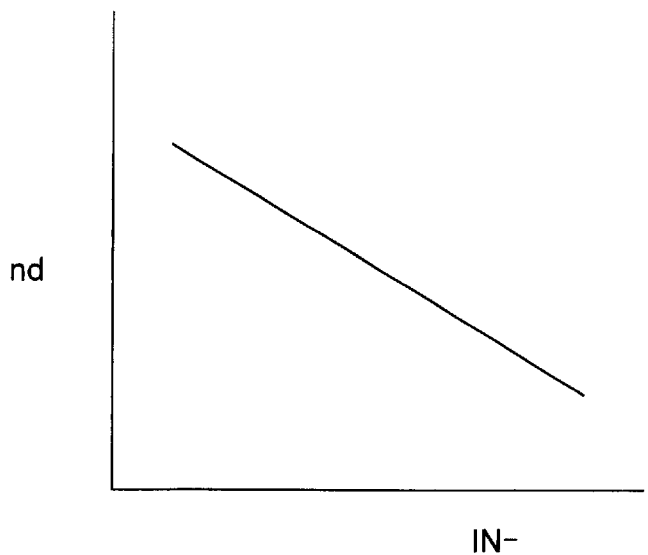
FIG. 20 is a graph showing relations between the input potential IN– and the output nd of an input comparing circuit ID.

FIG. 20 is a graph showing relations between the input potential IN− and the output nd of the input comparing circuit ID. As shown here, since the input and output are definitely related, it is possible to reliably and easily control the output property of the output circuit 50C by appropriately selecting NOT3 and Vbi.

Figure 21:
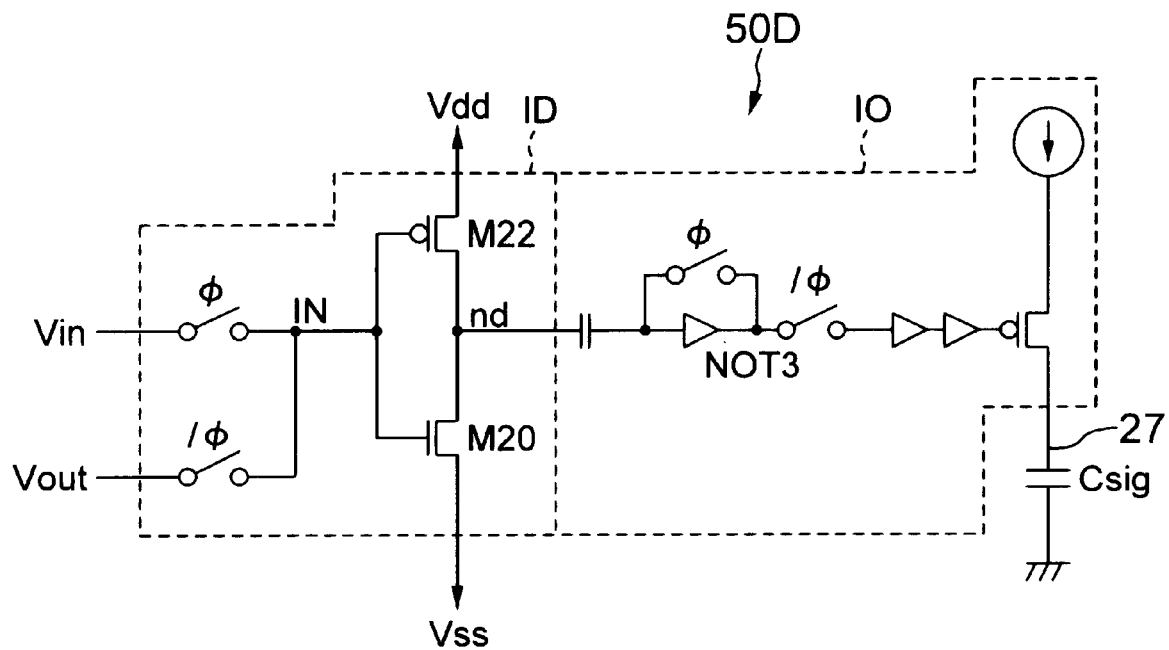
FIG. 21 is a rough circuit diagram showing the second modified example of the output circuit 50B.

FIG. 21 is a rough circuit diagram showing the second modified example of the output circuit 50B. Here again, the same elements as those already explained with reference to FIG. 1 through FIG. 20 are labeled with common reference numerals, and their detailed explanation is omitted.

In the output circuit (amplifier circuit) 50D of FIG. 21, the input comparing circuit ID has the structure of a so-called "complementary" amplifier circuit. That is, gates of an n-channel channel transistor M20 and a p-channel transistor M22 as complementary transistors are commonly connected as an input end. Therefore, as already explained with reference to FIG. 17, reallocation of the secondary-side capacitance of DAC can be prevented.

Also in the output circuit 50D, by alternately turning ON the switches labeled with ∴ and the switches labeled with ∴, video potential from DAC can be written in the signal line 27.

Figure 22:
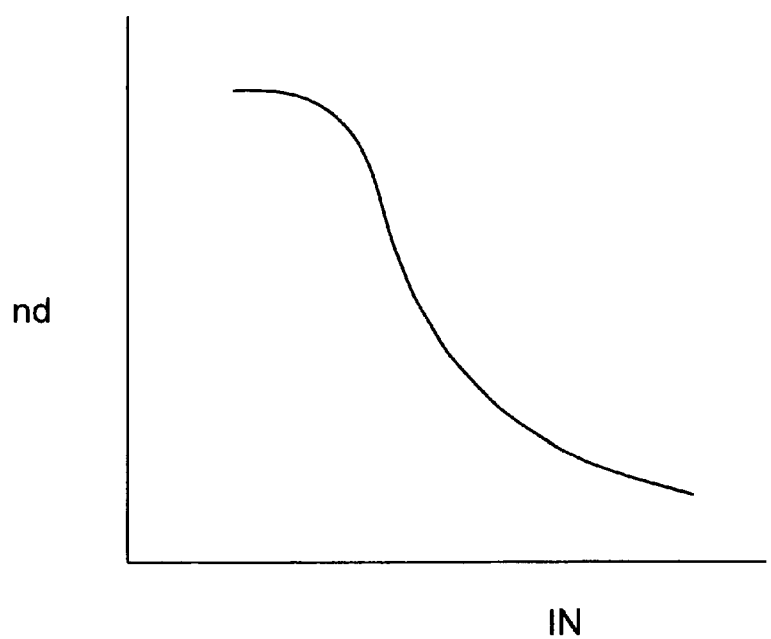
FIG. 22 is a graph showing relations between the input and the output of the input comparing circuit ID of the output circuit 50D.

FIG. 22 is a graph showing relations between the input and the output of the input comparing circuit ID of the output circuit 50D. As shown here, also in the input comparing circuit ID as "complementary" amplifiers, the output is definitely related to the input.

Therefore, by adjusting Vdd, Vss or sizes of the n-channel transistor M20 and p-channel transistor M22 like their gate widths and gate lengths, the output property of the output circuit 50D can be controlled precisely.

Figure 23A:
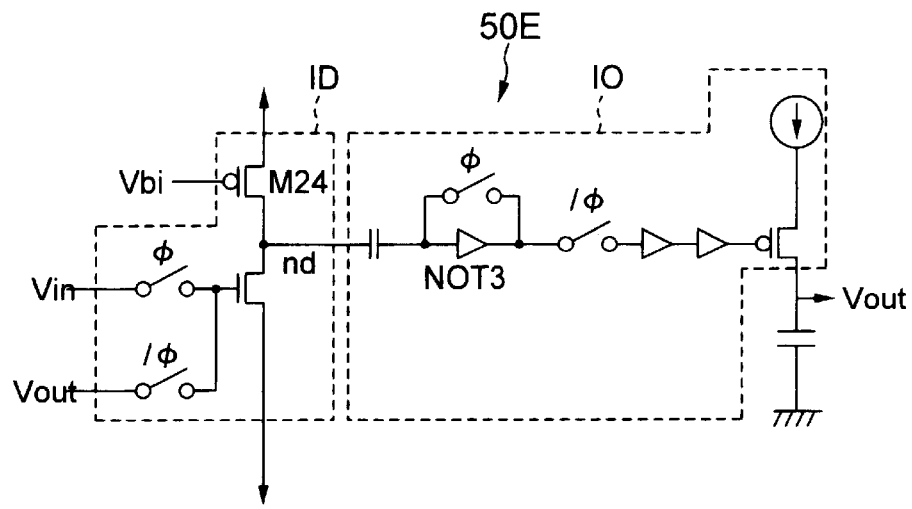
FIG. 23 is rough circuit diagrams showing the third modified examples of the output circuit 50B.
Figure 23B:
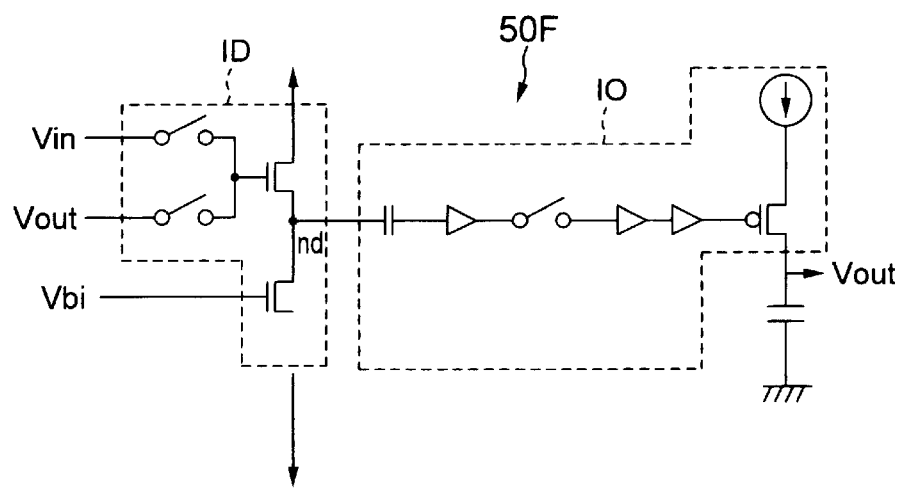
Figure 23C:
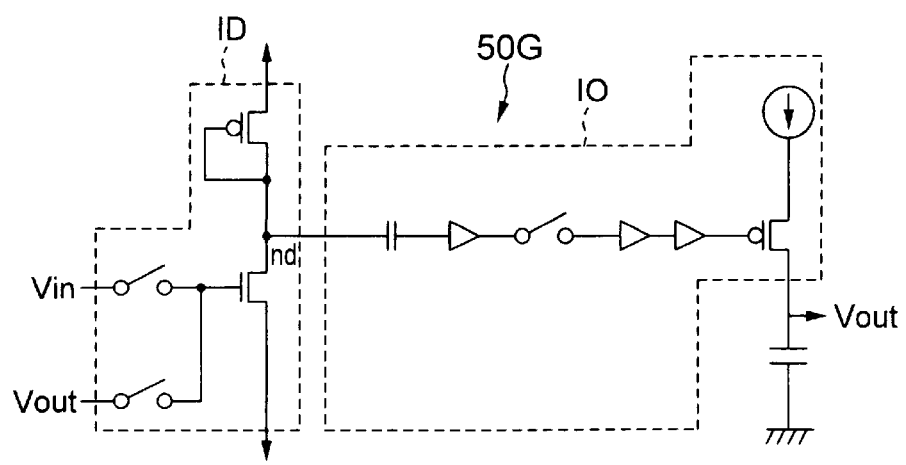

FIG. 23 is rough circuit diagrams showing the third modified examples of the output circuit 50B. Here again, the same elements as those already explained with reference to FIG. 1 through FIG. 21 are labeled with common reference numerals, and their detailed explanation is omitted.

The output circuits (amplifier circuits) 50E through 50G shown in FIG. 23 have the structure of a typical amplifier circuit in which a load and a driving transistor are serially connected as the input comparing circuit ID. That is, the transistor (labeled with M24 in FIG. 23(a)) introducing the voltage Vbi or nd through the gate functions as the load, and the transistor introducing Vin or Vout through the gate behaves as the driving transistor.

Also in these circuits, since the signal is input to the low-capacitance gate of the transistor, as already explained with reference to FIG. 17, reallocation of the secondary-side capacitance of DAC can be prevented. Additionally, by alternating turning ON the switches labeled with ∴ and the switches labeled with ∴, video potential from DAC can be written in the signal line 27.

Figure 24:
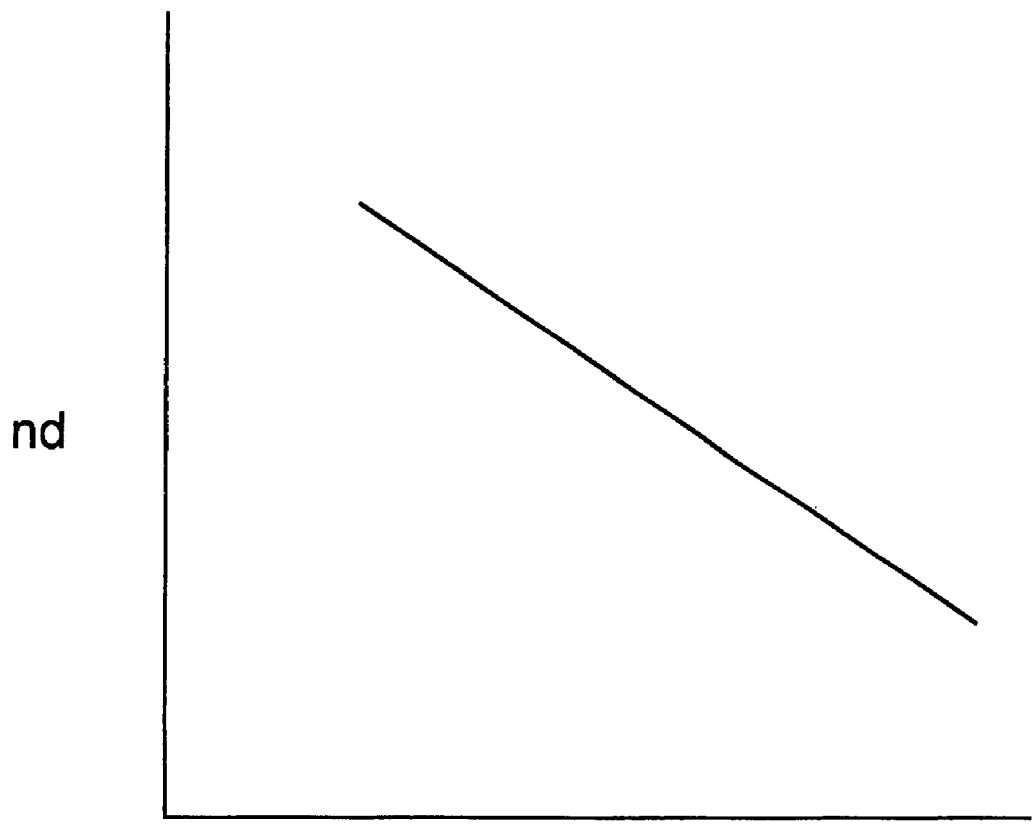
FIG. 24 is a graph showing relations between the input and the output of the input comparing circuit ID of output circuits 50E through 50G.

FIG. 24 is a graph showing relations between the input and the output of the input comparing circuit ID of output circuits 50E through 50G. As shown here, also in these input comparing circuits ID, since the output is definitely related to the input, by adjusting Vbi, sizes of transistors, and so on, output properties of the output circuits 50E through 50G can be controlled precisely.

Figure 25:
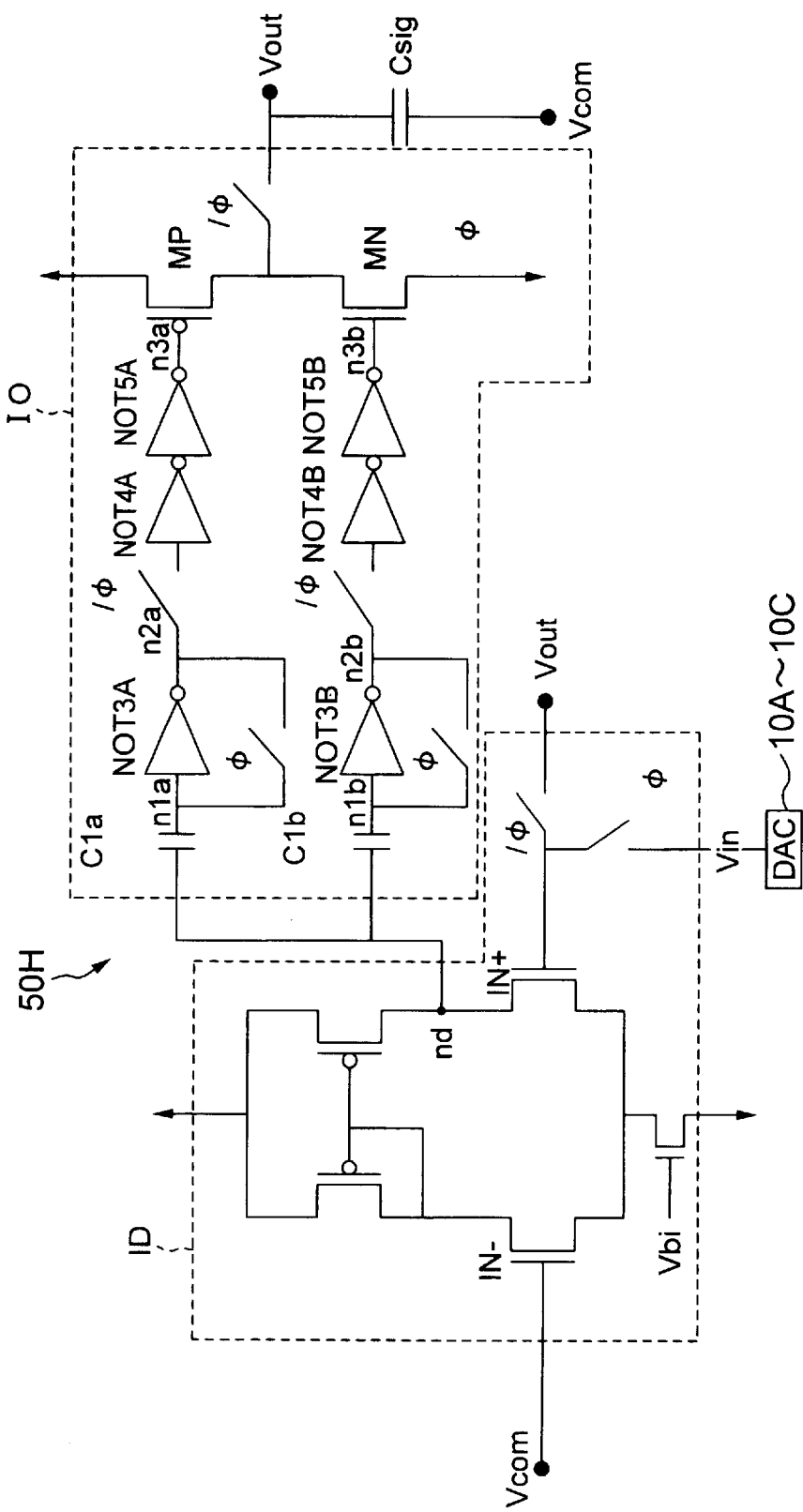
FIG. 25 is a rough circuit diagram showing the fourth modified example of the output circuit 50B.

FIG. 25 is a rough circuit diagram showing the fourth modified example of the output circuit 50B. Here again, the same elements as those already explained with reference to FIG. 1 through FIG. 23 are labeled with common reference numerals, and their detailed explanation is omitted.

In the output circuit (amplifier circuit) 50H of FIG. 25, the input comparing circuit ID has the structure of an "emitter (source) coupled" amplifier similar to those of FIG. 17 and FIG. 19. In this modified example, however, two routes of inverting amplifier circuits are provided.

Operations of the output circuit 50H are explained below.

First in the sampling period, the switches generically labeled with ∴ are ON, and the other switches are OFF. In this status, held at nd is a potential Vinit appearing when inputs to the input comparing circuit ID are IN−=Vcom and IN+=Vin (i.e., output of DAC). At n1a and n1b, circuit threshold values Vinv of inverters NOT3A and NOT3B forming the inverting amplifier circuit are held, respectively.

Next, in the period for writing into a signal line, the switches generically labeled with ⋅ are ON, and the other switches are OFF. Assuming here that Vout<Vin, explanation is continued. Since IN+=Vout (=signal line potential), nd becomes (Vinit+₋V), and n1 also becomes (Vinv+₋V). Then, n2A lowers, n3A becomes the L level, and the transistor MO turns ON. As a result, the signal line 27 is charged by Vdd, Csig potential (i.e. Vout) approaches Vdd, and ₋V gradually decreases to zero.

At ₋V=0, n1A returns to Vinv, n3A becomes the H level, and the transistor MP turns OFF, thereby to maintain the signal line potential.

On the other hand, in case of Vout>Vin, since C1B, n1B and n3B operate similarly, Vsig is discharged toward Vss, and after it reaches a desired potential, the signal line potential is maintained.

In this modified example, it is only in the sampling period that the output circuit 50H refers to the DAC output. In the signal line writing period, DAC can conduct DA conversion of the signal potential of the next row in parallel. Also in this modified example, the input capacitance of the output circuit is small, and stable sampling output free from the property of TFT is possible.

Figure 26:
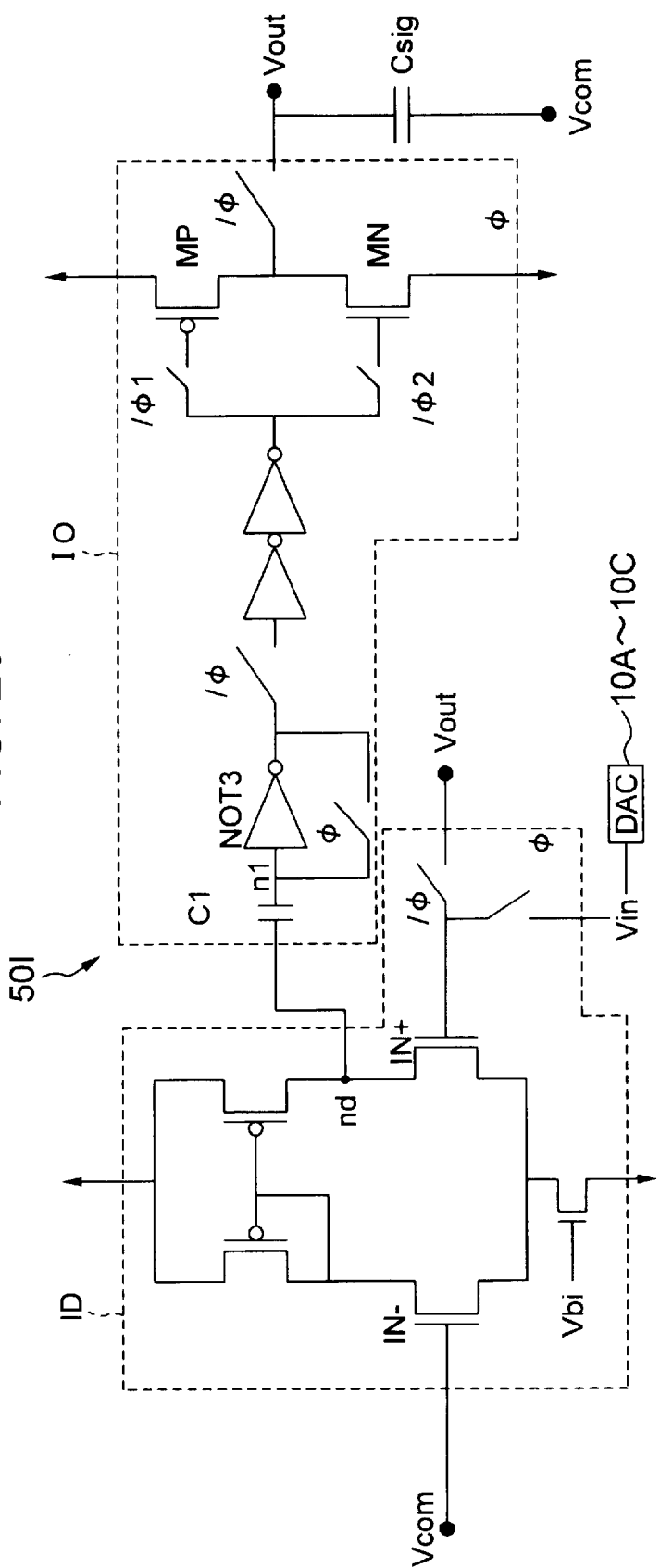
FIG. 26 is a rough circuit diagram showing the fifth modified example of the output circuit 50B.

FIG. 26 is a rough circuit diagram showing the fifth modified example of the output circuit 50B. Here again, the same elements as those already explained with reference to FIGS. 1 through 25 are labeled with common reference numerals, and their detailed explanation is omitted.

Also in the output circuit (amplifier circuit) 50I of FIG. 26, the input comparing circuit ID has the structure of an "emitter (source) coupled" amplifier similar to those of FIG. 17, FIG. 19 and FIG. 25. This modified example, however, has one route of inverting amplifier circuit, a switch ⋅ is connected to an output transistor MP, and a switch ⋅2 is connected to an output transistor MN.

Operations of the output circuit 50I are explained below.

First in the sampling period, switches generically labeled with ∴ are ON and the other switches are OFF. In this status, held at nd is the potential Vint appearing when inputs of the input comparing circuit ID are IN−=Vcom and IN+=Vin (i.e. output of DAC). At n1, the circuit threshold value Vinv of the inverter NOT3 forming the inverting amplifier circuit is held.

Next, in the period for writing into the first signal line, switches generically labeled ⋅ and the switch ⋅1 are ON, and the switches ∴ and ⋅2 are OFF. In this status, only when Vout<Vin, the signal line capacitor Csig is charged by Vss up to the level satisfying Vout=Vin. When Vout>Vin, charging is not conducted.

In the period of writing into the second signal line, switches generically labeled ⋅ and the switch ⋅2 are ON, and switches ∴ and ⋅1 are OFF. In this status, only when Vout>Vin, the signal line capacitor Csig is charged by Vss up to the level establishing Vout=Vin. When Vout<Vin, charging is not conducted.

Also in this modified example, it is only in the sampling period that the output circuit 50I refers to the DAC output. In the signal line writing period, DAC can executed DA conversion of the signal potential of the next row in parallel. Also in this modified example, the input capacitance of the output circuit is small, and stable sampling output free from the property of TFT is possible. That is, using a less number of sampling latches and digital latches, the example shown here can realize a signal line driving circuit which amplifies the DAC output with high accuracy and writes it into a signal line.

Although the examples shown in FIGS. 25 and 26 employ so-called N−TOP type differential amplification stages, they may use P=TOP type differential amplification stages depending on their output voltage ranges.

The above-explained output circuits 50A through 50I are configured to execute sampling comparison between the signal line potential and DAC potential and then charge the signal line.

However, the driving circuit according to the invention may use another type of output circuit for charging signal lines in an analog mode instead of those output circuits.

Figure 27:
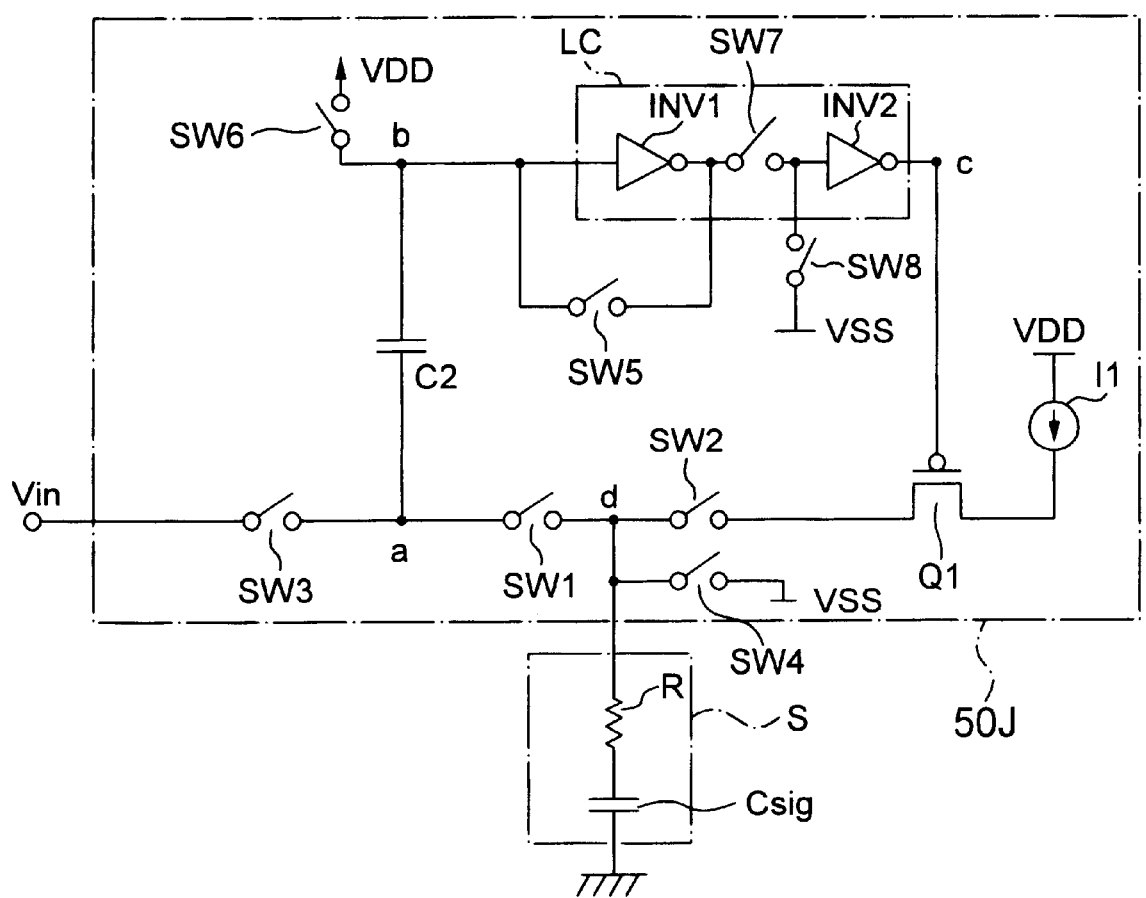
FIG. 27 is a circuit diagram showing a negative-polarity output circuit 50J which can be used in the present invention.

FIG. 27 is a circuit diagram showing a negative-polarity output circuit 50J which can be used in the present invention. The output circuit (amplifier circuit) 50J includes switches SW1 through SW8, inverters INV1, INV2, and transistor Q1. Additionally, a capacitor C2 can be commonly used with the secondary-side capacitor of DAC as explained later.

One end of the switch SW6 is connected to the other end of the capacitor C2, and the other end of the switch SW6 is connected to a voltage Vdd (for example, 10 V). One end of the switch SW5 is connected to the input terminal of the front-end inverter INV1, and the other end of the switch SW5 is connected to the output terminal of the front-stage inverter INV1. One end of the switch SW7 is connected to the output terminal of the front-stage inverter INV1, and the other end of the switch SW7 is connected to the input terminal of the rear-stage inverter INV2. One end of the switch SW8 is connected to the input terminal of the rear-stage inverter INV2, and the other end of the switch SW8 is connected to a voltage VSS (for example, 0 V).

Then, the capacitor C2 forms a differential voltage holding circuit. A voltage source of the voltage VDD and a constant current circuit I1 form a voltage change circuit for changing the voltage of the signal line 27 by a constant ratio. The switch SW forms an input voltage setting circuit, and the feedback loop of the switch SW5 makes up a threshold voltage setting circuit.

Figure 28:
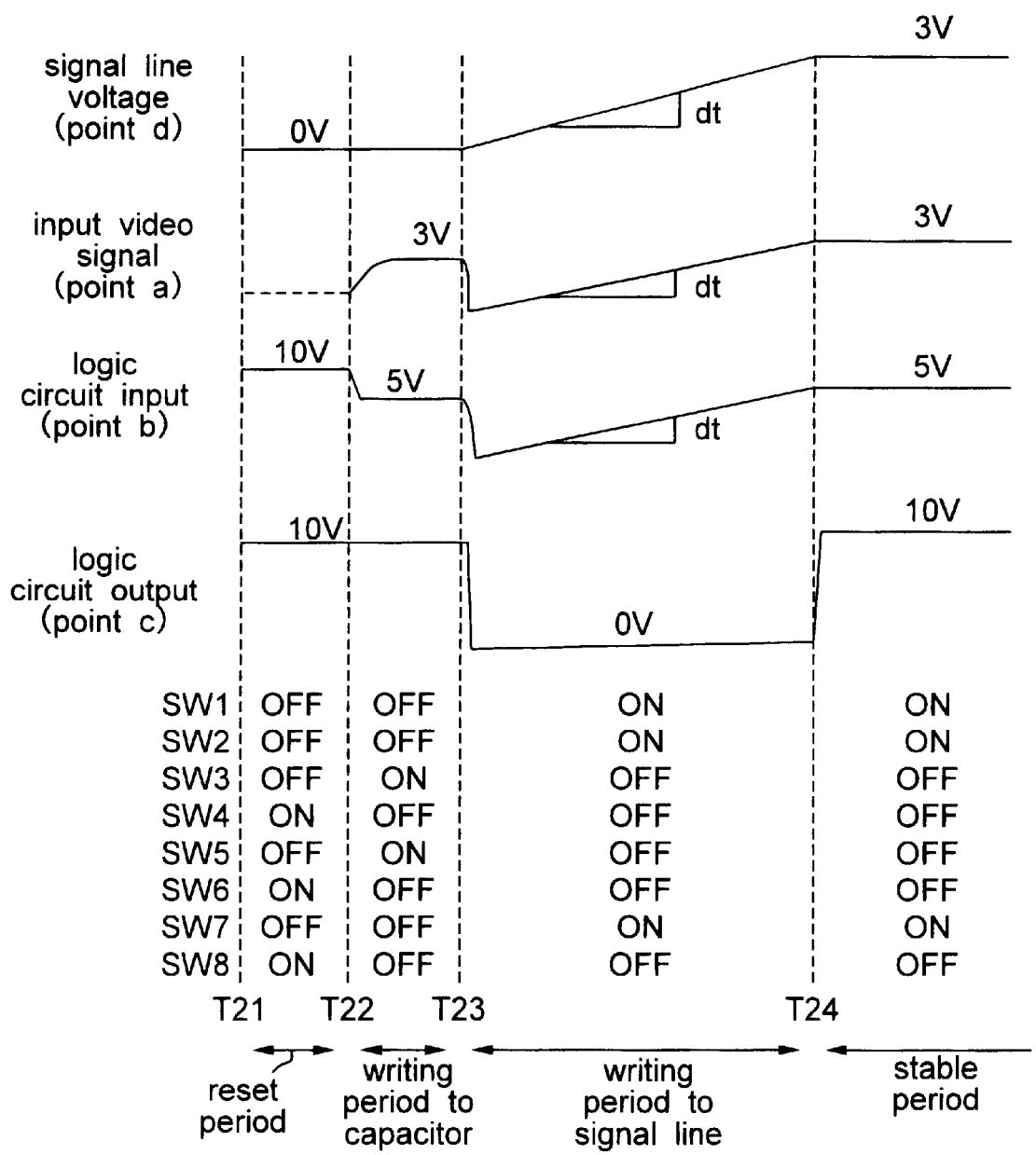
FIG. 28 is a timing chart of different portions in the output circuit 50J of FIG. 27.

FIG. 28 is a timing chart of different portions in the output circuit 50J of FIG. 27. Referring to the timing chart, operations of the output circuit 50J are explained below.

First within the period from time T21 to T22 (reset period), switches SW4, SW6 and SW8 are turned ON, and switches SW1 through SW3, SW5 and SW7 are turned OFF. As a result, voltage of the signal line 27 (point d in FIG. 26) becomes equal to the voltage VSS (for example, 0V). Similarly, voltage of the input terminal of the front-stage inverter INV1 becomes equal to the voltage VDD (for example, 10V), and voltage of the input terminal of the rear-stage inverter INV2 becomes equal to the voltage VSS (for example, 0V). The reason why the voltage of the input terminal of the front-stage inverter INV1 is set to the voltage VDD and the voltage of the input terminal of the rear-stage inverter INV2 to the voltage VSS lies in preventing a through current from flowing into the CMOS transistors forming the front-stage inverter and the rear-stage inverter. That is, the flow of a through current is prevented by setting and holding one of the p-type MOS transistor and the n-type MOS transistor forming the CMOS transistor sufficiently OFF. In this manner, power consumption in the out put circuit 50J can be reduced. Therefore, voltages applied to the input terminal of the front-stage inverter INV1 and the input terminal of the rear-stage inverter INV2 may be either the voltage VDD (for example, 10V) or the voltage VSS (for example, 0V).

Next, within the period from time T22 to T23 (period for writing into the secondary-side capacitor C2), switches SW3 and SW5 are turned ON, and switches SW1, SW2, SW4 and SW6 to SW8 are turned OFF. As a result, the voltage at point a becomes approximately equal to the voltage of the input video signal Vin. In the example of FIG. 27, the voltage of the input video signal Vin is 3 V. However, since the switch SW1 is OFF, voltage of the signal line 27 maintains 0 V.

Further, since the switch SW5 is ON, voltage at point b is set substantially equal to the threshold voltage of the front-stage inverter INV1 (in this case, 5 V). That is, by feeding the output oft he front-stage inverter INV1 back to its input, the voltage at the input terminal and the output terminal of the front-stage inverter INV1 is set to a voltage approximately equal to the threshold voltage of the front-stage inverter INV1. Therefore, held in the capacitor C2 is a difference voltage (for example, 2V) of the voltage of the input video signal Vin (for example, 3V) and the threshold voltage of the front-stage inverter INV1 (for example, 5V).

In the next period after time T23 (writing period and stabilizing period), switches SW1, SW2 and SW7 are set ON, and switches SW3 to SW6 and SW8 are set OFF. At time T3, point a is 3V but point d is 0v. Therefore, when the switch SW1 turns ON, the voltage at point a lowers due to the affection. Since the capacitor C2 maintains the above-mentioned differential voltage (2V), the voltage at point b on the opposite side of the capacitor C2 also decreases following to the voltage at point a, and output of the logic circuit LC is inverted to the low level (for example, 0V). As a result, transistor Q1 turns ON, and a constant current is supplied from the constant current circuit I1 to the signal line 27 via the transistor Q1 and the switch SW2. Therefore, voltage of the signal line 27 (point d) rises with a constant gradient dt.

In response to the rise of the voltage of the signal line 27 with the constant gradient dt, voltages at point a and point b also rise with the constant gradient dt. Eventually, at time T4, the voltage of the signal line 27 becomes 3V equal to the voltage of the input video signal Vin, and the voltage at point a also becomes equal to 3V. Since the capacitor C2 maintains the differential voltage (2V), the voltage at point b in FIG. 26 becomes 5V which is the threshold voltage of the front-stage inverter INV1. Therefore, output of the logic circuit LC is again inverted to the high level (for example, 10V). As a result, transistor Q1 turns OFF, and the supply of a current, i.e. the supply of the voltage, from the constant current circuit I1 to the signal line 27 is cut. Through these operations, the signal line 27 is set at 3V substantially equal to the voltage of the input video signal Vin.

Next explained is an example modified from the output circuit 50J for the positive polarity.

Figure 29:
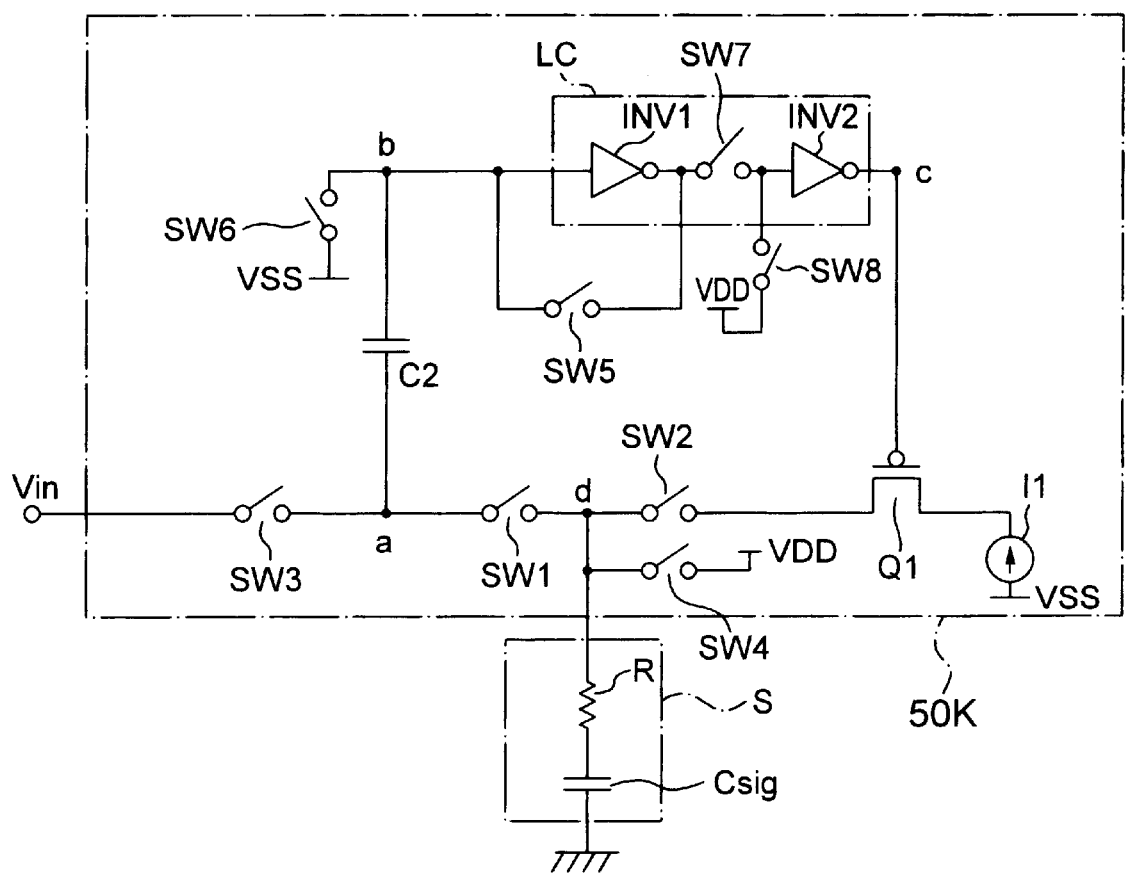
FIG. 29 is a circuit diagram showing the detailed structure of a positive-polarity output circuit 50K.

FIG. 29 is a circuit diagram showing the detailed structure of a positive-polarity output circuit 50K. As shown here, the positive-polarity output circuit (amplifier circuit) 50K is different from the negative-polarity output circuit 50J of FIG. 27 in that the transistor Q1 is n-type and the constant current circuit I1 is connected to the voltage VSS. In the other respects, it is the same as the negative-polarity output circuit 50J already explained, and its detailed explanation is omitted.

As explained above, also with the output circuits 50J and 50K explained with reference to FIGS. 27 through 29, the signal line 27 can be set approximately equal to the voltage of the input video signal Vin.

Additionally, since the input video signal Vin is supplied to the signal line 27 after making the capacitor C2 to hold the differential voltage between the threshold voltage of the front-stage inverter INV1 and the voltage of the input video signal Vin, even when the threshold voltage of the front-stage inverter INV1 varies, influences therefrom to the voltage of the signal line 27 can be prevented.

Moreover, according to the output circuits 50J and 50K, since the voltage VDD is supplied to the signal line 27 via the constant current circuit I1, regardless of the voltage of the voltage of the input video signal Vin or the voltage of the signal line 27, the voltage of the signal line S can be raised with a constant gradient dt. Therefore, linearity of the output circuit 50J and 50K is ensured, and so-called writing errors can be prevented.

Furthermore, according to the output circuits 50J, 50K, when the differential voltage to be held in the capacitor C2 is set in the capacitor C2, the threshold voltage of the front-stage inverter INV1 and the voltage of the input video signal Vin are sampled in the same cycle. Therefore, as compared with the case using different cycles for setting these voltages, setting of more accurate differential voltage is ensured.

Usable as the switches shown in this example are transfer gates or analog switches. Further, although this example as been explained as forming the logic circuit LC by serially connecting two stages of inverters which invert and amplify input-signals, no particular limitation is imposed to the internal structure of the logic circuit LC as long as it is made up of a combination of transistors.

Next explained is still another output circuit usable in the driving circuit according to the invention.

Figure 30:
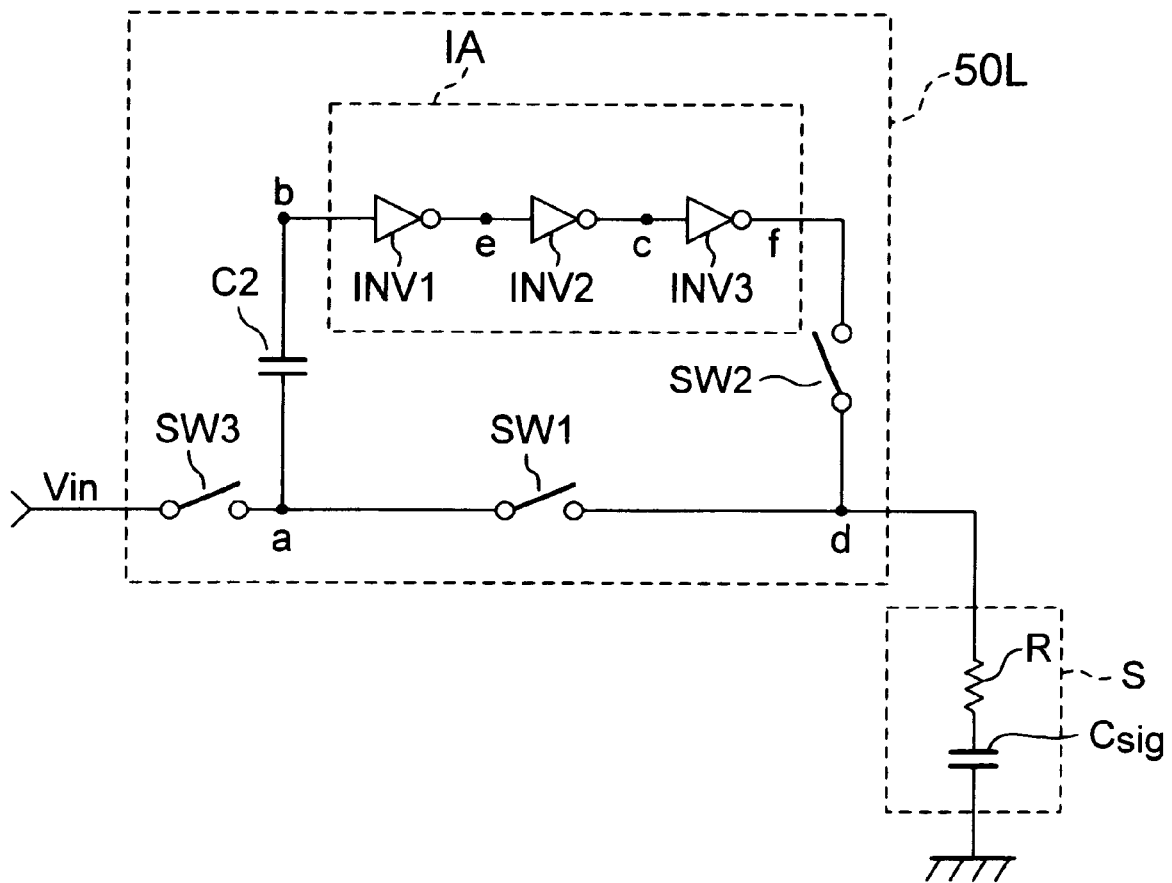
FIG. 30 is a circuit diagram of an output circuit 50L.

FIG. 30 is a circuit diagram of an output circuit 50L. The output circuit (amplifier circuit) 50L is configured to be able to adjust the voltage of the signal line to a desired voltage even under variance in threshold voltage of each inverter by previously setting the voltage of the input terminal of each inverter in the inverting amplifier circuit for controlling the voltage of the signal line substantially equal to the threshold voltage of each inverter.

More specifically, each output circuit 50L includes switches SW1 to SW3, an inverting amplifier circuit IA made up of a front-stage inverter INV1, middle-stage inverter INV2 and rear-stage inverter INV3, and a capacitor C2, as shown in FIG. 30. Connected to the signal line 27 driven by the output circuit 50L are image displaying TFT, liquid crystal capacitor, supplemental capacitor, and so forth. For simplicity, the load of the signal line 27 is equivalently expressed by a resistor R and a capacitor Csig.

One end of the switch SW1 is connected to the signal line 27, and the other end of the switch SW1 is connected to one end of the switch SW3 and one end of the capacitor C2. The other end of the switch SW3 is connected to the input terminal of the input video signal vin output from DAC. The other end of the capacitor C2 is connected to the input terminal of the inverting amplifier circuit IA. The output terminal of the inverting amplifier circuit IA is connected to one end of the switch SW2. The other end of the switch SW2 is connected to the signal line 27.

The inverting amplifier circuit IA is made by serially connecting the front-stage inverter INV1, middle-stage inverter INV2 and rear-stage inverter INV3. Switches SW1 to SW3 are controlled in switching action by a switch changeover control circuit, not shown.

The inverting amplifier circuit IA makes up a signal line voltage control circuit, the capacitor C2 forms a first differential voltage holding circuit, and the switch. SW3 forms a first differential voltage setting circuit.

Figure 31:
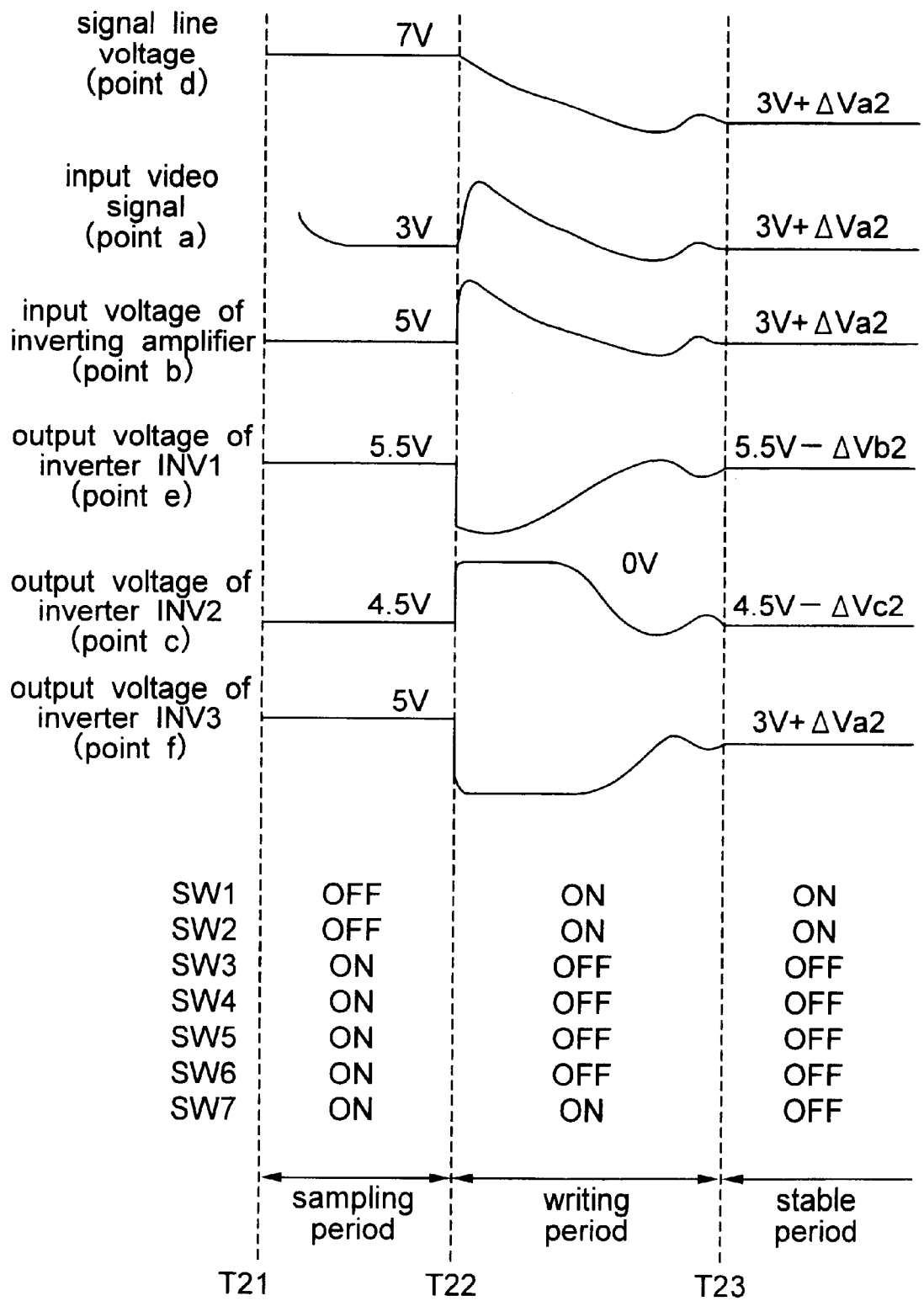
FIG. 31 is a timing chart of different portions in the output circuit 50L.

FIG. 31 is a timing chart of different portions in the output circuit 50L. Referring to the timing chart, operations of the output circuit 50L are explained below.

First in the period from time T11 to T12 (sampling period), switch SW3 is set ON, and the other switches SW1, SW2 are set OFF. As a result, voltage at point a becomes approximately equal to the voltage of the input video signal Vin. In the example of FIG. 31, the voltage of the input video signal Vin is 3V. However, since the switch SW1 is OFF, the voltage of the signal line 27 (point d) maintains the voltage supplied before time T11. In the example of FIG. 31, 7V is maintained.

Assuming here that, as already explained, threshold voltage of the front-stage inverter INV1 is 5.5V, threshold voltage of the middle-stage inverter INV2 is 4.5V, and threshold voltage of the rear-end inverter INV3 is 5V, the voltage of the input terminal of the front-stage inverter INV1 is set to 5.5V, the voltage of the input terminal of the middle-stage inverter INV2 to 4.5V, and the voltage of the input terminal of the rear-stage inverter INV3 to 5V, by appropriate means. That is, input voltages of the input terminals of the inverters INV1 through INV3 are set substantially equal to threshold voltages of the inverters INV1 through INV3. Means for setting the voltages of the input terminals of these inverters INV1 through INV3 in this manner will be explained later.

By setting the input terminals of the inverters INV1 through INV3 approximately equal to their threshold voltages, the rate of amplification by the inverting amplifier circuit IA can be increased close to the maximum value. The rate of amplification by the inverting amplifier circuit IA pertains to the ratio of the changing amount of the output voltage relative to the changing amount of the input voltage of the inverting amplifier circuit IA. That is, as a result of this setting, the voltage of the output terminal of the inverting amplifier circuit IA inverts and largely changes even with a small- change in voltage of the input terminal of the inverting amplifier circuit IA.

As explained above, the voltage at point a of FIG. 30 exhibits 3V which is the voltage of the input video signal Vin, and the voltage at point b is 5.5V equally to the voltage at point e. therefore, in the period from time T11 to T12 (sampling period), the differential voltage (for example, 2.5V) between the voltage of the input video signal Vin (for example, 3V) and the threshold voltage of the front-stage inverter INV1 (for example, 5.5V) is set.

In the next period from time T12 (writing period, stabilizing period), switches SW1 and SW2 are set ON, and the other switch SW3 is set OFF. At time T12, point a of FIG. 29 is 3V whereas point d is 7V. Therefore, shown the switch. SW1 turns ON, the voltage at point a rises following the voltage at point d. Since the capacitor C2 holds the above-mentioned differential voltage (2.5V), the voltage at point b on the other side of the capacitor C2 also rises following the voltage at point a.

When the voltage at point b rises, logic output from the front-stage inverter INV1 is going to become the low level (for example, 0V), logic output from the middle-stage inverter INV2 is going to become the high level (for example, 10V), and logic output from the rear-stage inverter INV3 is going to become the low level (for example, 0V). That is, when the voltage at point b rises, logic output from the inverting amplifier circuit IA inverts is going to invert and becomes the low level (for example, 0V). As a result, voltage of the signal line 27 also decreases. In response to the decrease of the voltage of the signal line, voltages at point a and point b also decrease.

When the voltage of the signal line 27 (point d) decreases naturally, the voltage of the signal line eventually becomes equal to 3V which is the voltage of the input video signal Vin, and the voltage at point a also becomes equal to 3V. Since the capacitor C2 holds the differential voltage (2.5V), voltage at point b becomes 5.5V which is the threshold voltage of the front-stage inverter INV1. Therefore, logic output of the front-stage inverter INV1 is going to invert and become the high level (for example, 10V), logic output of the middle-stage inverter INV2 is going to invert and become the low level (for example, 0V), and logic output of the rear-stage inverter INV3 is going to invert and become the high level (for example, 10V). That is, when the voltage at point b lowers below 3V, logic output of the inverting amplifier circuit IA is going to invert and become the high level (for example, 10V). As a result, voltage of the signal line 27 also rises. In response to the rise of the voltage of the signal line, voltages at point a and point b in FIG. 30 also rise. Through repetition of these phenomena, after time T13, voltage of the signal line 27 converges to be substantially equal to 3V which is the voltage of the input video signal Vin, and stabilizes there.

Actually, however, voltages at point a, point b and point f do not stabilize at full 3V, but become 3V+_Va1 offset therefrom by an offset voltage _Va1. Voltage at point b also deviates by the off set voltage _Va1 and becomes 5.5V+_Va1. Therefore, voltage at point e becomes 5.5V−_Vb1 offset by an offset voltage _Vb1. Similarly, voltage at point c deviates by the offset voltage _Vc1, and becomes 4.5V+_Vc1.

However, since voltages of the input terminals of the inverters INV1 through INV3 are set substantially equal to their threshold voltages in the period from time T11 to T12 as already explained, the amplification rate of the inverting amplifier circuit IA is remarkably large. Therefore, the offset voltage _Va1 can be reduced so much. That is, the offset voltage _Va1 can be regarded about 0V, and voltages at point d, point a and point f can be regarded equal to 3V substantially.

As explained above, according to the output circuit 50L, since the voltages of the input terminals of the front-stage inverter INV1, middle-stage inverter INV2 and rear-stage inverter INV3 constituting the inverting amplifier circuit IA are set substantially equal to their respective threshold voltages, and while the differential voltage between the voltage of the input video signal Vin and the threshold voltage of the front-stage inverter INV1 is held in the capacitor C2 the switches SW1, SW2 and inverting amplifier circuit IA make a feedback loop, voltage of the signal line 27 can be set substantially equal to the voltage of the input video signal Vin.

Figure 32:
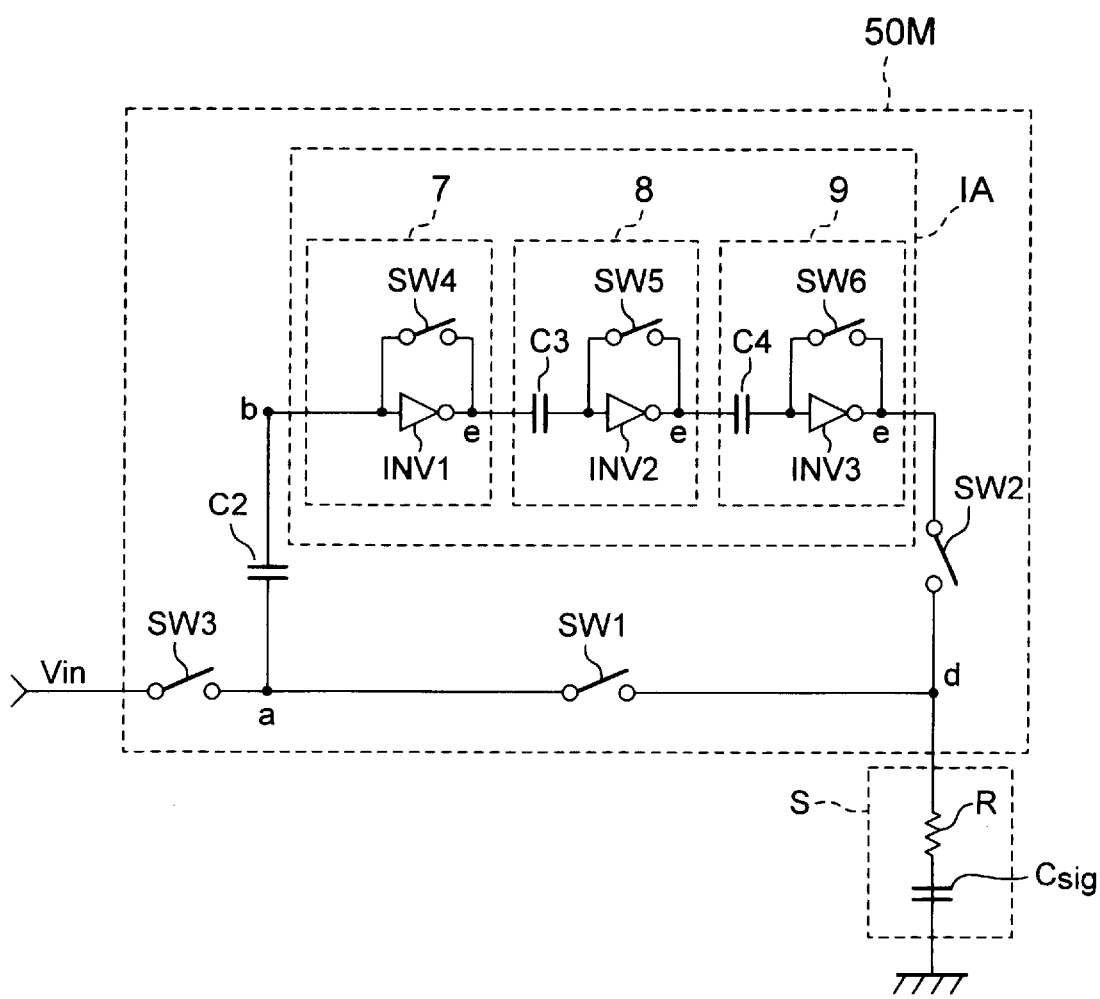
FIG. 32 is a rough circuit diagram showing a modified example of the output circuit 50L shown in FIG. 30.

FIG. 32 is a rough circuit diagram showing a modified example of the output circuit 50L shown in FIG. 30. As shown in FIG. 32, in the output circuit 50M, inverters INV1 through INV3 are short-circuited by switches SW4 through SW6, respectively, and capacitors C3 and C4 are interposed among them.

Capacitor C2 is not provided in the threshold voltage setting inverter circuit 7 located nearest to the input side, and the input terminal of the front-stage inverter INV1 is connected directly to the other end of the capacitor C2. Therefore, differential voltage between the voltage of the input video signal Vin and the threshold voltage of the front-stage inverter INV1 is held in the capacitor C2.

Then, the inverter amplifier circuit IA forms the signal line voltage control circuit according to this embodiment, capacitor C2 forms the first differential voltage holding circuit, switches SW3 and SW4 make up the first differential voltage setting circuit, capacitors C3 and C4 make up a second differential voltage holding circuit, and switches SW5 and SW6 make up a second differential voltage setting circuit.

Operations of the output circuit 50M according to this modified example are the same as the output circuit 50L already explained, and their detailed explanation is omitted.

Heretofore, output circuit 50J through 50M usable in the video signal line driving circuit according to the invention have been explained with reference to FIGS. 27 through 32.

Next explained is an interface suitable for use to connect these output circuit 50J through 50M to the serial type DAC 10A through 10C already explained.

Figure 33:
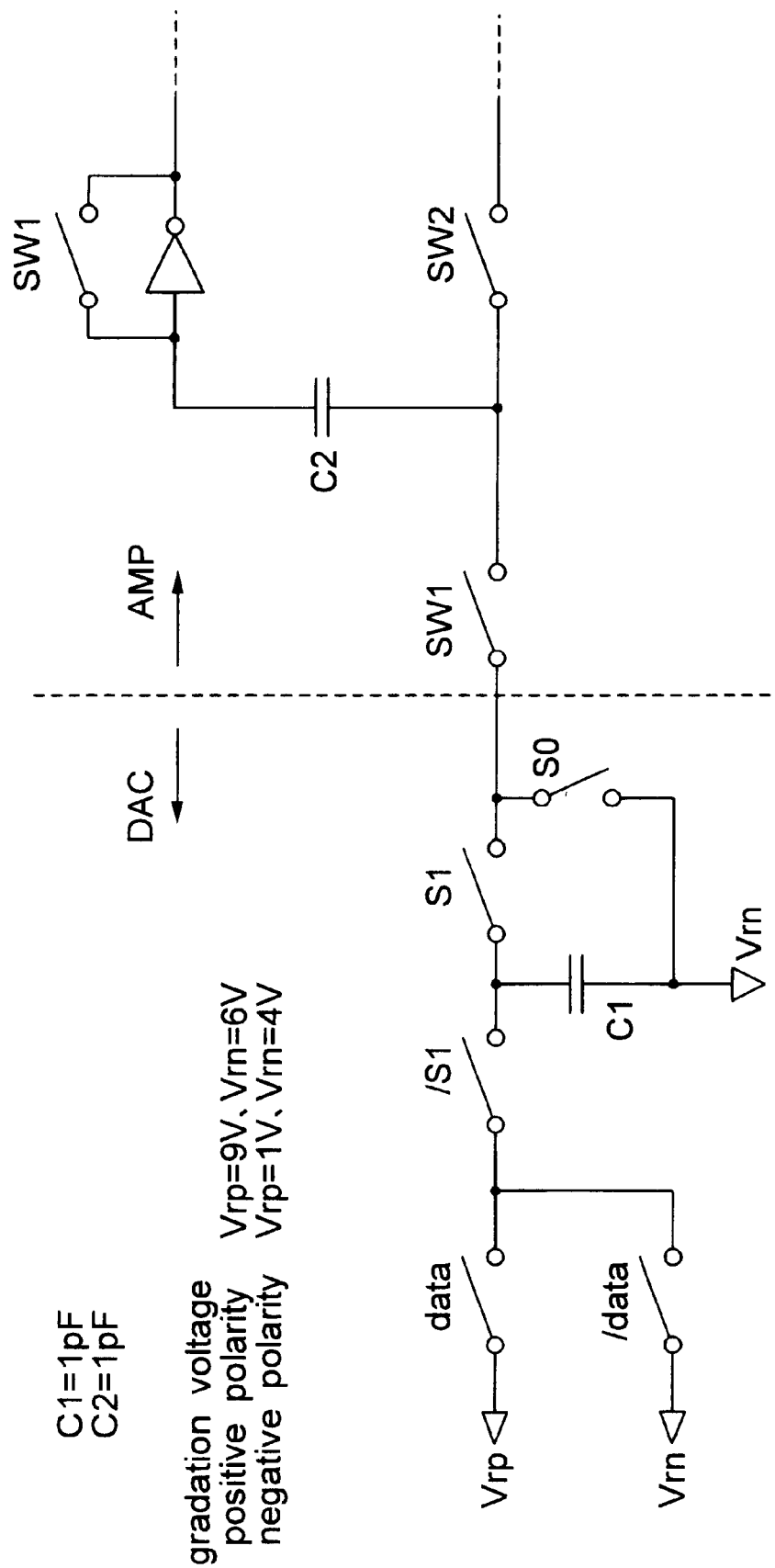
FIG. 33 is a rough circuit diagram showing the connecting portion between any of the serial DACs explained with reference to FIG. 1 through FIG. 14 and any of the output circuits 50J through 50M explained with reference to FIGS. 27 through 32.

FIG. 33 is a rough circuit diagram showing the connecting portion between any of the serial DACs explained with reference to FIGS. 1 through FIG. 14 and any of the output circuits 50J through 50M explained with reference to FIGS. 27 through 32.

That is, FIG. 33 shows only the generic structure of DACs 10A through 10C and the input portion of any of the output circuits 50J through 50M. As shown here, capacitor C2 on the secondary-side of DAC is commonly used as the input capacitor C2 of the output circuit 50J–50M. In the illustrated example, sizes of the capacitors C1 and C2 are about 1 pF, respectively. As to the gradation voltage values, Vref=9 Volt and Vcom=6 Volt in case of the positive polarity, and Vref=1 Volt and Vcom=4 Volt in case of the negative polarity.

Figure 34:
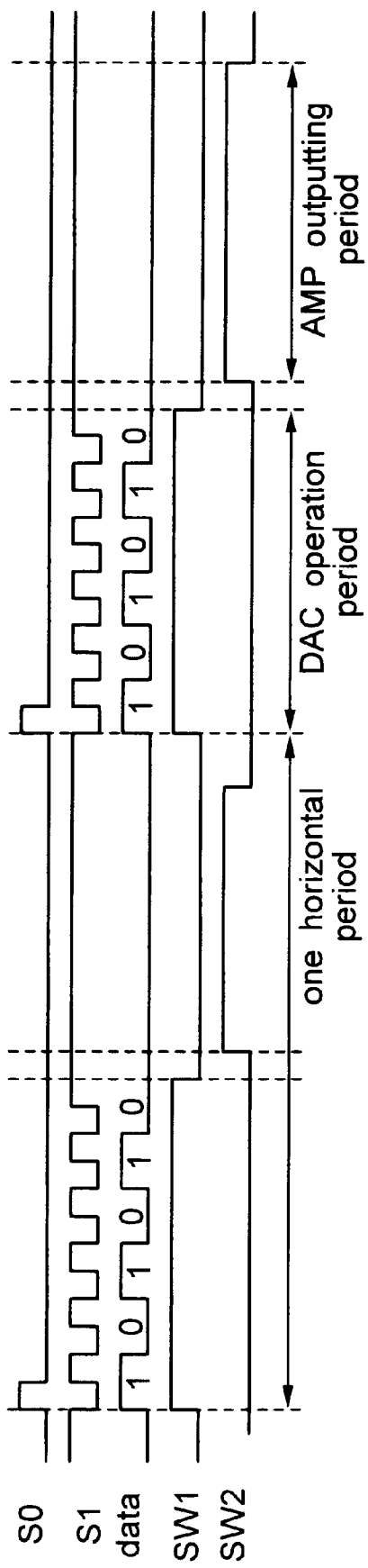
FIG. 34 is a timing chart showing operations of different portions in FIG. 33.

FIG. 34 is a timing chart showing operations of different portions in FIG. 33. In the first half of one horizontal period, charged are reallocated between the capacitors C1 and C2 by turning the switch S1 On and OFF while maintaining the switch SW1 ON, and serial DA conversion is conducted. That is, DA conversion and sampling to the output circuit are executed simultaneously.

In the latter half of one horizontal period, while the switch SW1 is maintained OFF, the switch SW2 is turned ON and makes the output circuit 50J- to 50M write in the signal line 27 the video signal charge as an analog signal stored in the capacitor C2.

By commonly using the capacitor C2 between DAC and output circuit in this manner, the circuit can be simplified and the circuit area can be reduced. However, as apparent from the timing chart of FIG. 34, since the sampling to the output circuit and serial DA conversion are progressed in parallel, the buffer output period is short.

Figure 35:
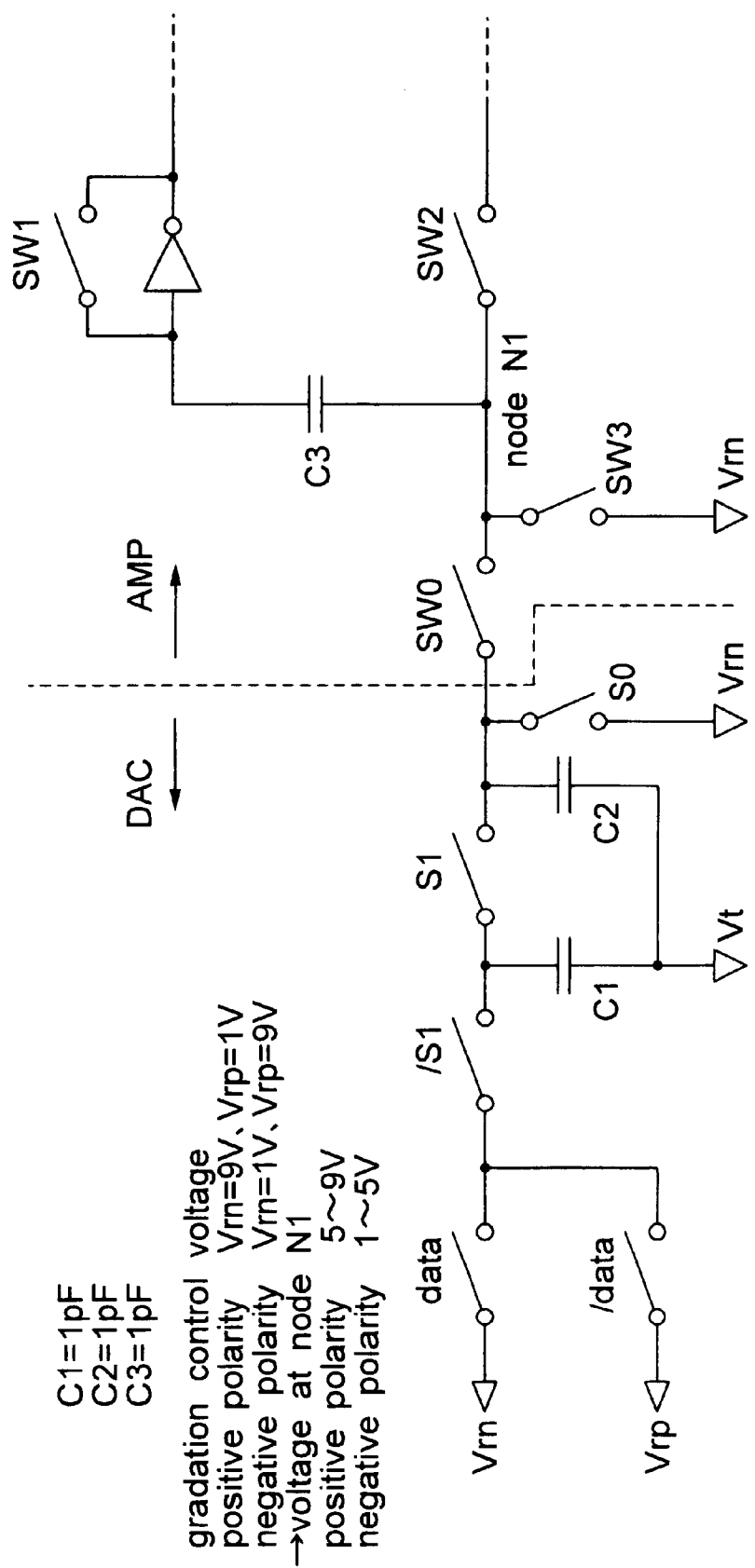
FIG. 35 is a rough circuit diagram showing another example of the connecting portion between the serial DAC and the output circuits 50J through 50M.

FIG. 35 is a rough circuit diagram showing another example of the connecting portion between the serial DAC and the output circuits 50J through 50M. FIG. 35 shows only the generic structure of DACs 10A through 10C and the input portion of any of the output circuits 50J through 50M. As shown here, in this example, capacitor C2 on the secondary-side of DAC and input capacitor C3 of the output circuit are provided separately. In the illustrated example, sizes of the capacitors C1 and C2 are about 1 pF, respectively. The gradation voltage values may be Vref=9 Volt and Vcom=6 Volt in case of the positive polarity, and Vref=1 Volt and Vcom=4 Volt in case of the negative polarity, for example. Potential at node N in FIG. 36 may be 5 to 9 Volt in case of the positive polarity and 1 to 5 Volt in case of the negative polarity.

Figure 36:
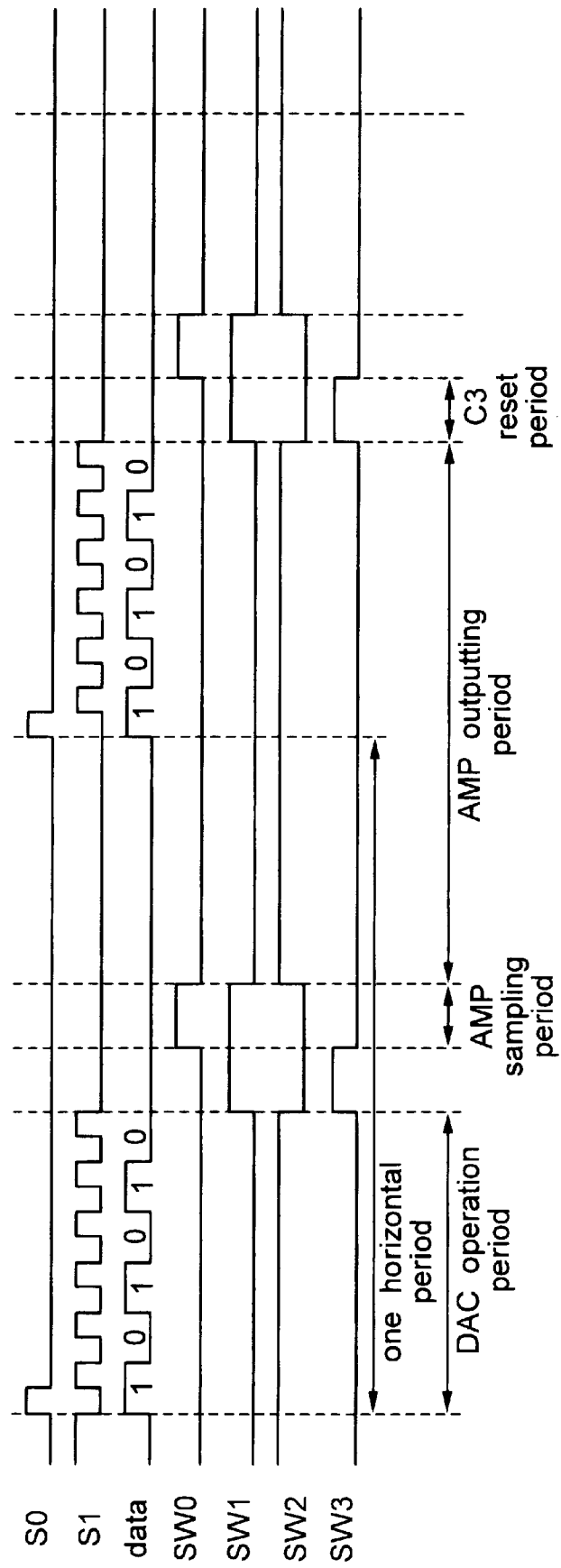
FIG. 36 is a timing chart showing operations of different portions in FIG. 35.

FIG. 36 is a timing chart showing operations of different portions in FIG. 35.

In the first half of one horizontal period, charged are reallocated between the capacitors C1 and C2 by turning the switch S1 On and OFF while maintaining the switch SW0 OFF, and serial DA conversion is conducted. That is, only the serial DA conversion is executed without conducting the sampling to the output circuit.

After that, by turning the switch SW0 only for a predetermined period, sampling to the output circuit is executed. Thereafter, switch SW2 is turned ON to execute writing from the main circuit into the signal line. This writing period lasts to the first half of the next horizontal period, and writing is executed simultaneously with the DAC conversion by DAC.

When the writing into the signal line finishes, a reset period is provided prior to the next sampling, in which the switch SW3 once turns ON and discharges the capacitor C3.

According to this example, data writing from the output circuit into the signal line and serial DA conversion can be progressed simultaneously.

The reason why this example sets the reference voltages Vref and Vcom for DA conversion within the range from 9 to 1 Volt lies in that accumulated charges decrease to a half if the capacitor C2 of DAC and the capacitor C3 of the output circuit are connected. That is, by first storing charges as, many as a double in the capacitor C2 in DAC, a predetermined amount of charges can be obtained after the charges are reallocated between it and the capacitor C3 of the output circuit.

Heretofore, detailed explanation has been made about serial DACs video signal output circuits and their connection interface in the video signal line driving circuit according to the invention.

Next generally explained is the whole structure of the video signal driving circuit involving those elements.

Figure 37:
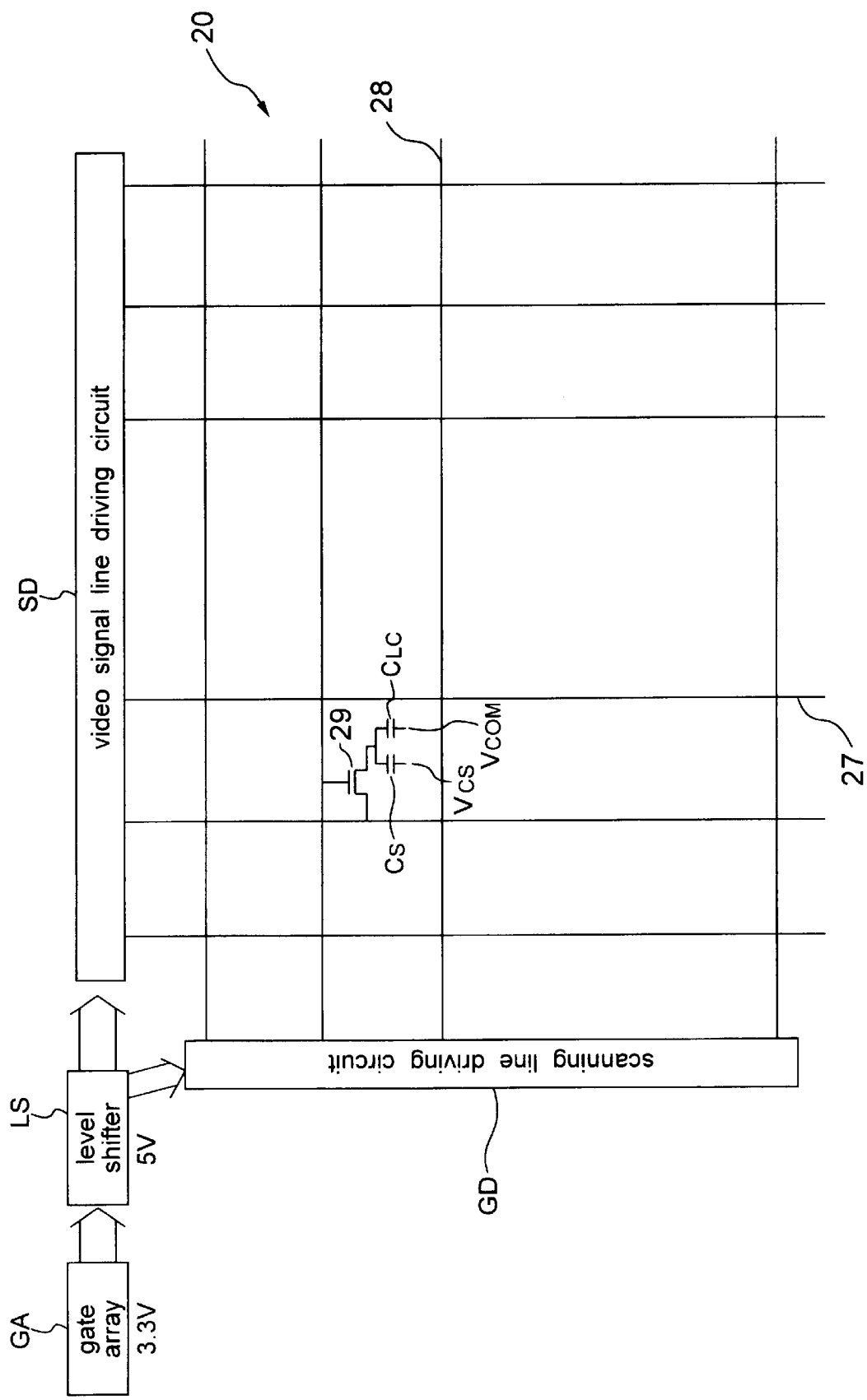
FIG. 37 is a circuit block diagram of a multi-gradation display device according to an embodiment of the invention.

FIG. 37 is a circuit block diagram of a multi-gradation display device according to an embodiment of the invention. This example can be realized as a XGA display device of 6 bits (64 gradations) having the diagonal size of 10 inches.

Figure 38:
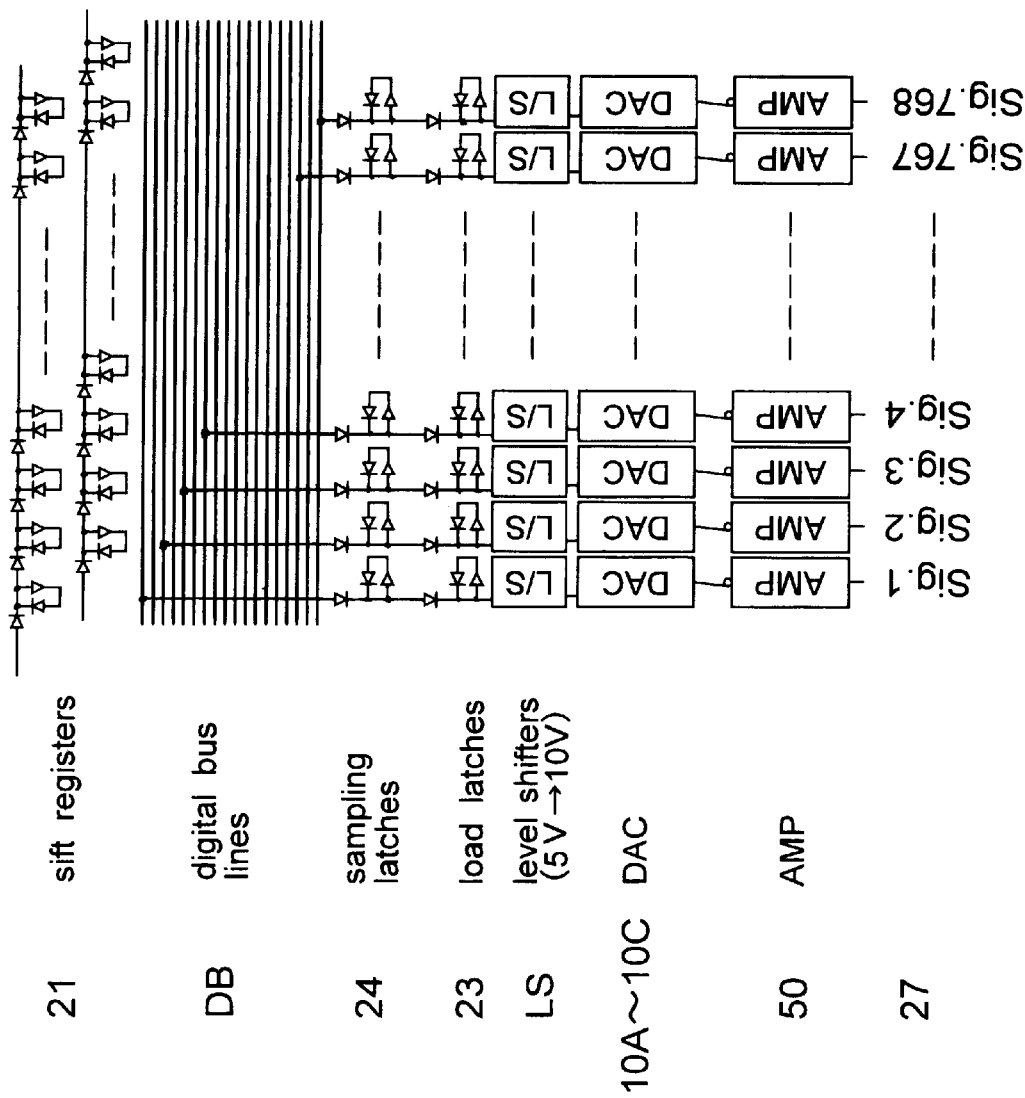
FIG. 38 is a circuit block diagram showing a video signal driving circuit in the multi-gradation display device shown in FIG. 37.

FIG. 38 is a circuit block diagram showing a video signal driving circuit in the multi-gradation display device shown in FIG. 37.

Figure 39:
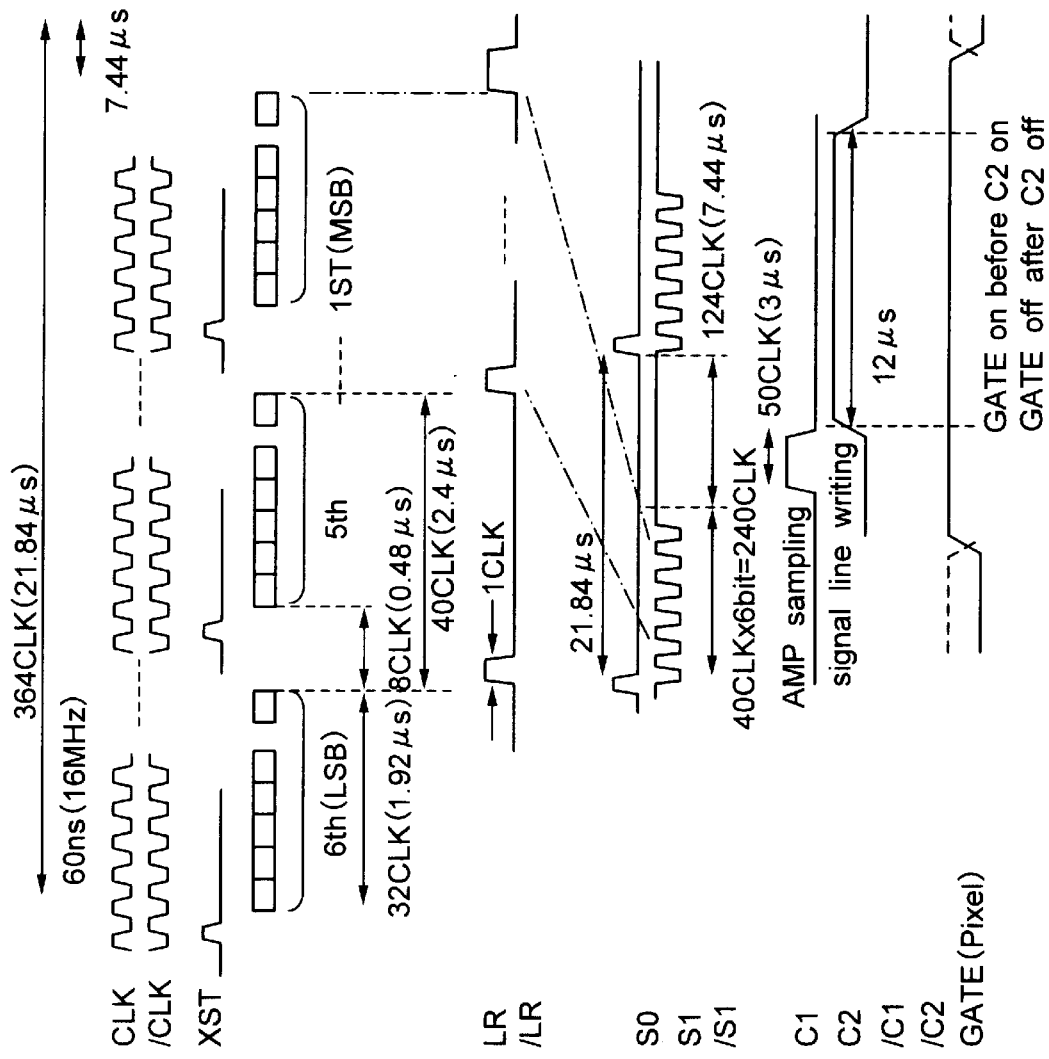
FIG. 39 is a timing chart showing operations of the video signal driving circuit of FIG. 38.

FIG. 39 is a timing chart showing operations of the video signal driving circuit of FIG. 38.

In the circuit of FIG. 37, the image display portion 20 includes a wire arrangement made by a plurality of video signal lines 27 and a plurality of scanning lines 28 which intersect at right angles, and at their crossing points, pixels TFT 29 are provided. Connected to the drain electrode of each TFT 29 are a liquid crystal C1c and a supplemental capacitor Cs to form each display pixel.

The scanning line driving circuit is made of, for example, a shift register and a scanning line driving buffer, and each buffer output is supplied to each scanning line 28. Based on the scanning line supplied to each scanning line 28, TFTs 29 in the corresponding row are turned ON and OFF.

The video signal line driving circuit shown in FIG. 38 includes digital video data lines (digital bus) DB, shift registers 21, sampling latches 24, load latches 23, DACs 10A through 10C, and output circuits 50. As already explained, DACs 10A through 10C once output an analog potential in each horizontal period, and a video signal is written in a single signal line 27 via the output circuit 50.

In the digital bus DB, digital video signals output from an external gate array GA are sequentially written in. As already explained in detail with reference to FIGS. 1 through 14, the video signal line driving circuit SD according to the invention includes serial type DACs 10A through 10C. Therefore, particular consideration has to be made about the order of data output upon outputting the digital video data stored in the gate array GA.

Figure 40A:
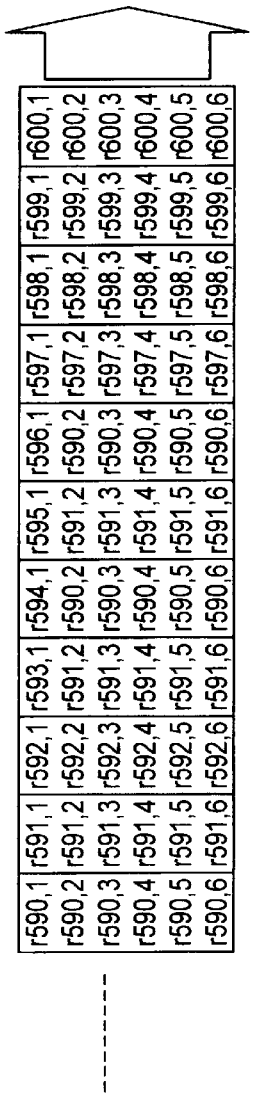
FIG. 40 is conceptional diagrams for explaining the output sequence of digital video data from a gate array GA.
Figure 40B:
Figure 56:
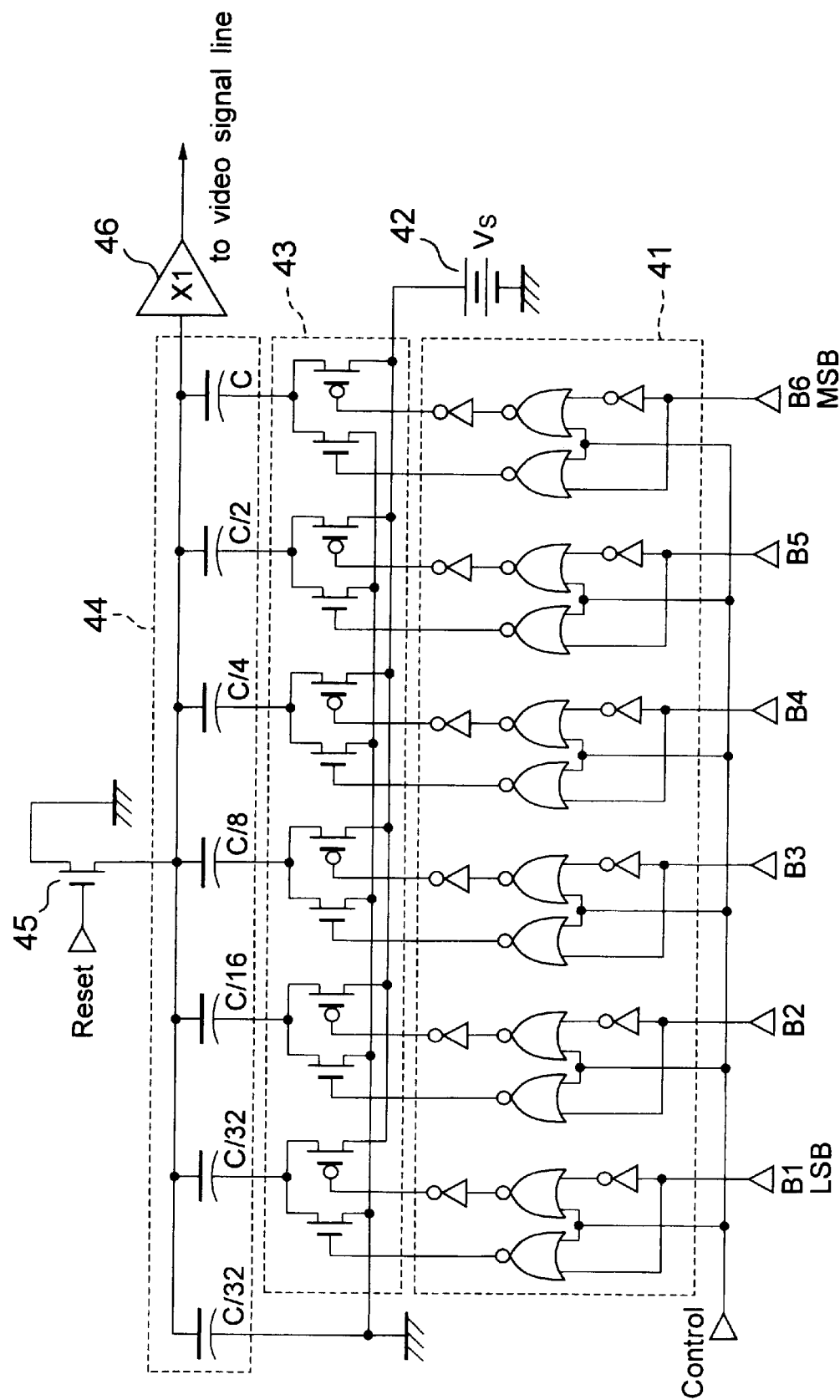
FIG. 56 is a conceptional diagram showing the structure of a capacitor-arrayed DAC used in a conventional liquid crystal display device.

FIG. 40 is concenptional diagrams for explaining the output sequence of digital video data from a gate array GA. When digital video data is output to the conventional parallel type DAC as shown in FIG. 56, a multiple of the 6-bit data from the least significant bit (LSB) to the most-significant bit (MSB) stored in the gate array GA may be directly output in parallel as shown in FIG. 40(a).

In contrast, upon data output to the serial DAC according to the invention, it is necessary to output data sequentially from least significant bits each time by a number of bits corresponding to a common measure of the number of lines of the signal lines 27 in the display device. For this purpose, it is recommended to provide a means for rearranging the data inside or outside the gate array GA.

On the other hand, if polysilicon TFT is used to realize the example of FIG. 37, TFTs may largely vary in property. Therefore, the gate array output of the signal input into the video signal line driving circuit preferably has an amplitude within 5 Volts.

For example, as shown in FIG. 37, it is recommended to connect a level shift circuit LS to the gate array GA using a 3.3 V power source, then shift levels of all of the digital data, clock and control signals with the amplitude of 3.3 Volts into the amplitude of 5 Volts, and thereafter supply them to the video signal line driving circuit SD.

In the case where level shifting is not conducted before the supply to the video signal line driving circuit SD, it is necessary to (1) set the source voltage of the gate array itself to 5 Volts, or (2) build the level shift circuit on a common substrate with the video signal line driving circuit by using polysilicon TFTs. However, in case of (1), the power consumption increases, and in case of (2), "data error" may occur because there is the possibility that a predetermined digital video data cannot be supplied to the shift register at a desired timing when the delay of the level shift circuit largely varies.

The shift register 21 is supplied with clock signals (CLK, /CLK) and trigger signal (XST). The sampling latch 24 is controlled by an output from the shift register 21, and the digital video data are stored sequentially in sampling latches 24.

Subsequently, digital data stored in the sampling latches 24 by the data loading control signals (LR, /LR) are latched in the load latches 23 simultaneously, and they are output thereafter to DACs 10A through 10C. As illustrated here, the level shift circuit LS may be interposed between the load latch 23 and DACs 10A through 10C, if necessary.

In the case where DAC is provided for each signal line 27, output to the sampling, load and DAC is repeated six times corresponding to 6 bits. The series of these operations are as already explained in detail with reference to FIGS. 1 through 14 and as shown in the timing chart of FIG. 39. Every time, digital data is converted in voltage and held in the capacitor in DAC.

The output circuit 50 receives an output from DAC in the sampling period, and next writes a voltage in the signal line 27 in the writing period. Details of these operations were already explained with reference to FIGS. 15 through 36. DAC and the output circuit 50 are not connected in the writing period.

Next explained are modified examples of the video signal line driving circuit according to the invention.

FIGS. 41 and 42 are conceptional diagrams for explaining modified examples of the video signal line driving circuit according to the invention. FIG. 41(a) corresponds to the basic form shown in FIG. 38, and FIG. 41(b), FIGS. 42(a) and 42(b) are its modified versions.

In these modified versions, by providing a selection switch SSW or an analog switch ASW which can select one of a plurality of signals, part of the latches 24A, 24B, level shifters LS, DACs 10A through 10C and output circuit 50 can be used commonly to simplify the circuit.

Taken for the explanation made below is a case capable of selecting one of two signal lines 27, for simplicity. And the explanation is made dividing all signal lines into odd-numbered ones (2N−1) and even-numbered ones (2N). Needless to say, however, the invention is not limited in number of selected lines and way of selection to the below-explained example, but involves various other modifications.

First in the modified example shown in FIG. 41(b), a selection switch SSW is provided so that the latches 24A and 24B can be selectively used between two signal lines. This structure can reduce the number of latches into a half. As a concrete way of operation, one horizontal period is divided into 12, and DAC for odd-numbered signal lines and DAC for even-numbered signal lines are connected by switching 12 times. Writing into signal lines by output circuits (AMP) can be started and executed at the same time after analog outputs are fixed for all DACs. Since substantially full length of one horizontal period may be used for such writing into signal lines, this modified example has the advantage that the average current amount is small.

Next in the modified example shown in FIG. 42(a), the use of the analog switch ASW makes it possible to commonly use latches 24A, 24B and DAC between two signal lines. That is, it contributes to reducing the number of latches and DACs into a half.

As the way of this operation, one horizontal period is divided into two so as to connect odd-numbered signal lines to DAC in the first half period and connect even-numbered signal lines to DAC 10, respectively, in the latter half period. Writing into signal lines by the output circuit 50 is executed immediately after odd-numbered DAC outputs are determined. The writing time is about ½ of one horizontal period. Subsequently, writing into the remainder signal lines is executed after even-numbered DAC outputs are determined. In the modified example shown here, the area occupied by DACs can be reduced to a half as compared with the example shown in FIG. 41(b).

In this modified example, a single DAC sequentially outputs an analog potential to a plurality of signal lines. It is recommended to change the order of selecting these signal lines for every horizontal period or every frame. This is because any error voltage that may slightly occur between a signal line having written the voltage earlier and a signal line having written the voltage later can be averaged periodically.

Next in the modified example shown in FIG. 42(b), the number of latches, DACs and output circuits can be reduced to a half. That is, in this modified example, the analog switch ASW is provided between the output circuit 50 and the signal line 27 to execute writing in about a half period of one horizontal period. For this purpose, however, a relatively large analog switch ASW is desirably used to secure the current capacitance.

In the example explained above, a single DAC is used for a single signal line. However, as an idea apart from that, it is possible to realize an "analog buffer system" in which two output circuit 50 are provided in parallel to a single signal line to use one of them for sampling and the other for writing into the signal line. If this structure is employed in the modified example of FIG. 42(a) already explained, writing into a signal line can be continued through out a horizontal period. Therefore, this has the advantage that the average current amount can be reduced to a half.

In the structure explained above, it is especially advantageous to use a "common inverting driving system". That is, the common potential is changed from one horizontal period to another within the range of 2.5∀2.5 V. Responsively, the signal line potential is output in 2.5∀2.5 V. In this manner, the voltage output possible ranges of DAC and output circuit 50 can be decreased as low as about 5 V. In a circuit made of TFTs like polysilicon TFTs whose property is more variable than crystal silicon TFTs, the breadth of variance in threshold voltage, for example, narrows the output range of the output circuit 50. In large-scale display devicees whose diagonal screen size is 13 inches or more, it is not practical to change the common potential very horizontal period. It is advantageous to fix the common potential to about 5 V, for example, and control the signal line potential within the range from 1 to 9 V. In case of the output circuits shown in FIGS. 25 and 26, for example, it can be realized by adjusting Vdd, Vss and Vbi.

In the example explained above, it is necessary to operate the shift register 21 at a high speed. The number of digital buses DB is 8 phases×3 colors (RGB)=24, approximately, as dividing the screen into four parts in case of 10.4 inch XGA. In this case, a single bit data has to be latched within about 60 nanoseconds (i.e. about 16 MHz). This is acceptable if the shift register can follow the clocks of 16 MHz. However, there is the possibility that 16 MHz operation of the shift register becomes unreliable when the TFT property varies largely. To solve this problem, there is the method of activating the shift register 21 for operation corresponding to 16 MHz with the clocks of 8 MHz.

Figure 43A:
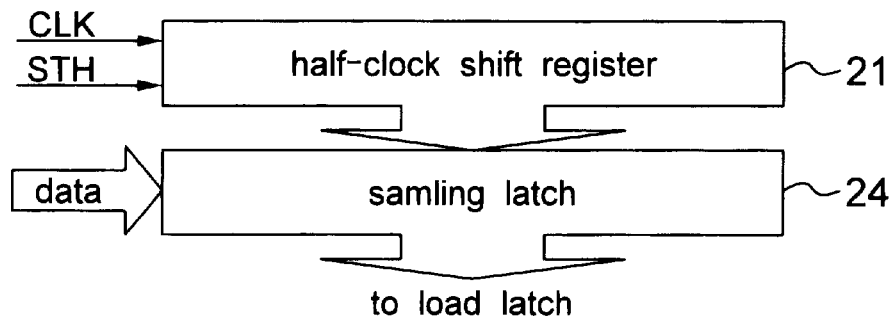
FIG. 43(a) shows a block structure of a double-speed operating shift register.
Figure 43B:
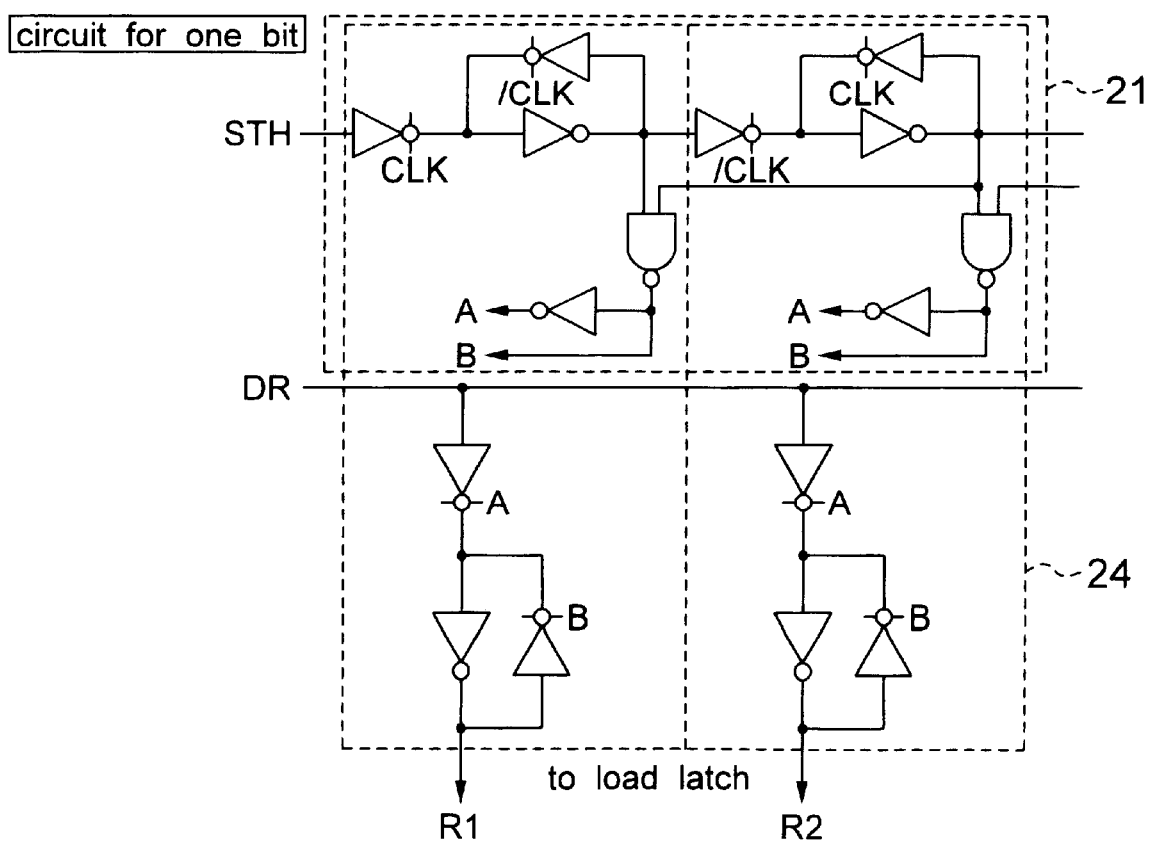
FIG. 43(b) shows its rough circuit.
Figure 44A:
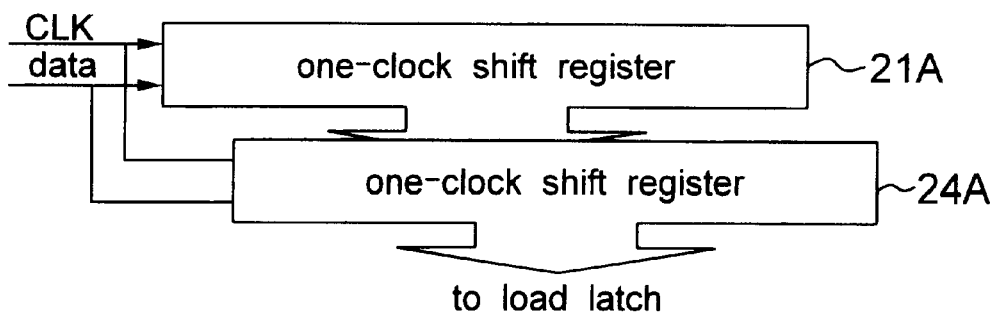
FIG. 44(a) shows a block structure of a double-speed shift register.
Figure 44B:
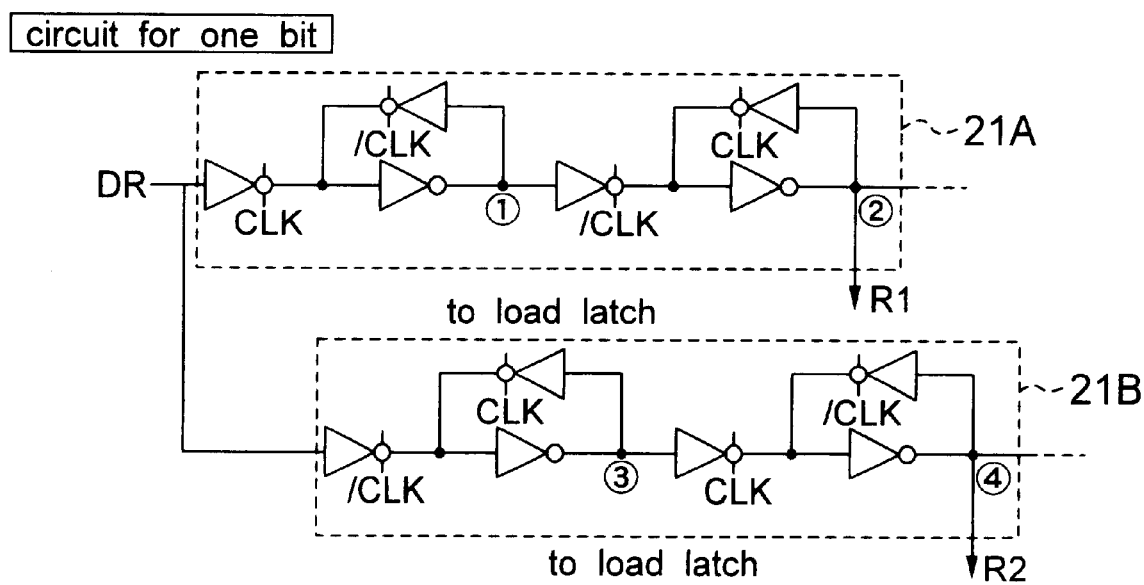
FIG. 44(b) shows its rough circuit.

FIG. 43 and FIG. 44 are conceptional diagrams showing structures of such double-speed operating shift registers. That is, FIGS. 43(a) and 44(a) show their block structures, and FIGS. 43(b) and 44(b) shows their outlined circuits. The structure of FIG. 43 includes a half-clock shift register 21 operative in response to any of CLK and /CLK, and a control signal is supplied to a sampling latch 24 cyclically with the period two times of the clock CLK.

In the structure of FIG. 44, two one-clock shift type shift register 21A, 21B are provided, and by supplying a clock and its reversal signal to them, respectively, data is sampled cyclically with the double period, and is supplied to the load latch 23.

Differently from the example shown here, it is also possible to simply provide two shift registers in parallel and activate one of them with a shift of half clock from the other.

When the serial DAC already explained with reference to FIGS. 1 through 14 is employed, the area occupied by the circuit can be reduced much smaller than using the conventional parallel DAC. As a result, somewhat complicated shift registers as shown in FIG. 43 and FIG. 44 can be made easily.

An example using the invention to a liquid crystal display is explained below. If the threshold voltage of a liquid crystal material is around 2.5 V, there is the advantage that output ranges of DACs 10A through 10C and the output circuit 50 can be made smaller than the use of a 4-Volt type liquid crystal. Further, if the threshold voltage of the liquid crystal is selected around 1.5 V, even upon vertical line (V line) reversal driving or horizontal/vertical (H/V) reversal driving (often employed especially in large screen liquid crystal display devices whose diagonal size is 13 inches or more), output ranges of DACs 10A through 10C and output circuit 50 need not be 10 V, and it is advantageous in permitting reduction of power sources.

Transmission type display devices, reflection type display devices, semi-transmission type display devices and light emitting display devices made by forming the video signal line driving circuit according to the invention on a glass substrate simultaneously with pixel driving TFT are very advantageous as display devices of portable terminals because the module intensity is large and the marginal frame portion can be thinned.

Finally, a 10.4 inch XGA liquid crystal display device is explained as an embodiment of the invention.

Figure 45:
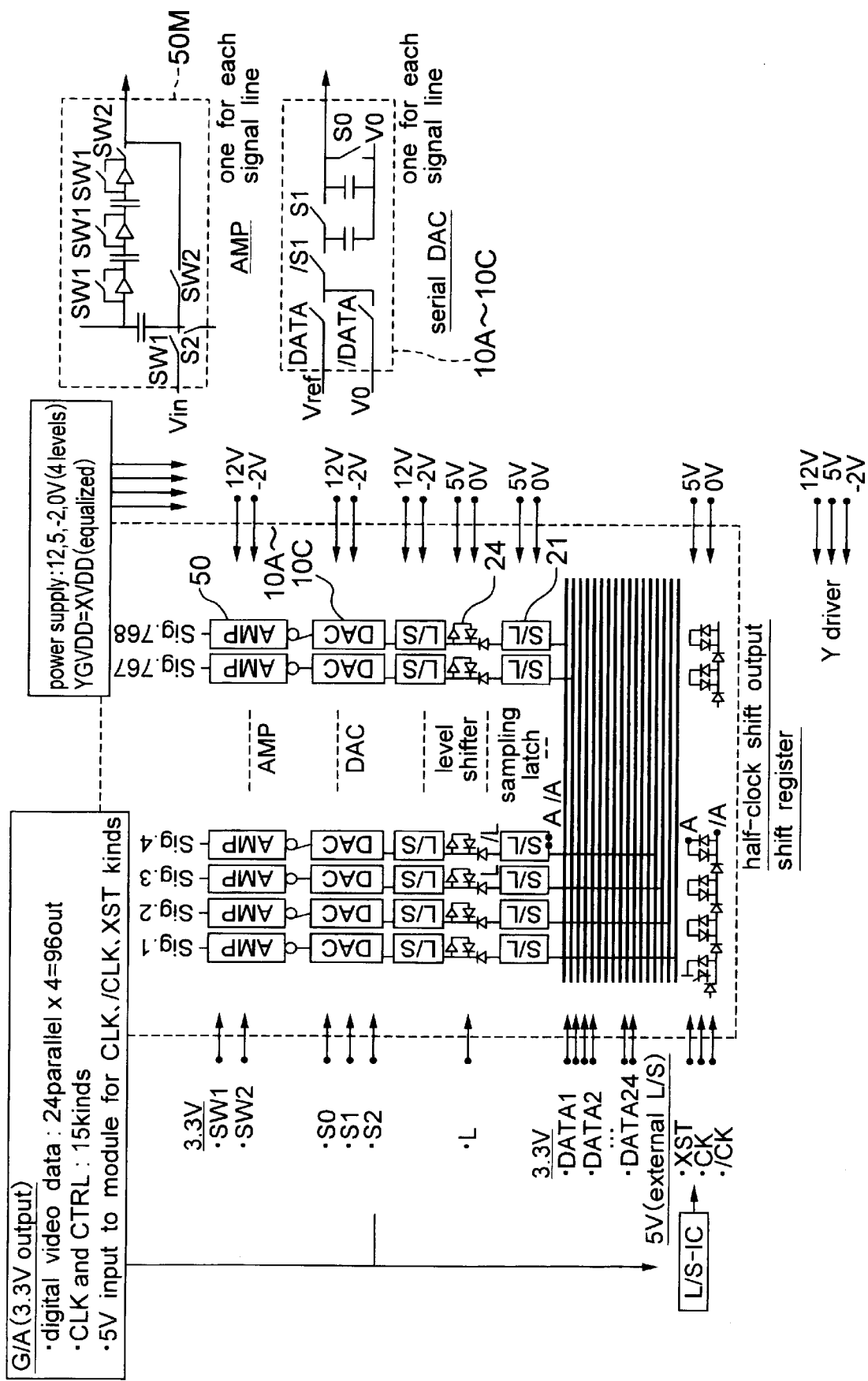
FIG. 45 is a block diagram showing an embodiment of the video signal line driving circuit according to the invention.

FIG. 45 is a block diagram showing an embodiment of the video signal line driving circuit according to the invention. The example shown here is an XGA liquid crystal display device whose diagonal size is 10.4 inches. Elements in FIG. 45 equivalent to those already explained with reference to FIGS. 1 through 43 are labeled common reference numerals, and their detailed explanation is omitted.

Figure 46:
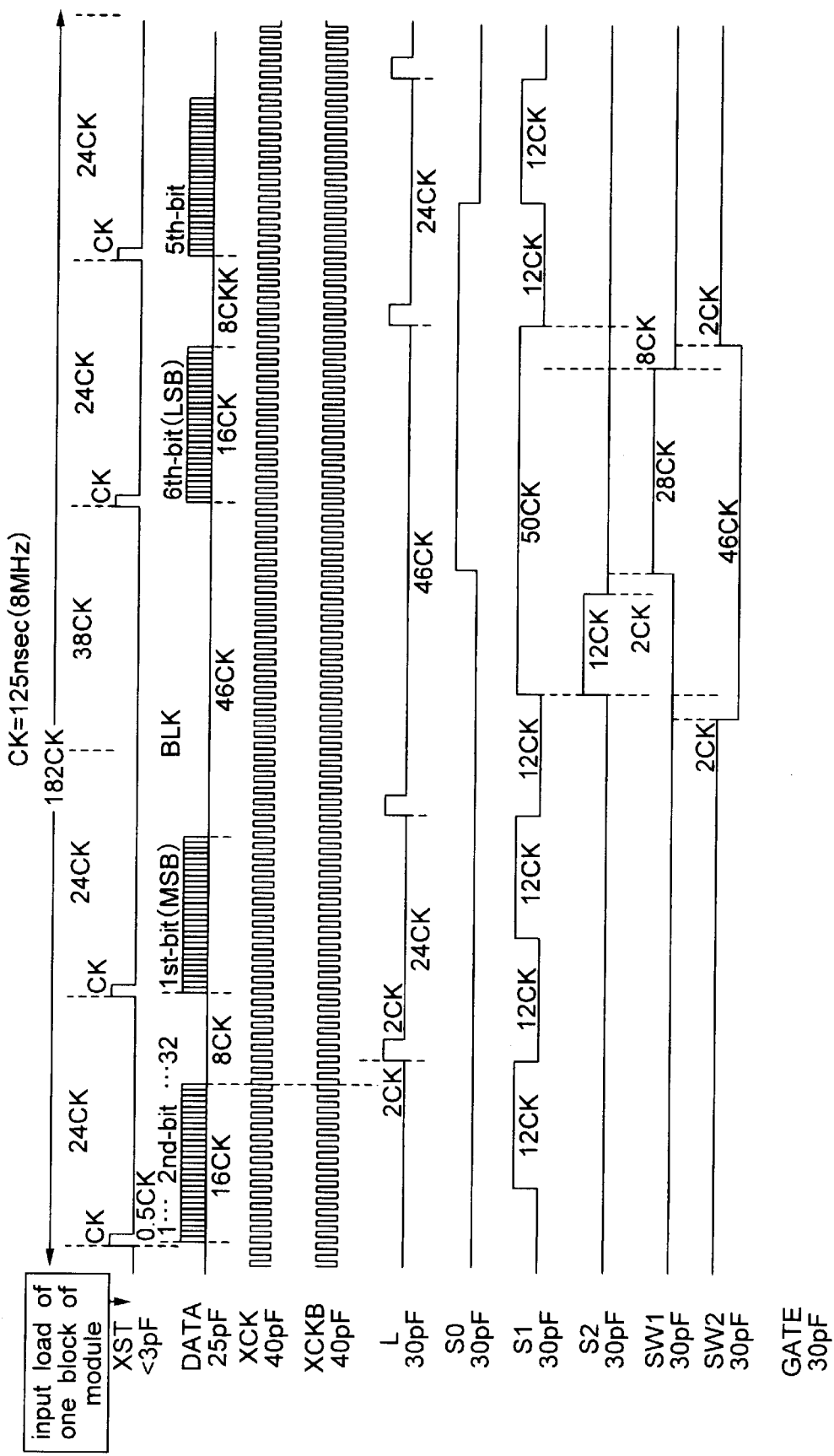
FIG. 46 is a timing chart showing an example of operations of a display device according to the invention.

FIG. 46 is a timing chart showing an example of operations of a display device according to the invention. In this embodiment, video signals are supplied in the 8-phase 4-divisional system. That is, the gate array GA outputs digital image data of 8 phases×3 (RGB)×4 (division)=96. Additionally 15 kinds of signals are supplied as clocks CLK and control signals CTRL, and they are input in the level of 5V to a glass substrate having formed a driving circuit.

On the other hand, there are four kinds of power sources of 12, 5, −2 and 0 Volt, and it is advantageous because of no need for 10 V power source which was necessary in conventional techniques. Further, YGVdd and XVdd are used commonly.

768 signal line 27 are provided, and connected to each of them are a shift register 21, sampling latch 24, level shifter LS, DAC and output circuit 50. Power sources for respective elements are as shown in FIG. 44.

The shift register 21 is of a half-clock shifted outputting type which receives a control signal and a clock signal from the gate array GA and operates at a double speed. Its concrete structure is as shown in FIG. 42, for example.

According to this embodiment, by using a serial DAC, small and light display devices using a much smaller circuit area than conventional ones can be made. Moreover, since a special design is added to the structure of the output circuit 50, the circuit ensures stable operations even upon variance in property of polysilicon TFT, hence improves the production yield remarkably, and improves the initial property of the display device and its reliability.

Figure 47:
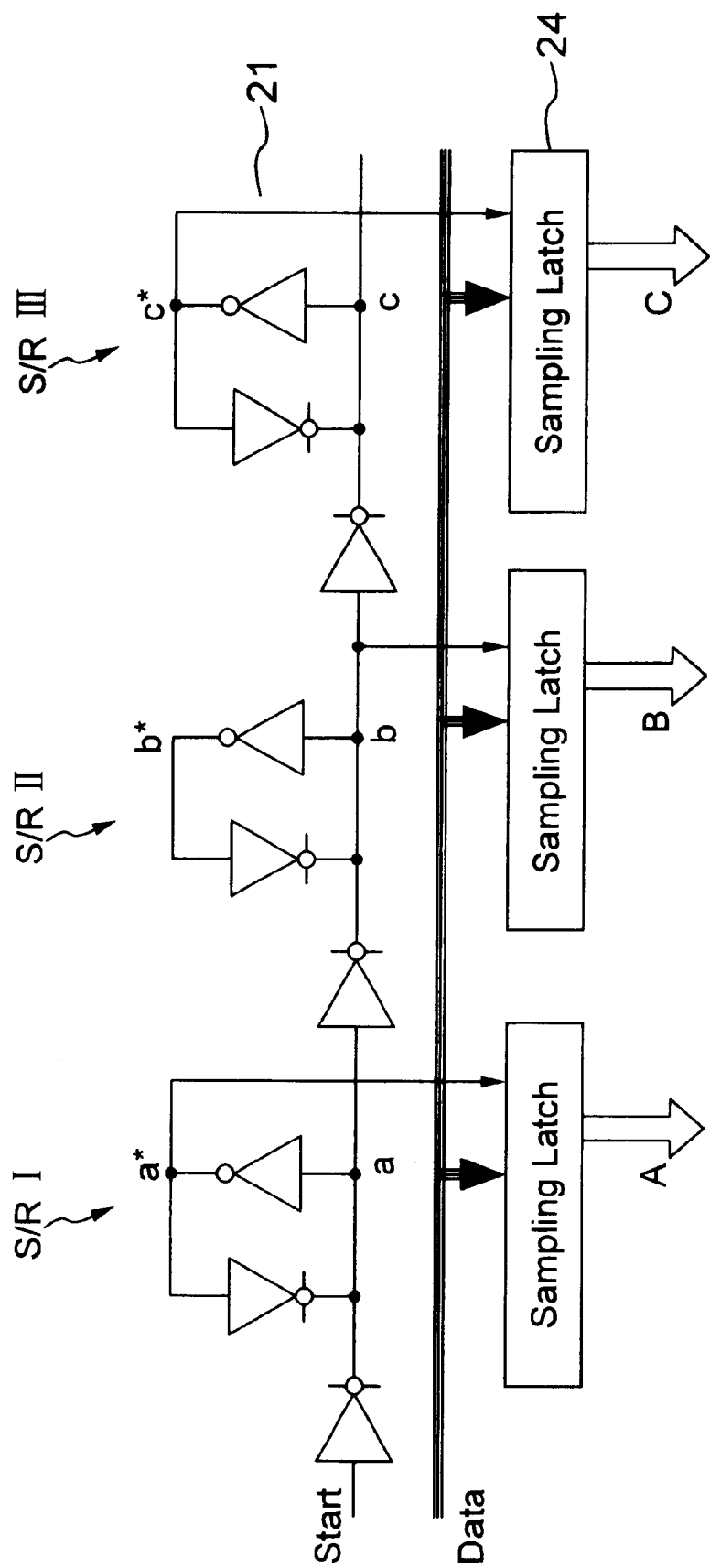
FIG. 47 is a conceptional diagram showing a modified example of the shift register 21.

FIG. 47 is a conceptional diagram showing a modified example of the shift register 21.

Figure 48:
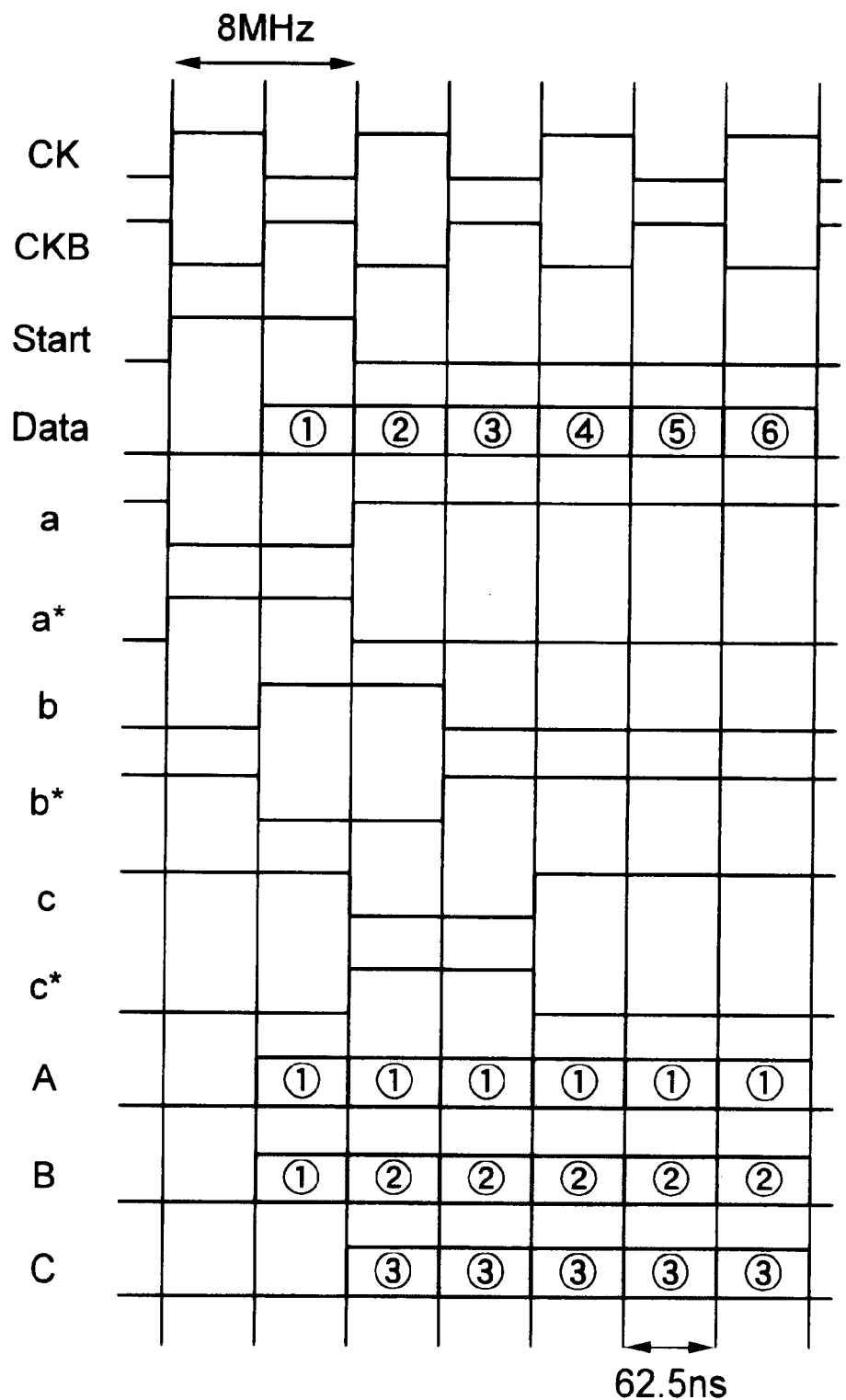
FIG. 48 is a timing chart explaining operations of the shift register shown in FIG. 47.

FIG. 48 is a timing chart explaining operations of the shift register shown in FIG. 47.

Although typical shift registers are configured to send pulses to the next stage with reference to the rising edge of a clock signal, the shift register taken as the present modified example behaves similarly to a half-clock shift register.

More specifically, in response to the output a* of the shift register S/$I, data (Data) ① is output to the output A of the sampling latch. Although the shift register S/RII also behaves similarly, it behaves similarly to half-clock operation. Therefore, at its output B, data ① is first latched instead of data ②, and data ② is latched next. Similarly, the shift register S/RIII first latches the prior adjacent data ②, but finally latches the desired data ③.

One of features of this modified example lies in not relying on the operation prior to obtaining the desired data, because it deals with digital data and is configured to transfer the data to DAC via the load latch after the sampling latch stage. In structure like half-clock shift registers, it can be prevented that shift register outputs overlap due to logical operations of the preceding stage and its own stage. However, since the pulse width is reduced to half, high-speed operation is not easy in certain cases. Additionally, due to influences of an increase of elements for logical operations and/or a delay caused thereby, "thinning" of the pulse width, or the like, may occur, and there is the possibility that sampling latch does not work.

In contrast, according to this modified example, although it employs the system for latching desired data after once latching the preceding data, since it can reliably keep the pulse width, its operation margin is wider than that of a half-clock shift register, and it needs a less number of elements.

Next explained is a structure adding a gamma correcting circuit as an example of the driving circuit according to the invention.

FIG. 49 is rough diagrams for explaining a driving circuit of a liquid display device to which a gamma correction circuit is added. FIG. 49(a) is a timing chart of a gate array which supplies signals to a driving circuit having a six signal line selective structure, FIG. 49(b) is a conceptional diagram of the driving circuit having the six signal line selective structure, FIG. 49(c) is a timing chart of the gate array which supplies signals to a driving circuit having an eight signal line selective structure, and FIG. 49(d) is a conceptional diagram of the driving circuit having the 8 signal line selective structure.

Figure 49A:
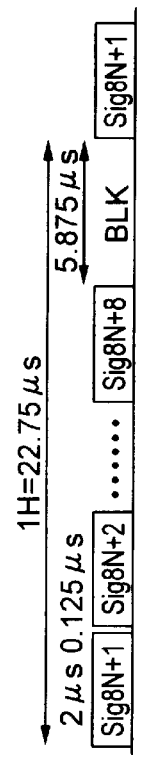
FIG. 49(a) is a timing chart of a gate array which supplies signals to a driving circuit having a six signal line selective structure.
Figure 49B:
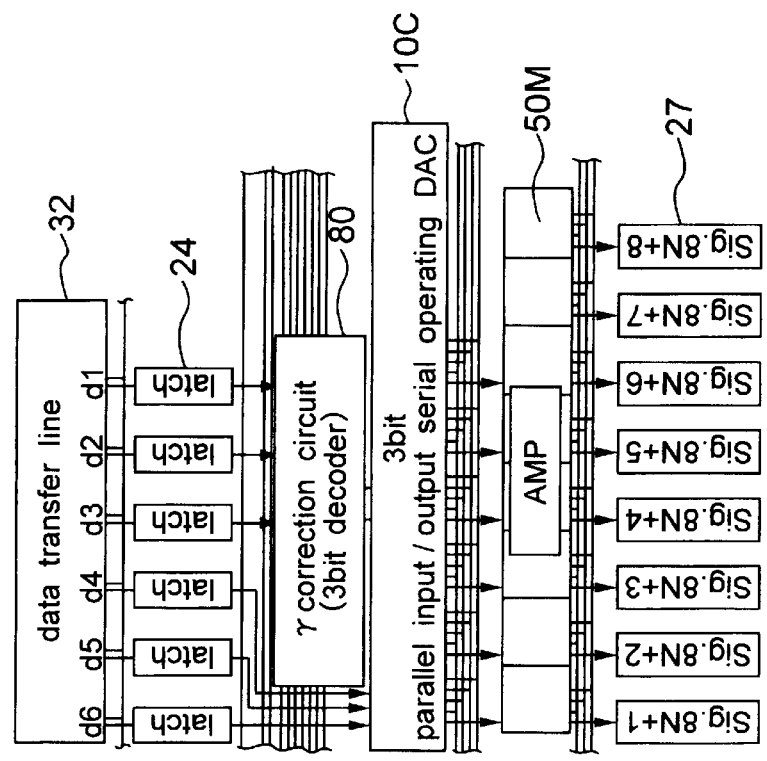
FIG. 49(b) is a conceptional diagram of the driving circuit having the six signal line selective structure.

First referring to FIGS. 49(a) and 49(b), explanation is made about the case using a six signal line selective structure. The driving circuit includes six latches 24, one gamma ($\smile$) correction circuit 80, DAC 10C, and sic output circuits (amplifier circuits) 50 for 6 signal lines. That is, DAC 10C sequentially selects one of six signal lines and writes an analog potential therein. DAC 10C used here is one having the structure shown in FIG. 9. The gamma correction circuit 80 functions to display images matching the visibility property of human unaided eyes by correcting the optical response property of the liquid crystal.

As shown in FIG. 49(a), one horizontal period of 22.75 microseconds is sectioned into every 2 microseconds, and in the first 2 microseconds, bit data (d1 to d6) of the (6N+1)th signal line (N is a natural number) is latched by the latch 24. When the data latching is completed, the gamma correction circuit 80 selects reference potentials V+ and V− with reference to the latch data of most significant 3 bits (d1 through d3). On the other hand, DAC 10C refers to the data of least significant 3 bits (d4 through d6) and charged the reference potentials V+ and V− in the input capacitors C11, C12 and C13, simultaneously.

When charging of the primary-side capacitors is completed, reallocation of the corresponding charged potential is repeated between each primary-side capacitor and the secondary-side capacitor, i.e. output capacitor C21, sequentially from the least significant bit between the corresponding charged potential, and a desired analog potential Vi is obtained. The analog potential Vi made in this manner is referred to by the output circuit 50, and written in the signal line 27.

In the next 2-microsecond section, similar operations are repeated from the (6N+2)th signal line to the (6N+6)th signal line to write the analog potential into all signal lines. Then, in the latter half of one horizontal period, a blank period of 10.125 microseconds is provided.

In the signal processing for each signal line, as already explained with reference to FIG. 9, DAC 10C alternately uses the secondary-side capacitors C21 and C22 and can execute writing of the analog potential into the preceding signal line in parallel with DA conversion for the next signal line. Therefore, sufficient writing of a potential and representation of high-quality images are ensured while maintaining the high-speed operations.

Additionally, in this example, since the gamma correction circuit 80 is of a power source selecting type, voltage conversion of most significant 3 bits is executed at a very high speed, and requires almost no time. Further, since operations of DAC 10C may be only DA conversion of least significant 3 bits alone, high-speed operation is ensured.

Figure 49C:
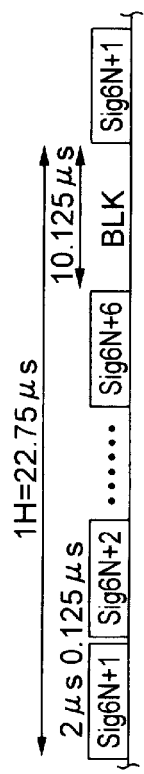
FIG. 49(c) is a timing chart of the gate array which supplies signals to a driving circuit having an eight signal line selective structure.
Figure 49D:
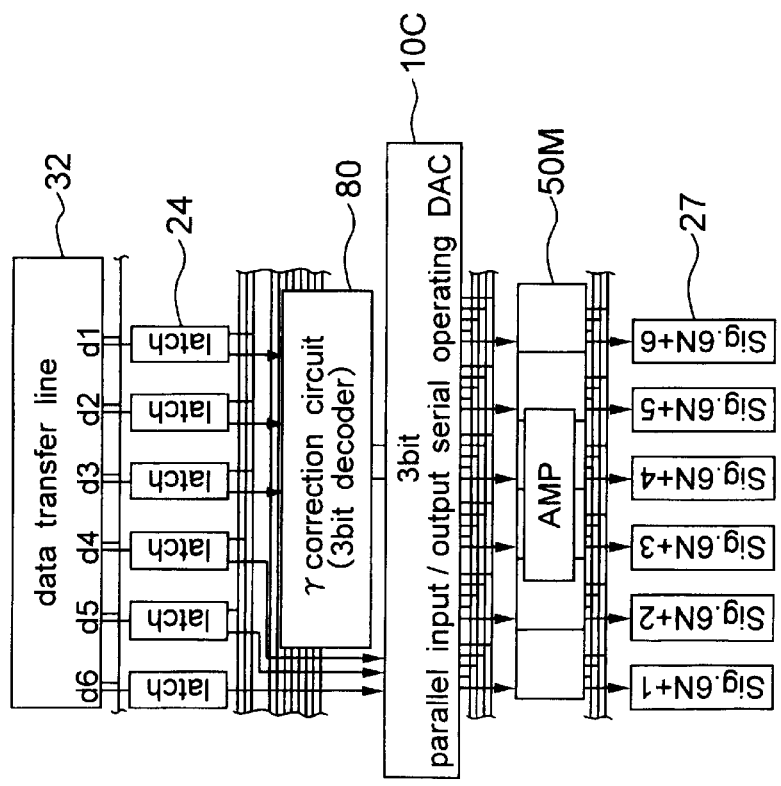
FIG. 49(d) is a conceptional diagram of the driving circuit having the 8 signal line selective structure.

The 8 signal line selective structure shown in FIGS. 49(c) and 49(d) can be basically operated in the same manner. More specifically, as shown in FIG. 49(c), one horizontal period of 22.75 microseconds is sectioned into every 2 microseconds, and in the first 2 microsecond period, bit data of the (8N+1)th signal line (N is a natural number) is latched, and output after gamma correction and DA conversion. Thereafter, through blanks in 0.125 microsecond intervals until the (8N+8)th signal line, it can be operated in the same manner as explained above. In the latter half of one horizontal period, a blank period of 5.875 microseconds is provided.

FIG. 50 is a diagram showing a detailed example of the structure of the driving circuit having the six signal line selective structure.

In each load latch 24, data of individual bits (d1 through d6) is input and latched. Among them, data of most significant three bits (d1 through d3) is input into the gamma correction circuit 80, and one of a plurality of reference potentials is selected based on the data, and supplied to DAC 10C as V+ and V−.

The gamma correction circuit 80 is made by combining an inverter 80A, AND gate 80B, OR gate 80C and switch 80D as illustrated, for example. In the illustrated example, nine kinds of potentials V1 through V9 are prepared as reference potentials.

Logic gates 80A through 80C executed logical operations based on data of most significant three bits input from the latch 24. In response to the result, they turn one of switches 80D ON, thereby select one of reference potentials V1 through V9, and output it as V+ and V−.

The reference potentials V1 through V9 may be voltage nodes of nine levels in total, which are obtained by dividing into eight the source voltage range of 4 to 5 V ensuring 4 to 5 V as the effective voltage to the liquid crystal, for example. However, in order to correct in accordance with the visibility property, V1 through V9 are made by dividing the source potential in unequal intervals. Then, by selecting two consecutive potentials Vi and V(i+1) from the reference potentials V1 through V9 and delivering to DAC as V+ and V−, most significant three bits substantially result in being converted into an analog form. Subsequently, DAC cuts finer the difference between Vi and V(i+1) to make high-order gradient potentials as explained below.

On the other hand, data (d4 through d6) of least significant three bits latched in the load latch 24 are directly sent to DAC 10C.

In the illustrated example, DAC 10C has three primary-side capacitors C11 through C13 and six secondary-side capacitors C21 through C26. Based on the input data (d4 to d6), DAC 10C charges the primary-side capacitors C11 through C13 by using the reference potentials V+ and V− selected by the gamma correction circuit 80. Then, the primary-side capacitors C11 to C13 reallocate electric charges with one of secondary capacitors C21 to C26. Thus, the analog conversion is completed.

The secondary-side capacitor subjected to reallocation of charges writes the analog potential into a corresponding signal line 27 through a corresponding output circuit (amplifier circuit) 50M. In parallel with the writing operation, DA conversion for the next signal line can be executed.

As explained above, the driving circuit shown in FIG. 50 conducts gamma correction of input digital signal, then executes DA conversion, and writes the analog potential obtained into the signal line 27. In this case, it can executes writing into the preceding signal line in parallel with the gamma correction and DA conversion for the next signal line, and can therefore realize quick and reliable supply of analog signals.

Figure 51:
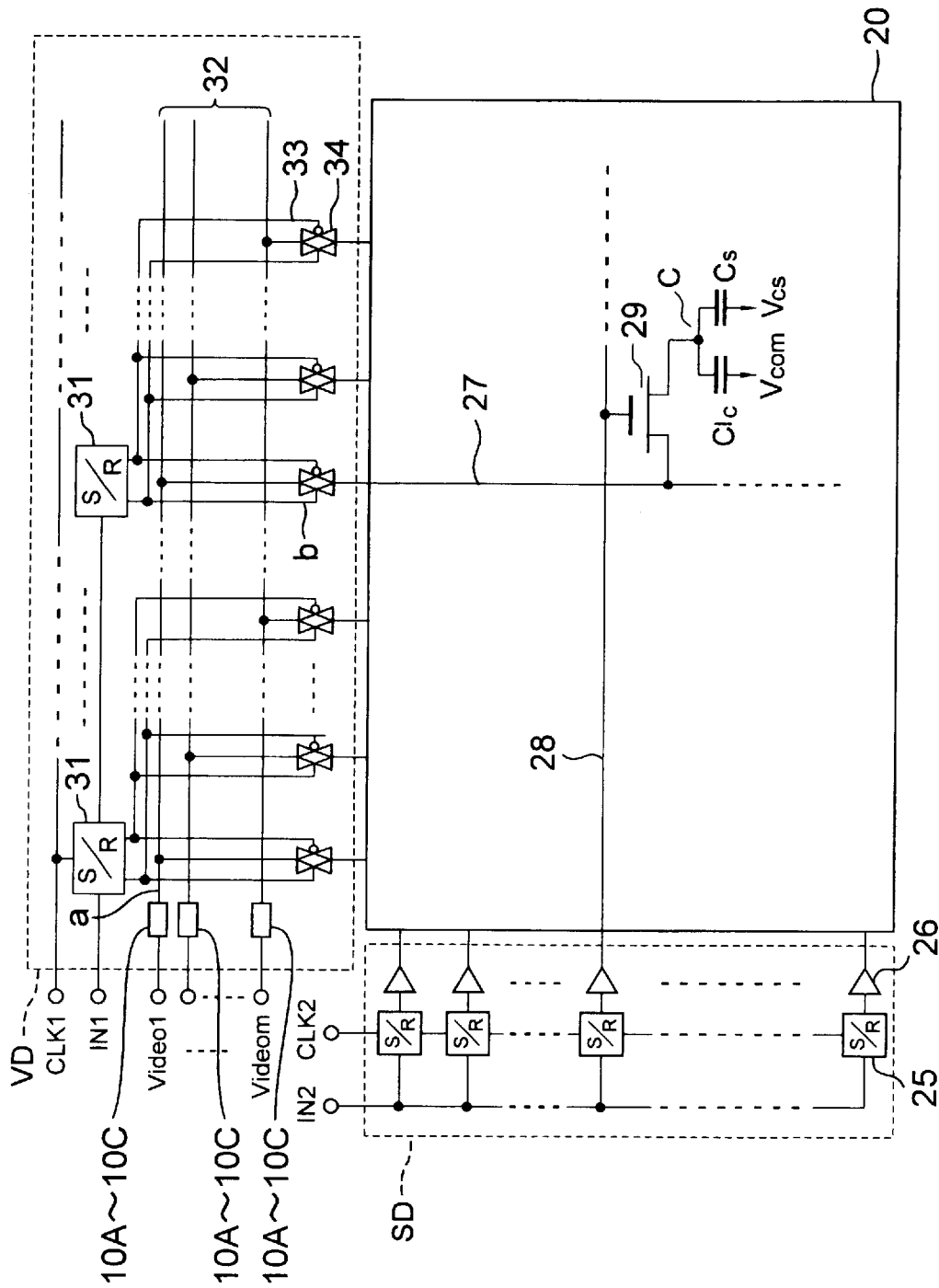
FIG. 51 is a rough diagram showing a driving circuit of a "block sequential scanning type" sample holding type (hereinbelow abbreviated S/H type) liquid crystal display device.

FIG. 51 is a conceptional diagram showing a modified example of the present invention. That is, it shows a "block sequential scanning type" sample holding type (hereinbelow abbreviated S/H type) liquid crystal display device. In liquid crystal display devices of this type, video signals are written for every block which includes a predetermined number of video signal lines.

This is the system in which a timing circuit made up of a shift register, etc. controls a sampling switch, and video signals supplied through video signal lines are written into pixel capacitors after being held in video signal line capacitors.

Also in this modified example, a video signal driving circuit VD and a scanning line driving circuit SD are provided next to a image display portion 20.

The image display portion 20 has an arrangement of a plurality of video signal lines 27 and a plurality of scanning lines 28 which intersect at right angles, and pixel TFTs 29 are provided at their crossing points. Connected to the drain electrode of each TFT 29 are a liquid crystal capacitor C1c and a supplemental capacitor Cs to form a display pixel.

The scanning line driving circuit SD is made up of shift registers 25 and scanning line driving buffers 26, and each buffer output is supplied to each scanning line. As their inputs, basic clock CLK2 and-trigger signal IN2 are required.

The video signal driving circuit VD is made up of DACs 10A through 10C, shift registers 31, video signal lines 32, sampling switch control lines 33, and sampling switches 34. Structure of DACs 10A to 10C may be the same as those already explained with reference to FIGS. 1 through 14. The circuit VD may include, in the front stage of DAC, a shift register 21 and a sampling switch 24 shown in FIG. 3 but not shown here.

Also in this modified example, digital video signals serially input into DAC from outside are converted into analog signals through the processes already explained with reference to FIGS. 1 through 14, and supplied to respective video signal lines 32.

Then, by controlling the sampling switches by the shift registers, the analog video signals are written into video signal lines. In the structure shown here, the circuit VD is divided into blocks each containing m display pixels which are adjacent in the horizontal direction, and video signals are supplied for every block.

Figure 52:
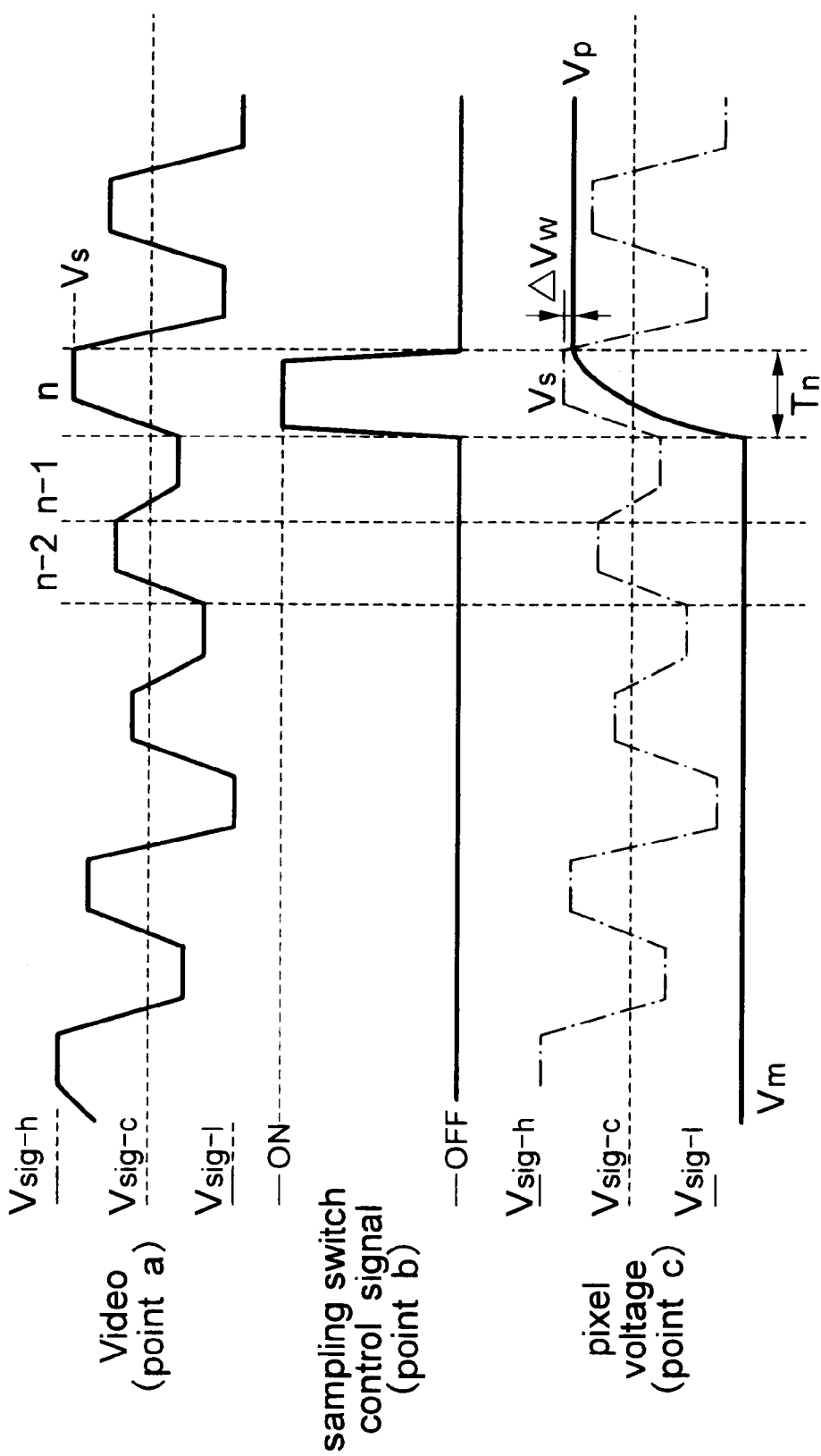
FIG. 52 is a timing chart for explaining operational principles of the video signal driving circuit VD of FIG. 51.

FIG. 52 is a timing chart for explaining operational principles of the video signal driving circuit VD. Referring it together with FIG. 51, its operations are explained below. First, the basic clock CLK1 and m-phase video signals (Video 1 through Video m) synchronous therewith are input into a video signal line 32.

In the case where positive-polarity video signals are written in pixels of the n-numbered block, the control signal of the sampling switch 34 at point b in FIG. 51 changes from the OFF state to the ON state at the timing corresponding to the n-numbered block. As a result, the sampling switch 34 changes from the non-conductive state to the conductive state, and the video signal input into point a is supplied to the video signal line 27 through the video signal line 32. At that time, potential of the video signal line 27 starts rising from the initial potential Vm toward a predetermined potential Vs. If the pixel TFT 29 is held ON, potential at point c in FIG. 51 also follows the potential of the video signal line 27.

After that, when the sampling switch 34 becomes OFF-after the sampling period Tw, the video signal is held in the video signal line 27, pixel capacitor C1c and supplemental capacitor Cs, and the pixel potential is maintained at Vs for one horizontal period.

By repeating these operations in synchronism with the basic clock CLK1 and progressing the scanning for every m pixels in the horizontal direction, the video signals are written into all pixels within one frame period, and an image is displayed.

Also in this modified example, similarly to those already explained with reference to FIGS. 1 through 14, the circuit ensures the effect of reducing its size and being capable of processing digital data different in number of bits.

In FIG. 52, the voltage expressed as "$_\Delta$Vw" is called "writing insufficient voltage", and occurs when a potential is written before the potential of the video signal line 27 at the final end of the video signal line 32 reaches a desired potential. Its cause lies in that the sampling time is reduced by an increase of the resistance and capacitance of the video signal lines, an increase of the delay in the video signal transfer system, which are invited by enlargement of screens of liquid crystal display devices, and an increase of the video signal frequency which is invited by the movement toward higher definition. Such a "writing insufficient voltage" may invite deterioration of the image quality such as deterioration of the display contrast.

Although the S/H type driving circuit according to this modified example is inferior to the line-sequential system already explained in that a "writing insufficient voltage" is liable to occur, because it sequentially scan for every pixel block dealing m pixels as one block, it has the advantages that the circuit scale is smaller than the line-sequential scanning type driving circuit and it merely requires the basic clock CLK1, trigger signal IN1 and m-phase video signals as signals necessary of its operation.

Finally explained is a liquid display device according to the invention.

Figure 53:
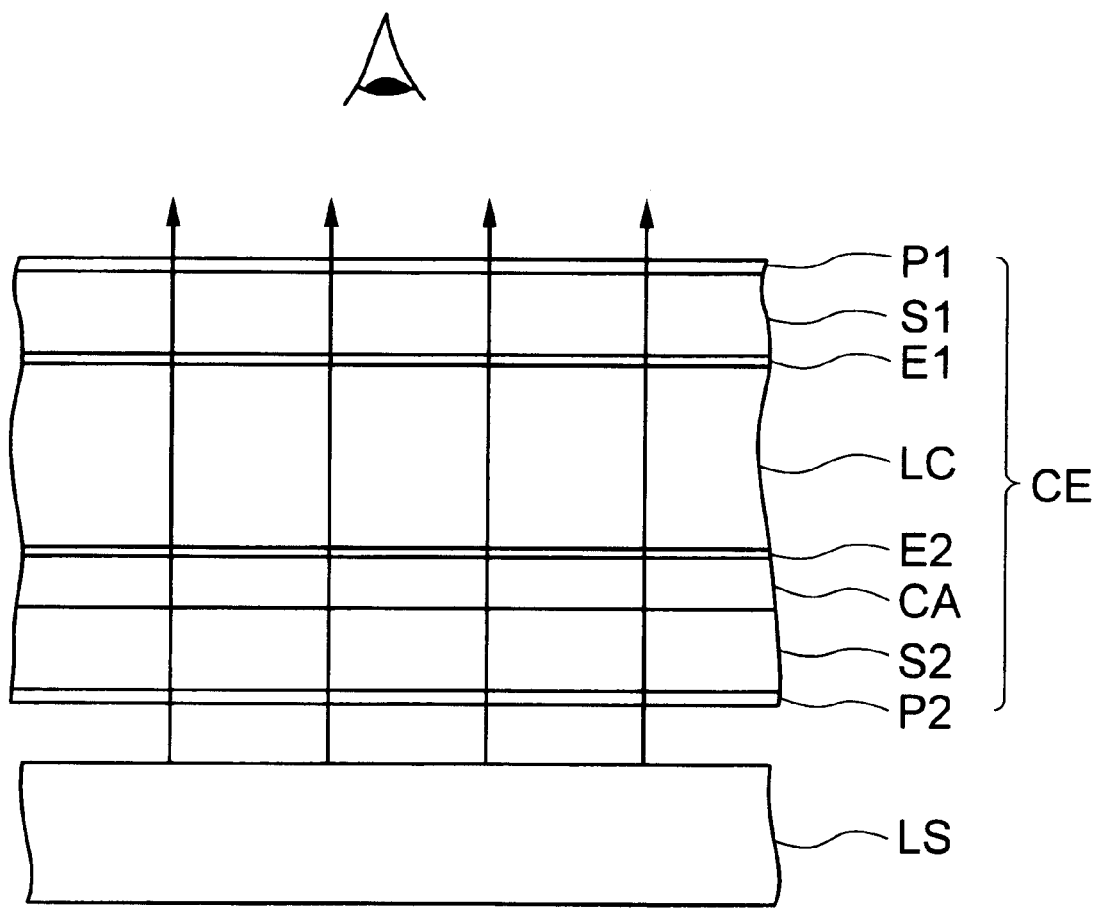
FIG. 53 is a conceptional diagram showing a cross-sectional structure of the first liquid crystal display device according to the invention.

FIG. 53 is a conceptional diagram showing a cross-sectional structure of the first liquid crystal display device according to the invention.

The liquid crystal display device shown in FIG. 53 is a transmission type liquid crystal display device having the structure in which the cell portion CE and the light source portion LS are stacked one over another. The cell portion CE includes a first polarizing plate P1, opposed substrate S2, opposed electrodes E1, liquid crystal layer LC, pixel electrodes E2, circuit portion CA, array substrate S2 and second polarizing plate P2 which are stacked in this order. The substrates S1 and S2 are made of an optically transmitting insulating material such as glass or quartz, for example. Opposed electrodes E1 and pixel electrode E2 are made of an optically-transmitting, electrically-conductive material such as ITO (indium tin oxide). The circuit portion CA is a layer having formed pixels TFT, wiring layer, and any one of the above-explained driving circuits according to the invention.

Light emitted from the light source LS located behind the cell portion CE as viewed from the screen watching side passes through the cell portion CE as shown by arrows in FIG. 53. In this process, the light undergoes predetermined modulation by the liquid crystal layer LC for each pixel, and make a predetermined image on the watching side. In the liquid crystal display device of this transmission type, by mounting one of above-explained driving circuits, high-quality images can be presented with a small and light apparatus.

Figure 54A:
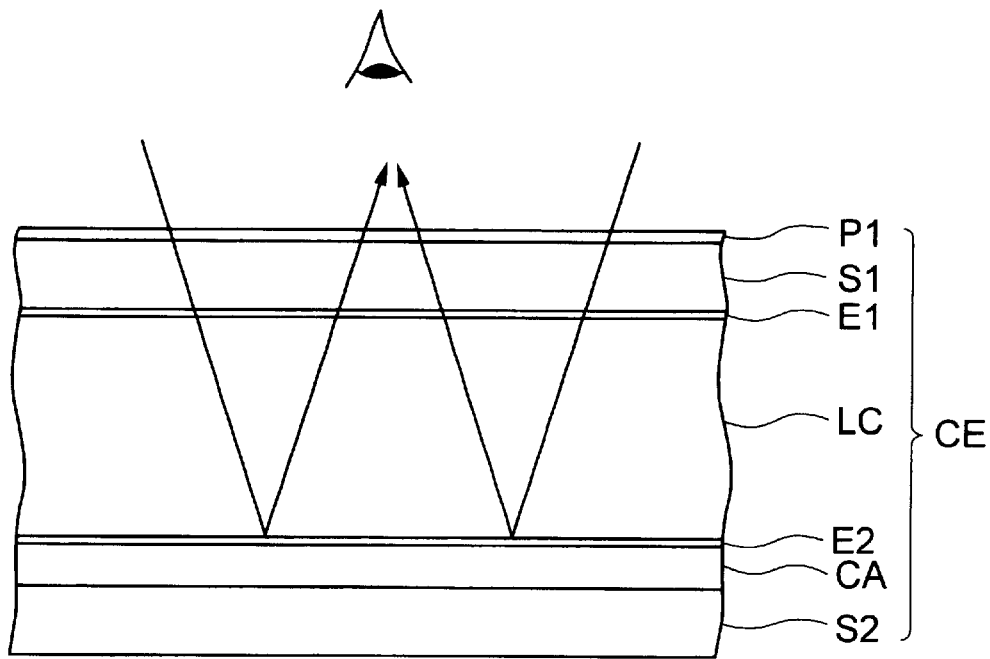
FIG. 54A is a conceptional diagram showing a cross-sectional structure of the second liquid crystal display device according to the invention.

FIG. 54A is a conceptional diagram showing a cross-sectional structure of the second liquid crystal display device according to the invention.

The liquid crystal display device shown here is of a reflection type, and its cell portion CE includes a first polarizing plate P1, opposed substrate S1, opposed electrodes E1, liquid crystal layer LC, pixel electrodes E2, circuit portion CA, array substrate S2 and second polarizing plate P2 which are stacked in this order. This is different from that shown in FIG. 53 in that the pixel electrodes E2 are made of a reflective material. Usable as this material is aluminum (Al), for example. By using the light-reflective pixel electrodes E2, external light introduced into the cell portion CE from the image watching side is reflected by the pixel electrodes #e as shown by arrows in FIG. 54A, and undergoes predetermined modulation in the liquid crystal layer LC to present an image. Since the reflection-type liquid crystal display device need no light source, it has the advantages that the power consumption is greatly reduced, and present images which are definite and clear in the open air such as under direct sunlight.

Figure 54B:
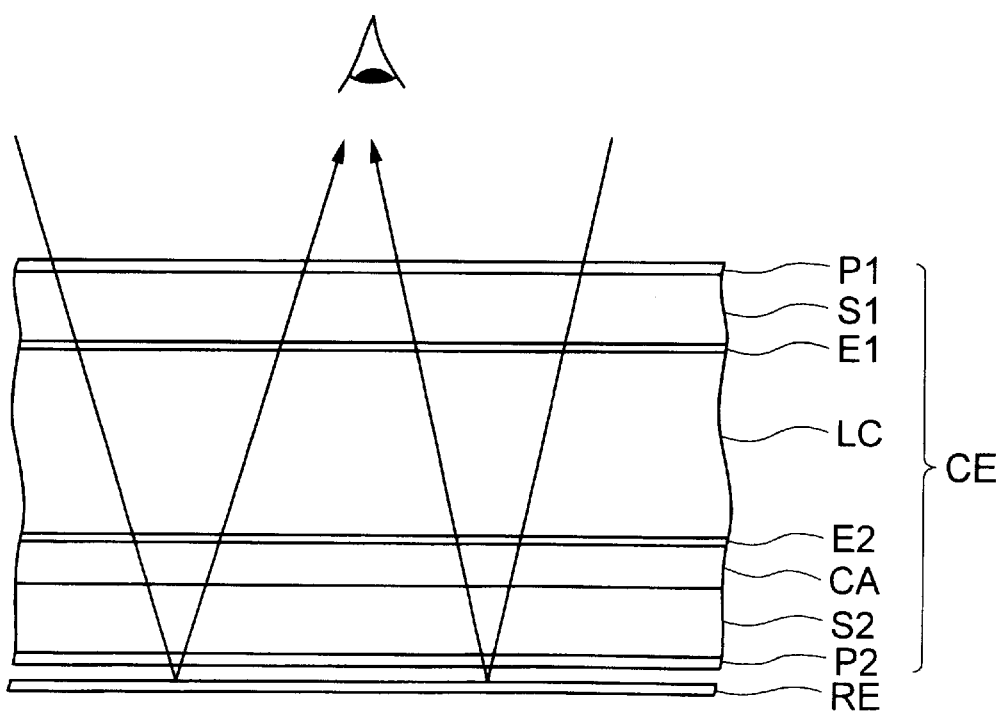
FIG. 54B is a cross-sectional diagram showing a modified example of the reflection type liquid crystal display device according to the invention.

FIG. 54B is a cross-sectional diagram showing a modified example of the reflection type liquid crystal display device according to the invention. In the example shown here, the right reflecting layer RE is located behind the cell portion. Light introduced from the image watching side passes through the cell portion CE as demonstrated by arrows, and after being reflected by the right reflecting layer RE, again passes through the cell portion CE. In this process, the light undergoes predetermined modulation by the liquid crystal layer LC, and represents an image.

Also in the reflection type liquid crystal display devices shown in FIGS. 54A and 54B, by mounting any one of above-explained driving circuits, high-quality images can be presented with a small and light display device.

Figure 55A:
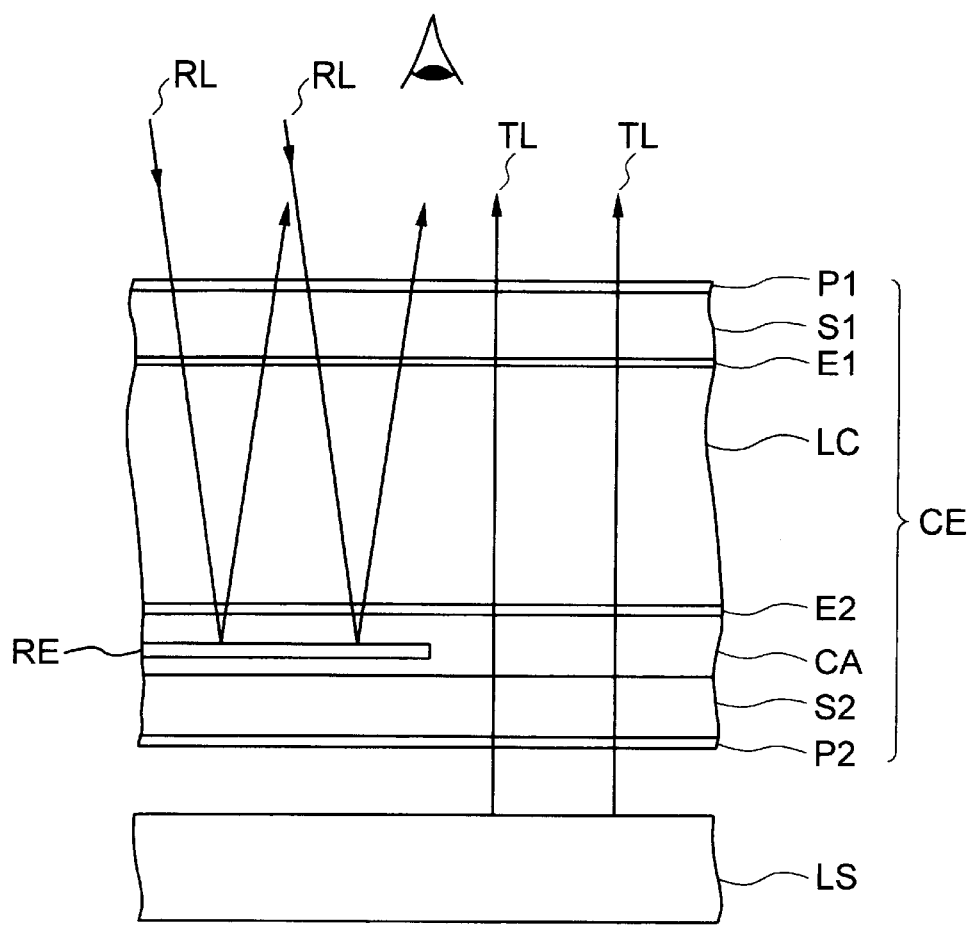
FIG. 55A is a conceptional diagram showing a cross-sectional structure of the third liquid crystal display device according to the invention.

FIG. 55A is a conceptional diagram showing a cross-sectional structure of the third liquid crystal display device according to the invention.

The liquid crystal display device shown here is of a reflection-transmission type which includes the cell portion CE and the light source portion LS. The cell portion CE includes the optically transmitting pixel electrodes E2 which occupy almost all area of pixels, and the right reflecting layer RE which occupies a part of the area of pixels.

Figure 55B:
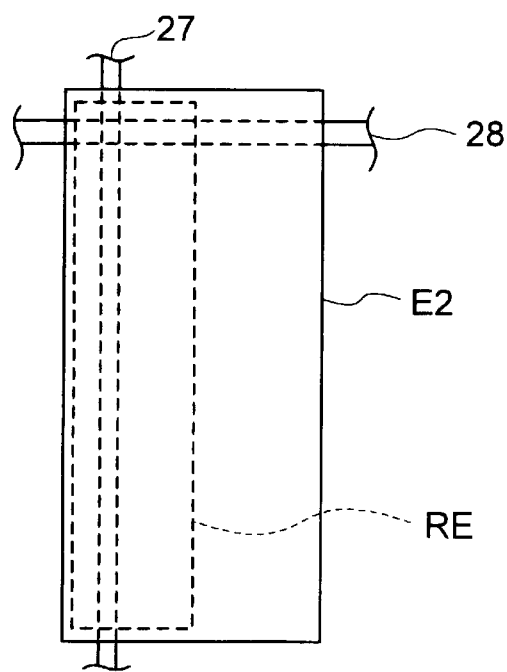
FIG. 55B is a conceptional diagram showing a two-dimensional positional relation between a pixel electrode E2 and a light reflecting layer RE of one pixel portion in the liquid crystal display device of FIG. 55A.

FIG. 55B is a conceptional diagram showing a two-dimensional positional relation between a pixel electrode E2 and a light reflecting layer RE of one pixel portion. More specifically, the pixel electrode E2 is formed to extend over almost all area of the pixel whereas the light reflecting layer RE is formed to occupy only about a half of one pixel area. Also shown here are a signal line 27 and a scanning line 28.

That is, according to the reflection-transmission type liquid crystal display devices shown in FIGS. 55A and 55B, it is possible to make images by selectively using light from the light source portion LS or external light. In a dark place, clear images can be presented under the transmission type display mode. In a bright place such as outdoor place, the reflection type display mode can be used to represent clear images.

Heretofore, embodiments of the invention have been explained referring to specific examples as well. The invention, however, is not limited to these specific examples.

For example, in DAC shown in FIGS. 5 through 9, the number of capacitors provided on the primary side or secondary side may be changed appropriately depending on the number of bits of input data, the number of signal lines, and other factors.

Moreover, application of the driving circuit according to the invention is not limited to liquid crystal display devices, but it is similarly applicable also to various other display devices such as electroluminescence display devices and fluorescence emitting display devices. That is, for all display devices including a matrix arrangement of pixels and configured to sequentially supplying them with analog video signal voltages, respectively, the invention is similarly applicable, and ensures equivalent effects.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Applications No. H11-41324 filed on Feb. 19, 1999 and No. 2000-32318 filed on Feb. 9, 2000 including specifications, claims drawings and summaries are incorporated herein by references in their entirety.

What is claimed is:

1. A driving circuit of a display device including a digital-analog converter circuit which introduces digital data and outputs an analog video signal, said digital-analog converter circuit comprising:

a reference voltage selecting circuit which is responsive to each of bit signals of data of a plurality of bits to exclusively select and output one of a plurality of reference voltages;

a group of input-side capacitor elements connected to said reference voltage selecting circuit and including a plurality of capacitor elements which hold the reference voltage output from said reference voltage selecting circuit;

an amplifier which amplifies a voltage in accordance with electric charge accumulated to each capacitor element in said group of input-side capacitor elements; and a connection circuit which supplies electric charge of each capacitor element in said group of input-side capacitor elements to said amplifier selectively in sequence, wherein said amplifier includes:

an output-side capacitor element which holds electric charge distributed from each capacitor element in said group of input-side capacitor elements; and a buffer amplifier which amplifies a voltage due to the electric charge held on said output-side capacitor element and outputs the amplified voltage as an analog video signal.

2. The driving circuit of a display device according to claim 1 wherein each capacitor element in said group of input-side capacitor elements and said output-side capacitor element have substantially the same capacitance value.

3. A driving circuit of a display device including a digital-analog converter circuit which introduces digital data and outputs an analog video signal, said digital-analog converter circuit comprising:

a reference voltage selecting circuit which is responsive to each of bit signals of time-serially input data of a plurality of bits to exclusively select and output one of a plurality of reference voltages;

an input-side capacitor element connected to said reference voltage selecting circuit to hold the reference voltage output from said reference voltage selecting circuit;

an amplifier which amplifies a voltage in accordance with electric charge accumulated to said input-side capacitor element; and a connection circuit which supplies electric charge of said input-side capacitor element to said amplifier selectively in sequence;

wherein said amplifier includes:
  a group of output-side capacitor elements which holds electric charge distributed from said input-side capacitor element, said group of output-side capacitor elements having a plurality of capacitor elements; and
  a buffer amplifier which amplifies a voltage due to the electric charge held on each capacitor element of said group of output-side capacitor elements and outputs the amplified voltage as an analog video signal.

4. The driving circuit of a display device according to claim 3 wherein said input-side capacitor element and each capacitor element in said group of said output-side capacitor elements have substantially the same capacitance value.

5. A driving circuit of a display device including a digital-analog converter circuit which introduces digital data and outputs an analog video signal, said digital analog converter circuit comprising:
  a reference voltage selecting circuit which is responsive to each of bit signals of time-serially input data of a plurality of bits to exclusively select and output one of a plurality of reference voltages;
  a group of input-side capacitor elements connected to said reference voltage selecting circuit and including a plurality of capacitor elements which hold the reference voltage output from said reference voltage selecting circuit;
  an amplifier which amplifies a voltage in accordance with electric charge accumulated to each capacitor element in said group of input-side capacitor elements; and
  a connection circuit which supplies electric charge of each capacitor element in said group of input-side capacitor elements to said amplifier selectively in sequence;
  wherein said amplifier includes:
    a group of output-side capacitor elements which holds electric distributed from each capacitor element in said group of input-side capacitor elements, said group of output-side capacitor elements having a plurality of capacitor elements; and
    a buffer amplifier which amplifies a voltage due to the electric charge held on each capacitor element of said group of output-side capacitor elements and outputs the amplified voltage as an analog video signal.

6. The driving circuit of a display device according to claim 5 wherein each capacitor element in said group of input-side capacitor elements and each capacitor element in said group of said output-side capacitor elements have substantially the same capacitance value.

7. A driving circuit of a display device having a plurality of signal lines and scanning lines extending to intersect at right angles, and pixel switching elements provided at crossing points of said signal lines and said scanning lines, respectively, to display gradient representation of $2^m$ (m is a plural number) based on data with m bits, comprising:
  a data distributing circuit supplied with said data of m bits;
  a data latch circuit sequentially storing said data of m bits and outputting them at a predetermined timing;
  a gamma correction circuit which store the output from said data latch circuit and outputs it at a predetermined timing; and
  a digital-analog converter circuit which stores the output from said gamma correction circuit and outputs it at a predetermined timing, wherein said digital-analog converter circuit includes:
  a reference voltage selecting circuit which is responsive to each of bit signals of data of a plurality of bits to exclusively select and output one of a plurality of reference voltages;
  a group of input-side capacitor elements connected to said reference voltage selecting circuit and including a plurality of capacitor elements which hold the reference voltage output from said reference voltage selecting circuit;
  an amplifier which amplifies a voltage in accordance with electric charge accumulated to each capacitor element in said group of input-side capacitor elements; and
  a connection circuit which supplies electric charge of each capacitor element in said group of input-side capacitor elements to said amplifier selectively in sequence;
  wherein said amplifier includes:
    an output-side capacitor element which holds electric charge distributed from each capacitor element in said group of input-side capacitor elements; and
    a buffer amplifier which amplifies a voltage due to the electric charge held on said output-side capacitor element and outputs the amplified voltage as an analog video signal.

8. The driving circuit of a display device according to claim 7, wherein m sets of said data latch circuits are provided for every N signal lines (N is a plural number).

9. The driving circuit of a display device according to claim 7, wherein one said gamma correction circuit is provided for every N signal lines (N is a plural number).

10. The driving circuit of a display device according to claim 7, wherein one said digital-analog converter circuit is provided for every N signal lines (N is a plural number).

11. The driving circuit of a display device according to claim 7, wherein one said amplifier circuit is provided for every N signal lines (N is a plural number).

12. The driving circuit of a display device according to claim 7, wherein m sets of said data latch circuits, one said gamma correction circuit, one said digital-analog converter circuit and one said digital-analog converter circuit are provided for every N signal lines (N is a plural number).

13. The driving circuit of a display device according to claim 7, wherein said N and said m satisfies the relation of $N \geq m$.

14. The driving circuit of a display device according to claim 7, wherein said amplifier circuit includes:
  a voltage change circuit which changes the voltage of said signal line by a constant ratio;
  a first switch turned OFF to disconnect communication between said voltage change circuit and said signal line when the voltage of said signal line becomes substantially equal to the voltage of said analog video signal;
  a logic circuit having inverting amplifier circuits serially connected at least in two stages, and inverting the output logic of sand inverting amplifier circuit in a rear stage when the input voltage to said inverting amplifier circuit in a front stage reaches a predetermined threshold voltage to control the ON/OFF action of said first switch;
  a differential voltage holding circuit which holds a differential voltage between the threshold voltage of said inverting amplifier circuit in the front stage and the voltage of said analog video signal;
  a threshold voltage setting circuit which sets one end of said differential voltage holding circuit at the threshold voltage of said inverting amplifier circuit in the front stage when setting in said differential voltage holding circuit said differential voltage to be held thereby; and an input voltage setting circuit which sets the other end of said differential voltage holding circuit at the voltage of said analog video signal when setting in said differential voltage holding circuit said differential voltage to be held thereby.

15. The driving circuit of a display device according to claim 7, wherein said amplifier circuit includes:

a signal line voltage control circuit having a first terminal connected to said signal line to control the voltage of said signal line so as to raise the voltage of said signal line when the voltage of said signal line is lower than the voltage of said analog video signal and lower the voltage of said signal line when the voltage of said signal line is higher than the voltage of said analog video signal, said signal line voltage control circuit having an odd number of serially connected inverters to set the voltage of the input terminal of each said inverter to the threshold voltage of said inverter before controlling the voltage of said signal line;

a first differential voltage holding circuit having a first terminal connected to a second terminal of said signal line voltage control circuit, and a second terminal which is connected to the input terminal of said analog video signal upon introduction of said analog video signal but connected to said signal line when said signal line voltage controlling circuit controls the voltage of said signal line, said first differential voltage holding circuit holding the differential voltage between the threshold voltage of one of said inverters of said signal line voltage control circuit which is nearest to the input side and the voltage of said analog video signal; and a first differential voltage setting circuit which sets in said first differential voltage holding circuit the differential voltage to be held thereby before said signal line voltage control circuit controls the voltage of said signal line.

16. A driving circuit of a display device having a plurality of signal lines and scanning lines extending to intersect at right angles, and pixel switching elements provided at crossing points of said signal lines and said scanning lines, respectively, to display a gradient representation of $2^m$ (m is a plural number) based an data with m bits, comprising:

a data distributing circuit supplied with said data of m bits;

a data latch circuit sequentially storing said data of n bits and outputting said data of n bits at a predetermined timing;

a gamma correction circuit which stores the output from said data latch circuit and outputs the output from said data latch circuit at a predetermined timing;

the digital-analog converter circuit recited in any one of claims 1, 3, 4, 6, 7 and 9, which stores the output from said gamma correction circuit and outputs the output from said gamma correction circuit at a predetermined timing; and an amplifier circuit amplifying the output from said digital-analog converter circuit, said amplifier circuit outputting an video display signal to an output line by inputting an analog video signal supplied from said digital-analog converter circuit, and having an output circuit, including, an input comparing circuit which introduces said analog video signal and said video display signal arid definitely determines an output voltage based an the voltage difference between said signals, a first amplifier circuit introducing said output voltage and determining a logical output having a logical level responsive to said output voltage, and a current source introducing said logical output and outputting a current responsive to said logical output as said display signal onto said output line.

17. The driving circuit of a display device according to claim 16, wherein said input comparing circuit includes a transistor, and said analog video signal is input to the gate of said transistor.

18. The driving circuit of a display device according to claim 16, comprising:

said input comparing circuit including a first current circuit having a first P-type transistor and a first N-type transistor connected in series, and a second current circuit having a second P-type transistor and a second N-type transistor connected in series, which are connected in parallel between a first power source and a second power source; and said analog video signal and said video display signal being input respectively to the gate of said first N-type transistor or said second N-type transistor; and said output voltage being output from the junction of said second P-type transistor and said second N-type transistor.

19. The driving circuit of a display devise according to claim 16, comprising:

said input comparing circuit including a P-type transistor and an N-type transistor serially connected between a first power source and a second power source;

one of said analog video signal and said video display signal being selectively input commonly to the gates of said P-type transistor and said N-type transistor; and said output voltage being output from the junction of said P-type transistor and said N-type transistor.

20. The driving circuit of a display device according to claim 16, comprising:

said input comparing circuit including a current circuit having a first transistor and a second transistor serially connected between a first power source and a second power source;

one of said analog video signal and said video display signal being selectively input to the gate of said first transistor or said second transistor; and said output voltage being output from the junction of said first transistor and said second transistor.

21. The driving circuit of a display device according to claim 16, further comprising:

a second amplifier circuit which introduces said output voltage and determines a logical output having a logical level responsive to said output voltage; and said current source outputting a current onto said output line in response to said logical output from said first amplifier circuit and discharging said output line in response to said logical output from said second amplifier circuit.

22. The driving circuit of a display device according to claim 15, wherein said first differential voltage holding circuit of said amplifier circuit comprises an electrical capacitance.

23. The driving circuit of a display device according to claim 22, wherein said electrical capacitance of said amplifier circuit is shared with said output-side capacitor element of said digital-analog converter.

24. The driving circuit of a display device according to claim 22, wherein said electrical capacitance of said amplifier circuit is shared with at least one capacitor element among said output-side capacitor element group of said digital-analog converter.

25. The driving circuit of a display device according to claim 17, wherein an input capacitance of said amplifier circuit is not larger than 10% of an output capacitance of said digital-analog converter circuit.

26. The driving circuit of a display device according to claim 7, wherein a common electrode potential varies every horizontal period.

27. The driving circuit of a display device according to claim 7, wherein said amplifier circuit comprises a pair of amplifier circuits, each including:
   a voltage change circuit which changes the voltage of said signal line by a constant ratio;
   a first switch turned OFF to disconnect communication between said voltage change circuit and said signal line when the voltage of said signal line becomes substantially equal to the voltage of said analog video signal;
   a logic circuit having inverting amplifier circuits serially connected at least in two stages, and inverting the output logic of sand inverting amplifier circuit in a rear stage when the input voltage to said inverting amplifier circuit in a front stage reaches a predetermined threshold voltage to control the ON/OFF action of said first switch;
   a differential voltage holding circuit which holds a differential voltage between the threshold voltage of said inverting amplifier circuit in the front stage and the voltage of said analog video signal;
   a threshold voltage setting circuit which sets one end of said differential voltage holding circuit at the threshold voltage of said inverting amplifier circuit in the front stage when setting in said differential voltage holding circuit said differential voltage to be held thereby; and
   an input voltage setting circuit which sets the other end of said differential voltage holding circuit at the voltage of said analog video signal when setting in said differential voltage holding circuit said differential voltage to be held thereby.

28. The driving circuit of a display device according to claim 7, wherein one of said two amplifier circuits operates as a sampling buffer for referring the output from said digital-analog converter circuit, and the other operates as a write buffer for adjusting the voltages of said signal lines.

29. A display device, comprising:
   a driving circuit of a display device according to claim 7; and
   a liquid crystal controlled by said pixel switching element, wherein an operational threshold voltage is substantially 2.5V.

30. A display device, comprising:
   a driving circuit of a display device according to claim 7; and
   a liquid crystal controlled by said pixel switching element,
   wherein an operational threshold voltage is substantially 1.5V.

31. A display device, comprising:
   a driving circuit of a display device according to claim 7; and
   a light source located behind when viewed from the image watching surface, light emitted from said light source being guided to pass through said liquid crystal to display an image.

32. A display device, comprising:
   a driving circuit of a display device according to claim 7; and
   a reflector located behind when viewed from the image watching surface, external light introduced from the direction of said image watching surface being guided to be reflected by said reflector to display an image.

33. A display device, comprising:
   a driving circuit of a display device according to claim 7;
   a light source located behind when viewed from the image watching surface; and
   a reflector located behind when viewed from the image watching surface, light emitted from said light source being guided to pass through said liquid crystal, or external light introduced from the direction of said image watching surface being guided to be reflected by said reflector, to display an image.

34. A display devise, comprising:
   a drive circuit of a display device according to claim 7; and
   a pixel switching element provided by each display element,
   said driving circuit and said pixel switching elements being formed an a common plane in said substrate and sharing a common semiconductor layer stacked on said substrate.

35. A display device, comprising:
   a drive circuit of a display device according to claim 7; and
   a pixel switching element provided by each display element,
   said driving circuit and said pixel switching elements being formed an a common plane in said substrate and sharing a common semiconductor layer stacked on said substrate said pixel switching elements changing luminous brightness in accordance with the analog voltage written in the pixel.

36. The display device according to claim 27, comprising a voltage error diffusion means.

* * * * *